United States Patent
Nishihara et al.

(10) Patent No.: US 7,063,876 B2
(45) Date of Patent: *Jun. 20, 2006

(54) INFORMATION RECORDING MEDIUM AND METHOD FOR MANUFACTURING THE SAME

(75) Inventors: Takashi Nishihara, Hirakata (JP); Rie Kojima, Kadoma (JP); Noboru Yamada, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 37 days.

This patent is subject to a terminal disclaimer.

(21) Appl. No.: 10/787,301

(22) Filed: Feb. 27, 2004

(65) Prior Publication Data

US 2004/0191683 A1    Sep. 30, 2004

(30) Foreign Application Priority Data

Mar. 25, 2003 (JP) ............................. 2003-082114
Dec. 10, 2003 (JP) ............................. 2003-411197

(51) Int. Cl.
*B32B 3/02* (2006.01)

(52) U.S. Cl. .................. 428/64.1; 428/64.5; 428/64.6; 430/270.13

(58) Field of Classification Search ............... 428/64.1, 428/64.5, 64.6; 430/270.13
See application file for complete search history.

(56) References Cited

U.S. PATENT DOCUMENTS

| | | | |
|---|---|---|---|
| 6,221,455 B1 * | 4/2001 | Yasuda et al. | 428/64.1 |
| 6,416,837 B1 * | 7/2002 | Kojima et al. | 428/64.1 |
| 6,670,014 B1 * | 12/2003 | Nishihara et al. | 428/64.1 |
| 6,743,496 B1 * | 6/2004 | Nishihara et al. | 428/64.1 |
| 6,751,184 B1 * | 6/2004 | Kojima et al. | 369/275.2 |
| 6,794,006 B1 * | 9/2004 | Nishihara et al. | 428/64.1 |

FOREIGN PATENT DOCUMENTS

| | | |
|---|---|---|
| EP | 0 184 452 | 6/1986 |
| EP | 0 217 293 | 4/1987 |
| EP | 1 172 811 | 1/2002 |
| EP | 1 187 119 | 3/2002 |
| EP | 1 324 326 | 7/2003 |
| EP | 1 351 229 | 10/2003 |
| JP | 10-275360 | 10/1998 |
| JP | 2000-36130 | 2/2000 |

(Continued)

OTHER PUBLICATIONS

M. Horie et al., "Material Characterization and Application of Eutectic SbTe Based Phase-Change Optical Recording Media" Proceedings of the SPIE, SPIE, Bellingham, VA, US, vol. 4342, Apr. 2001, pp. 76-87.

(Continued)

*Primary Examiner*—Elizabeth Mulvaney
(74) *Attorney, Agent, or Firm*—Wenderoth, Lind & Ponack, L.L.P.

(57) ABSTRACT

A multilayer information recording medium has both good reproducing performance and good recording and rewriting capabilities, as well as good repeated rewriting capabilities even after being archived for a long period of time. The information recording medium has at least a first recording layer and a second recording layer, which generate reversible phase changes between the crystalline phase and the amorphous phase. The first recording layer contains Ge, Te and Bi, while the second recording layer contains Sb and one or more elements M1 selected from a group including V, Mn, Ga, Ge, Se, Ag, In, Sn, Te, Pb, Bi and Au.

62 Claims, 10 Drawing Sheets

FOREIGN PATENT DOCUMENTS

| JP | 2002-144736 | 5/2002 |
|---|---|---|
| WO | 8-321041 | 12/1996 |
| WO | 2004/025640 | 3/2004 |

OTHER PUBLICATIONS

T. Akiyama et al., "Rewritable Dual-Layer Phase-Change Optical Disk Utilizing a Blue-Violet Laser," Japanese Journal of Applied Physics, Publication Office Japanese Journal of Applied Physics, Tokyo, JP, vol. 40, No. 3B, 2001, pp. 1598-1603.

R. Kojima et al., "Acceleration of Crystallization Speed by Sn Addition to Ge-Sb-Te Phase-Change Recording Material" JPN, J. Appl. Phys. 1, Regul. Pap. Short Notes Rev. Pap. (Japan), Japanese Journal of Applied Physics, Part 1 (Regular Papers, Short Notes & Review Papers), Oct. 2001, Japan Soc. Appl. Phys., Japan, vol. 40, No. 10, Oct. 2001, pp. 5930-5937.

K. Narumi et al., "Rewritable Dual-Layers Phase-Change Optical Disk with a Balanced Transmittance Structure" Japanese Journal of Applied Physics, Publication Office Japanese Journal of Applied Physics, Tokyo, JP, vol. 41, No. 5A, Part 1, May 2002, pp. 2925-2930.

K. Yusu et al., "Advanced Phase Change Medium for over 30GB Capacity of Blue Laser and High-NA Objective Lens", Joint International Symposium on Optical Memory and Optical Data Storage 2002, Technical Digest, Waikoloa, HI, USA, Jul. 7-11, 2002, pp. 413-415.

* cited by examiner

Fig 9
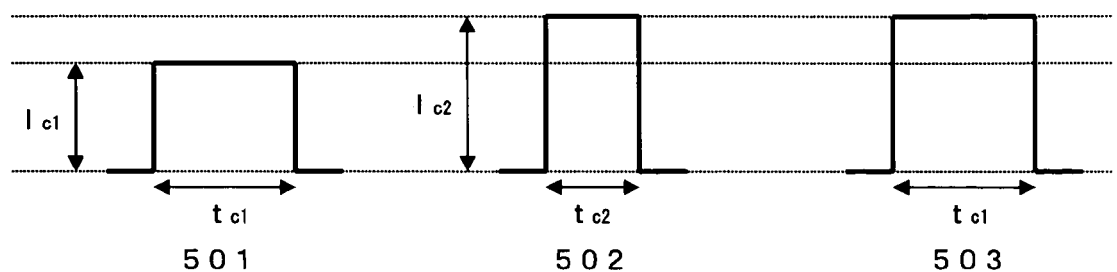
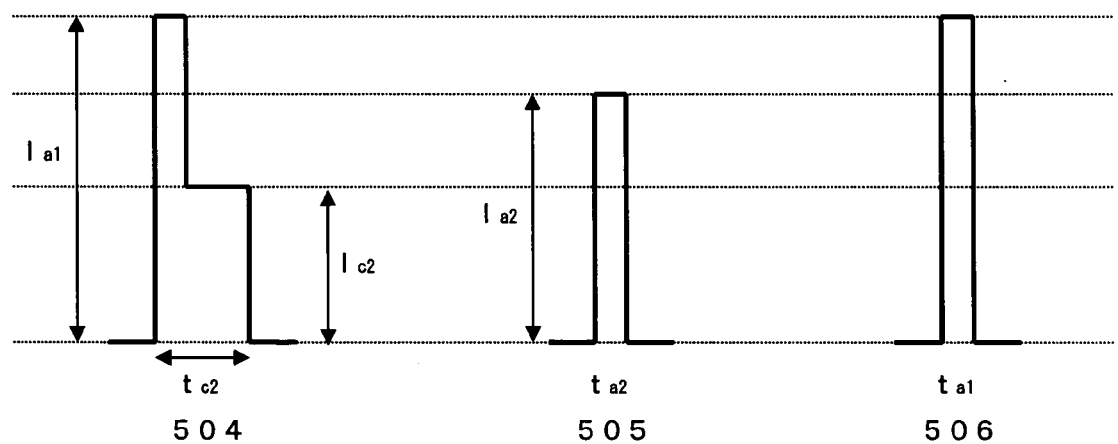
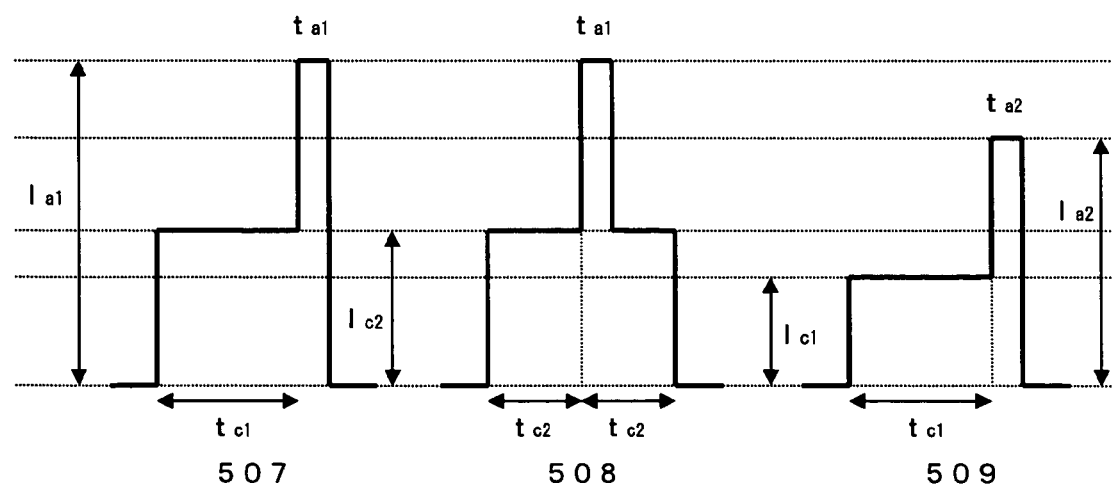

INFORMATION RECORDING MEDIUM AND METHOD FOR MANUFACTURING THE SAME

BACKGROUND OF THE INVENTION

1. Field of the Invention

The present invention relates to an information recording medium for optically or electrically recording, erasing, rewriting and reproducing information, and a method for manufacturing the same.

2. Description of the Prior Art

Information recording media for optically recording, erasing, rewriting and reproducing information using a laser beam include phase change optical information recording media. In order to record, erase and rewrite information in a phase change optical information recording medium, a phenomenon is utilized in which a recording layer (a phase change material layer) is reversibly changed in phase between a crystalline phase and an amorphous phase. In general, when recording information, a high power laser beam (recording power) is irradiated onto a recording layer, and the portion thereof exposed to the high power laser beam is melted and cooled rapidly and changed in phase to the amorphous phase in order to record information. When erasing information, a low power laser beam (erasing power) whose power is lower than the recording power is used to irradiate a portion of the recording layer in the amorphous phase, and the recording layer is heated and cooled gradually so that the irradiated portion returns to the crystalline phase, thereby allowing recorded information to be erased. Therefore, it is possible to record or rewrite new information while erasing recorded information in the phase change optical information recording medium by irradiating the recording layer with a laser beam that is modulated in power between a high power level and a low power level (see, for example, Yoshito Tsunoda et al. "Basics and applications of optical disk storage", The Institute of Electronics, Information and Communication Engineers, 1995, Chapter 2).

In addition, instead of irradiating the recording layer with the above-mentioned laser beam, information can be recorded onto the recording layer of an electrical phase change information recording medium by changing the state of the phase change material of the recording layer by using Joule heat generated when current is supplied thereto. This electrical phase change information recording medium utilizes Joule heat that is generated when current is supplied thereto, so as to change the state of the phase change material of the recording layer between the crystalline phase (low resistance) and the amorphous phase (high resistance). The difference in the resistances between the crystalline phase and the amorphous phase is detected in order to read information. When the current that is supplied to a recording layer thin film in the amorphous phase that is sandwiched between electrodes is increased gradually, the recording layer thin film changes its phase to the crystalline phase at a certain threshold current, and resistance drops rapidly. In addition, when a large current and short period width pulse is applied to the recording layer thin film in the crystalline phase, the recording layer thin film is melted and cooled rapidly so that it can return to the high resistance amorphous phase. Therefore, it can be used as a rewritable information recording medium. The difference in the resistance between the crystalline phase and the amorphous phase can be easily detected by standard electrical means, so this type of recording layer can be used to obtain a rewritable information recording medium (see, for example, Makoto Kikuchi "Basics of amorphous semiconductors", Ohmsha, Ltd, 1982, Chapter 8).

Examples of phase change optical information recording media include a 4.7 GB/DVD-RAM that has been commercialized by the inventors of the present invention. The structure of the 4.7 GB/DVD-RAM is shown in FIG. 10, in which an information recording medium 12 has a seven-layer structure that includes a substrate 1, an incident side dielectric film 2, an incident side interface film 3, a recording film 4, a counterincident side interface film 5, a counterincident side dielectric film 6, a light absorption correction film 7 and a reflection film 8 arranged in this order when viewed from the laser incident side.

The incident side dielectric film 2 and the counterincident side dielectric film 6 have an optical function and a thermal function. For the optical function, an optical distance is adjusted so that the light absorption efficiency of the recording film 4 is increased and the change in reflectance between the crystalline phase and the amorphous phase is increased in order to increase signal amplitude. For the thermal function, portions such as the substrate 1 or a dummy substrate 10 that have a low resistance to heat are insulated from the recording film 4, which is heated to a high temperature during recording. A mixture of 80 mol % ZnS and 20 mol % $SiO_2$ is conventionally used as a dielectric material, and has good transparency, a high refractive index, a low thermal conductivity, good thermal insulation properties, good mechanical characteristics and good resistance to humidity. Note that by performing calculations in accordance with the matrix method, the film thickness of the incident side dielectric film 2 and the counterincident side dielectric film 6 can be determined precisely so that conditions are created in which there will be a large difference in the quantity of reflected light between the crystalline phase and the amorphous phase of the recording film 4, and there will be a large amount of light absorption in the recording film 4 (see, for example, Hiroshi Kubota "Wave Optics", Iwanami Shoten, 1971, Chapter 3).

The recording film 4 will not only have initial recording/rewriting capabilities, but will also have excellent archival characteristics (characteristics that allow recorded signals to be reproduced after a long period of time), and excellent archival rewrite characteristics (characteristics that allow recorded signals to be erased or rewritten after a long period of time) by employing a high-speed crystallization material that includes Ge—Sn—Sb—Te in which a portion of the Ge in a pseudo binary phase change material on the GeTe—$Sb_2Te_3$ line is substituted with Sn.

The incident side interface film 3 and the counterincident side interface film 5 function to prevent mass transfer between the incident side dielectric film 2 and the recording film 4, and between the counterincident side dielectric film 6 and the recording film 4, respectively. This mass transfer is a phenomenon in which the S in the mixture of 80 mol % ZnS and 20 mol % $SiO_2$ used for the incident side dielectric film 2 and the counterincident side dielectric film 6 diffuses into the recording film when recording and rewriting is repeatedly performed by irradiating a laser beam onto the recording film 4. When S diffuses into the recording film, repeated rewriting capability will deteriorate (see, for example, N. Yamada et al., Japanese Journal of Applied Physics, Vol. 37 (1998), pp. 2104–2110). In order to prevent this deterioration in the repeated rewriting capability, a nitride containing Ge may be used for the incident side interface film 3 and the counterincident side interface film 5 (see, for example, Japanese Unexamined Patent Publication No. H10-275360).

The aforementioned technology has allowed an excellent rewrite capability and high reliability to be achieved, and has led to the commercialization of the 4.7 GB/DVD-RAM.

In addition, many other technologies have been studied in order to further increase the capacity of information recording media. For example, with optical information recording media, a technology for achieving high-density recording using a laser beam with a reduced spot diameter has been studied, which can be obtained by the use of a blue-violet laser beam having a wavelength shorter than that of a conventionally used red laser beam, or the use of a thinner substrate arranged on the laser beam incidence side and an objective lens having a high numerical aperture (NA). In addition, another technology has been studied in which an optical information recording medium having two information layers is used to double the storage capacity thereof, and which records and reproduces information in the two information layers by means of a laser beam that enters from one side thereof (see, for example, Japanese Unexamined Patent Publication Nos. 2000-36130 and 2002-144736).

In order to increase the capacity of an information recording medium and record with a reduced spot diameter, an optical information recording medium will be needed that can form recording marks having a good shape even if the recording mark is small. When a small spot diameter is used for recording, there will be a relatively short amount of time available to irradiate the laser beam onto the recording layer. Therefore, in order to form small recording marks, the material that forms the recording layer must crystallize quickly, or an interface layer having a high crystallization promotion effect must be arranged to be in contact with the recording layer.

In addition, in an optical information recording medium that records and reproduces information from one side of two information layers (hereinafter sometimes referred to as a two-layer optical information recording medium), in order to use a laser beam that passed through an information layer that is close to the incident side of the laser beam (hereinafter referred to as a first information layer) and record and reproduce information on an information layer that is distant from the incident side of the laser beam (hereinafter referred to as a second information layer), the transparency of the first information layer must be increased by making the recording layer extremely thin. However, when the recording layer becomes thin, the number of crystalline nuclei formed when the recording layer is crystallized will decrease, and the distance in which atoms can move will shorten. Therefore, the thinner the recording layer is, the more difficult it will be for the crystalline phase to be formed (i.e., the crystallization speed will decrease).

Furthermore, the time for crystallization will shorten if the information transmission rate is increased by shortening the information recording time of the information recording medium. Accordingly, it will be necessary to enhance the crystallization ability of the recording layer in order to achieve an information recording medium that can support a high transmission rate. Moreover, compared to recording information at a low transmission rate, when recording information at a high transmission rate, the percentage of microcrystalline nuclei formed in the amorphous phase after recording will be reduced because the recording layer will rapidly cool after heating. In other words, it will be easier to obtain a more stable amorphous phase. The amorphous phase has a tendency to change to a more stable energy state after a long period of preservation, and thus when information is recorded at a high transmission rate, it will be difficult for the recording layer to further crystallize, and archival rewrite characteristics will deteriorate.

In experiments performed by the inventors of the present invention, it was revealed that the crystallization speed (crystallization ability) of the recording layer can be improved by using a material having a composition in which Sn is substituted for a portion of the Ge in a pseudo binary on the GeTe—$Sb_2Te_3$ line or adjacent thereto as the recording layer. Here, if the amount of substituted Sn is increased, the signal amplitude will be reduced because the optical change between the crystalline phase and the amorphous phase will grow smaller. In addition, because the recorded amorphous phase becomes crystallized gradually if the quantity of Sn is increased, the archival capabilities will deteriorate, especially when information is recorded at a low transmission rate.

As noted above, it is difficult to achieve both archival rewrite characteristics at a high transmission rate and archival characteristics at a low transmission rate in one information recording medium while increasing the capacity thereof.

SUMMARY OF THE INVENTION

An object of the present invention is to provide a multi-layer information recording medium, and in particular, a bi-layer information recording medium in which the crystallization ability of the recording layer is improved, both archival rewrite capabilities at a high transmission rate and archival capabilities at a low transmission rate is achieved, and which has good repeated rewriting capabilities.

An information recording medium according to one aspect of the present invention has at least two information layers. The information recording medium includes at least a first information layer that includes a first recording layer that generates a reversible phase change between the crystalline phase and the amorphous phase by optical means or electrical means, and a second information layer that includes a second recording layer that generates a reversible phase change between the crystalline phase and the amorphous phase by optical means or electrical means. The first recording layer contains Ge, Te and Bi, and the second recording layer contains Sb and at least one element M1 selected from a group consisting of V, Mn, Ga, Ge, Se, Ag, In, Sn, Te, Pb, Bi and Au. Thus, an information recording medium can be obtained in which both the first information layer and the second information layer have archival rewrite capabilities at a high transmission rate as well as archival capabilities at a low transmission rate.

In another aspect of the present invention, the first recording layer may further contain Sb. In this case, the first recording layer includes Ge, Te, Bi and Sb. Since Sb improves thermal stability, the archival capabilities at a low transmission rate can be improved.

In another aspect of the present invention, the first recording layer may further contain Sn. In this case, the first recording layer includes Ge, Te, Bi and Sn. Since Sn improves crystallization ability, the archival rewrite capabilities at a high transmission rate can be improved.

In another aspect of the present invention, the first recording layer may further contain Bi at 1.0 atom % or more. Thus, both archival rewrite capabilities at a high transmission rate and good archival capabilities at a low transmission rate can be achieved.

In another aspect of the present invention, the first recording layer may be represented by the composition formula $Ge_aBi_bTe_{3+a}$, where $0<a\leq60$ and $1.5\leq b\leq7$. According to this information recording medium, both archival rewrite capabilities at a high transmission rate and good archival capabilities at a low transmission rate can be achieved.

In another aspect of the present invention, the first recording layer may be represented by the composition formula $(Ge-M2)_aBi_bTe_{3+a}$, where M2 is at least one element selected from a group consisting of Sn and Pb. According to this information recording medium, Sn and/or Pb that displace Ge in the Ge—Bi—Te ternary composition improve the crystallization ability thereof, so that the archival rewrite capabilities at a high transmission rate can be improved. Particularly, it is preferable that M2 be 15% or less of the composition of the first recording layer. This is because if the composition ratio of M2 is large, the amplitude of the signals from the first recording layer will be reduced.

In another aspect of the present invention, the first recording layer may have a composition that is expressed by the composition formula $Ge_a(Bi-Sb)_bTe_{3+a}$. According to this information recording medium, Sb that displaces Bi in the Ge—Bi—Te ternary composition improves thermal stability, so that the archival capabilities at a low transmission rate can be improved.

In another aspect of the present invention, the first recording layer may be represented by the composition formula $(Ge-M2)_a(Bi-Sb)_bTe_{3+a}$. According to this information recording medium, Sn and/or Pb that displace Ge in the Ge—Bi—Te ternary composition improve the crystallization ability thereof, and Sb that displaces Bi improves the thermal stability thereof, so both archival rewrite capabilities at a high transmission rate and archival capabilities at a low transmission rate can be achieved. Particularly, it is preferable that M2 be 15% or less of the composition of the first recording layer. This is because if the composition ratio of M2 is large, the amplitude of signals from the first recording layer will be reduced.

Note that the difference between the transmittance $T_c$ (%) of the first information layer when the first recording layer is the crystalline phase and the transmittance $T_a$ (%) of the first information layer when the first recording layer is the amorphous phase can decreased to be 5% or less by employing materials in the first recording layer that are represented by the composition formulas $Ge_aBi_bTe_{3+a}$, $(Ge-M2)_aBi_bTe_{3+a}$, $Ge_a(Bi-Sb)_bTe_{3+a}$ and $(Ge-M2)_a(Bi-Sb)_bTe_{3+a}$.

In another aspect of the present invention, an information recording medium includes at least two information layers, a first information layer having a first recording layer that generates a reversible phase change between the crystalline phase and the amorphous phase by optical means or electrical means, and a second information layer having a second recording layer that generates a reversible phase change between the crystalline phase and the amorphous phase by optical means or electrical means. The first recording layer contains Ge, Te, Sb, and the second recording layer contains Sb and at least one element M1 selected from a group consisting of V, Mn, Ga, Ge, Se, Ag, In, Sn, Te, Pb, Bi and Au. Thus, an information recording medium can be obtained in which both the first information layer and the second information layer have archival rewrite capabilities at a high transmission rate as well as archival capabilities at a low transmission rate.

In another aspect of the present invention, the first recording layer may be represented by the composition formula $Ge_aSb_bTe_{3+a}$, where $0<a\leq60$ and $1.5\leq b\leq7$. According to this information recording medium, archival capabilities at a low transmission rate can be particularly improved.

In another aspect of the present invention, the first recording layer may be represented by the composition formula $(Ge-M2)_aSb_bTe_{3+a}$, where M2 is at least one element selected from a group consisting of Sn and Pb. According to this information recording medium, Sn and/or Pb that displace Ge in the Ge—Sb—Te ternary composition improve the crystallization ability thereof, so that the archival rewrite capabilities at a high transmission rate can be improved. Particularly, it is preferable that M2 be 15% or less of the composition of the first recording layer. This is because if the composition ratio of M2 is large, the amplitude of the signals from the first recording layer will be reduced.

Note that the difference between the transmittance $T_c$ (%) of the first information layer when the first recording layer is in the crystalline phase and the transmittance $T_a$ (%) of the first information layer when the first recording layer is in the amorphous phase can decreased to be 5% or less by employing materials in the first recording layer that are represented by composition formulas $Ge_aSb_bTe_{3+a}$ and $(Ge-M2)_aSb_bTe_{3+a}$.

In another aspect of the present invention, the second recording layer may be represented by the composition formula $Sb_xM1_{100-x}$, where $50\leq x\leq95$ atom %. According to this information recording medium, both archival rewrite capabilities at a high transmission rate and archival capabilities at a low transmission rate can be achieved.

In another aspect of the present invention, the second recording layer may be represented by the composition formula $Sb_yM1_{100-y}$, where $0<y\leq20$ atom %. According to this information recording medium, both archival rewrite capabilities at a high transmission rate and archival capabilities at a low transmission rate can be achieved.

In another aspect of the present invention, the second recording layer may be represented by the composition formula $Ge_a(Bi-Sb)_bTe_{3+a}$. According to this information recording medium, the Sb that displaces Bi in the Ge—Bi—Te ternary composition increases the thermal stability thereof, so that the archival capabilities at a low transmission rate can be improved.

In another aspect of the present invention, the second recording layer may be represented by the composition formula $(Ge-M2)_a(Bi-Sb)_bTe_{3+a}$. According to this information recording medium, the Sn and/or Pb that displace Ge in the Ge—Bi—Te ternary composition improve the crystallization ability thereof, and the Sb that displaces Bi increases the thermal stability, so that both archival rewrite capabilities at a high transmission rate and archival capabilities at a low transmission rate can be achieved. Particularly, it is preferable that M2 be 15% or less of the composition of the second recording layer. This is because if the composition ratio of M2 is large, the amplitude of the signals from the second recording layer will be reduced.

In another aspect of the present invention, an information recording medium of the present invention includes at least two information layers, a first information layer having a first recording layer that generates a reversible phase change between the crystalline phase and the amorphous phase by optical means or electrical means, and a second information layer having a second recording layer that generates a reversible phase change between the crystalline phase and the amorphous phase by optical means or electrical means. Both the first recording layer and the second recording layer contain Ge, Te and Bi. Thus, an information recording medium can be obtained in which both the first information layer and the second information layer have archival rewrite capabilities at a high transmission rate as well as archival capabilities at a low transmission rate.

Furthermore, at least one of the first recording layer and the second recording layer may contain Bi at 1.0 atom % or more. Thus, both archival rewrite capabilities at a high transmission rate and archival capabilities at a low transmission rate can be achieved.

In another aspect of the present invention, at least one of the first recording layer and the second recording layer may be represented by the composition formula $Ge_aBi_bTe_{3+a}$. According to this information recording medium, both archival rewrite capabilities at a high transmission rate and archival capabilities at a low transmission rate can be achieved.

In another aspect of the present invention, at least one of the first recording layer and the second recording layer may be represented by the composition formula $(Ge-M2)_aBi_bTe_{3+a}$. According to this information recording medium, the Sn and/or Pb that displace Ge in the Ge—Bi—Te ternary composition improve the crystallization ability thereof, so that the archival rewrite capabilities at a high transmission rate can be improved. Particularly, it is preferable that M2 be 15% or less of the composition of the recording layer. This is because if the composition ratio of M2 is large, the amplitude of the signals from the recording layer will be reduced.

In another aspect of the present invention, the information recording medium further includes an interface layer that is provided adjacent to a surface of at least one of the first recording layer and the second recording layer, and the interface layer contains one or more compositions selected from a group consisting of $Ga_2O_3$, $SnO_2$, $ZrO_2$, $HfO_2$, $Nb_2O_5$, $Ta_2O_5$, $SiO_2$, $Cr_2O_3$, $Al_2O_3$, $TiO_2$, $ZnO$, Zr—N, Hf—N, Nb—N, Ta—N, Si—N, Cr—N, Ge—N, Al—N, Ge—Si—N, Ge—Cr—N, $YF_3$, $LaF_3$, $CeF_3$, $GdF_3$, $DyF_3$, $ErF_3$, $YbF_3$, C and ZnS. According to this information recording medium, the interface layer that is provided adjacent to the recording layer suppresses atom diffusion into the recording layer, so that repeated rewriting capability can be improved. In addition, the interface layer enhances the crystallization ability of the recording layer, so that archival rewrite capabilities at a high transmission rate are also improved.

In another aspect of the present invention, the first information layer may include at least a first incident side dielectric layer, a first incident side interface layer, a first recording layer, a first counterincident side interface layer, a first reflection layer and a transmittance adjustment layer in this order. According to this structure, an information recording medium can be obtained that has high transmittance in the first information layer, good erasing properties, and good rewriting performance.

In another aspect of the present invention, the second information layer may include at least a second incident side dielectric layer, a second incident side interface layer, a second recording layer, a second counterincident side interface layer, a second counterincident side dielectric layer and a second reflection layer in this order. According to this structure, an information recording medium can be obtained that has high recording sensitivity in the second information layer, good erasing properties, and good rewriting performance.

In another aspect of the present invention, the first information layer is disposed at the optical means side with respect to the second information layer. Therefore, a laser beam from the optical means will pass through the first information layer and reach the second information layer.

In another aspect of the present invention, the thickness of the first recording layer may be 9 nm or less. According to this structure, an information recording medium can be obtained that has high transmittance in the first information layer, good erasing properties, and good rewriting performance.

In another aspect of the present invention, the thickness of the first recording layer may be between 6 and 15 nm. According to this structure, an information recording medium can be obtained that has high recording sensitivity in the second information layer, good erasing properties, and good rewriting performance.

In another aspect of the present invention, a method for producing an information recording medium having at least two information layers on a substrate includes the steps of forming a first recording layer that generates a phase change, and forming a second recording layer that generates a phase change. A sputtering target containing Ge, Te and Bi is used in the first recording layer forming step, and a sputtering target containing Sb and at least one element M1 selected from a group consisting of V, Mn, Ga, Ge, Se, Ag, In, Sn, Te, Pb, Bi and Au is used in the second recording layer forming step. According to this method, an information recording medium can be produced in which the first recording layer includes Ge, Te and Bi, and the second recording layer includes Sb and M1.

In another aspect of the present invention, the sputtering target that is used in the first recording layer forming step may further contain Sb. According to this method, an information recording medium can be produced in which the first recording layer includes Ge, Sb, Te and Bi.

In another aspect of the present invention, the sputtering target that is used in the first recording layer forming step may further contain Sn. According to this method, an information recording medium can be produced in which the first recording layer includes Ge, Sn, Te and Bi.

In another aspect of the present invention, a sputtering target containing Bi at 0.5 atom % or more may be used in the first recording layer forming step.

In another aspect of the present invention, the composition of the sputtering target may be selected so that the first recording layer that is formed by the sputtering target used in the first recording layer forming step is represented by a composition formula $Ge_aBi_bTe_{3+a}$, where $0 < a \leq 60$ and $1.5 \leq b \leq 7$.

In another aspect of the present invention, the composition of the sputtering target may be selected so that the first recording layer that is formed by the sputtering target used in the first recording layer forming step is represented by the composition formula $(Ge-M2)_aBi_bTe_{3+a}$, where M2 is at least one element selected from a group consisting of Sn and Pb.

In another aspect of the present invention, the composition of the sputtering target may be selected so that the first recording layer that is formed by the sputtering target used in the first recording layer forming step is represented by the composition formula $Ge_a(Bi-Sb)_bTe_{3+a}$.

In another aspect of the present invention, a method for producing an information recording medium having at least two information layers includes the steps of forming a first recording layer that generates a phase change, and forming a second recording layer that generates a phase change, in which a sputtering target containing Ge, Te and Sb is used in the first recording layer forming step, and a sputtering target containing Sb and at least one element M1 selected from a group consisting of V, Mn, Ga, Ge, Se, Ag, In, Sn, Te, Pb, Bi and Au is used in the second recording layer forming step. According to this method, an information recording medium can be produced in which the first recording layer includes Ge, Te and Sb, and the second recording layer includes Sb and M1.

In another aspect of the present invention, the composition of the sputtering target may be selected so that the first recording layer that is formed by the sputtering target used in the first recording layer forming step is represented by the composition formula $Ge_aSb_bTe_{3+a}$, where $0<a\leq 60$ and $1.5\leq b\leq 7$.

In another aspect of the present invention, the composition of the sputtering target may be selected so that the first recording layer that is formed by the sputtering target used in the first recording layer forming step is represented by the composition formula $(Ge-M2)_aSb_bTe_{3+a}$, where M2 is at least one element selected from a group consisting of Sn and Pb.

In another aspect of the present invention, the composition of the sputtering target may be selected so that the first recording layer that is formed by the sputtering target used in the first recording layer forming step is represented by the composition formula $(Ge-M2)_a(Bi-Sb)_bTe_{3+a}$.

In another aspect of the present invention, the composition of the sputtering target may be selected so that the second recording layer that is formed by the sputtering target used in the second recording layer forming step is represented by the composition formula $Sb_xM1_{100-x}$, where $50\leq x\leq 95$ atom %.

In another aspect of the present invention, the composition of the sputtering target may be selected so that the second recording layer that is formed by the sputtering target used in the second recording layer forming step is represented by the composition formula $Sb_yM1_{100-y}$, where $0<y\leq 20$ atom %.

In another aspect of the present invention, the composition of the sputtering target may be selected so that the second recording layer that is formed by the sputtering target used in the second recording layer forming step is represented by the composition formula $Ge_a(Bi-Sb)_bTe_{3+a}$.

In another aspect of the present invention, the composition of the sputtering target may be selected so that the second recording layer that is formed by the sputtering target used in the second recording layer forming step is represented by the composition formula $(Ge-M2)_a(Bi-Sb)_bTe_{3+a}$.

In another aspect of the present invention, a method for producing an information recording medium having at least two information layers includes the steps of forming a first recording layer that generates a phase change, and forming a second recording layer that generates a phase change, in which a sputtering target containing Ge, Te and Bi is used in both the first recording layer forming step and the second recording layer forming step. According to this method, an information recording medium can be produced in which both the first recording layer and the second recording layer include Ge, Te and Bi.

In another aspect of the present invention, a sputtering target containing Bi at 0.5 atom % or more may be used in the second recording layer forming step.

In another aspect of the present invention, the composition of the sputtering target may be selected so that the second recording layer that is formed by the sputtering target used in the second recording layer forming step is represented by the composition formula $Ge_aBi_bTe_{3+a}$.

In another aspect of the present invention, the composition of the sputtering target may be selected so that the second recording layer that is formed by the sputtering target used in the second recording layer forming step is represented by the composition formula $(Ge-M2)_aBi_bTe_{3+a}$.

BRIEF DESCRIPTION OF THE DRAWINGS

FIG. 9 is a diagram showing an example of recording and erasing pulse waveforms in the electrical information recording medium according to the present invention.

DESCRIPTION OF THE PREFERRED EMBODIMENTS

Figure 1:
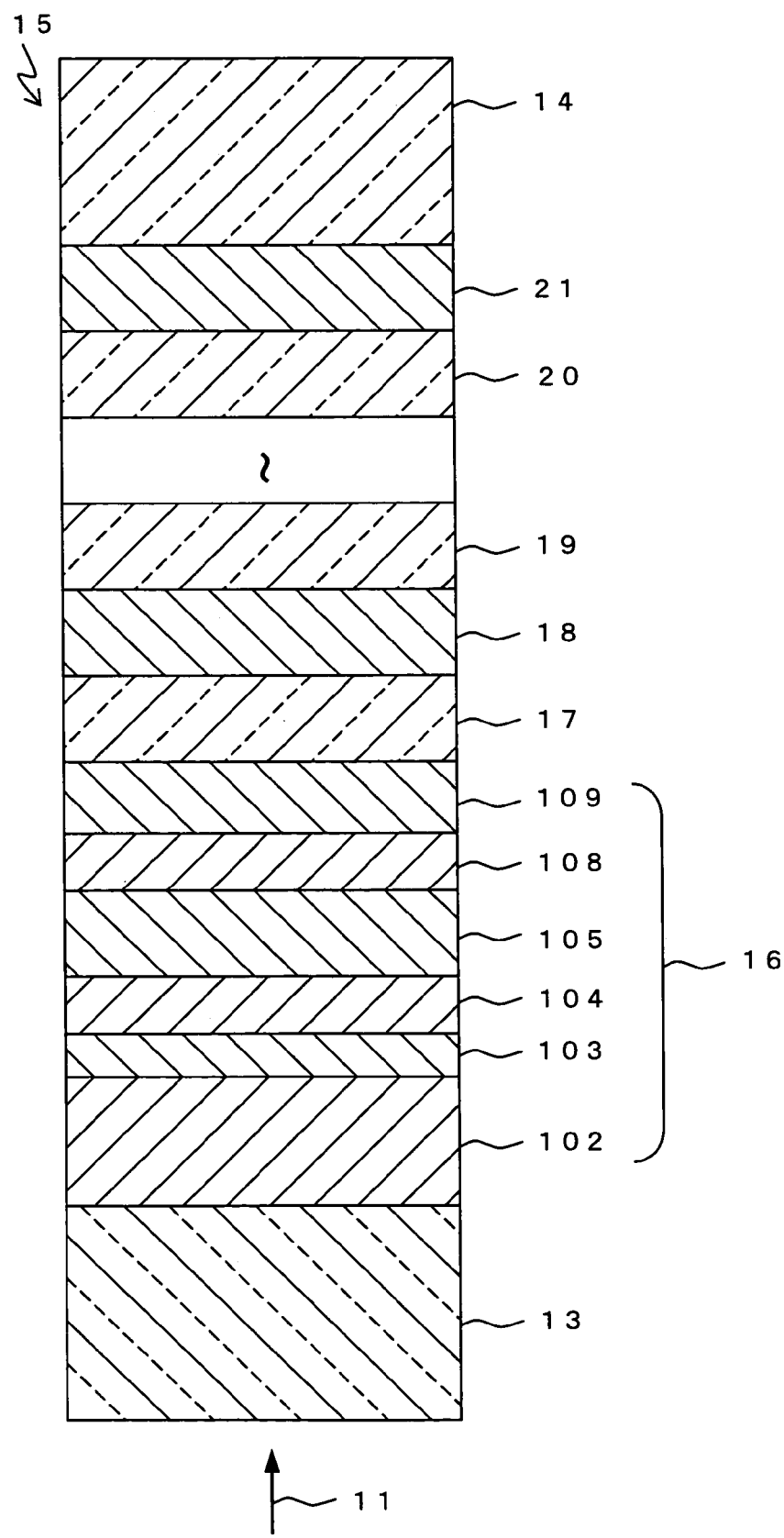
FIG. 1 is a cross-sectional view showing a configuration of an information recording medium according to Embodiment 1 of the present invention.

Embodiments of the present invention will be described below with reference to the attached drawings. Note that the foregoing embodiments are examples only, and the present invention should not be limited thereto. In addition, in the foregoing embodiments, the same portions will be referred to with the same reference numerals in order to avoid repeating the same descriptions thereof.

Embodiment 1

An information recording medium according to a first embodiment of the present invention will be described below. A partial cross section of an information recording medium 15 according to the first embodiment is shown in FIG. 1. The information recording medium 15 is a multilayer optical information recording medium that can record and reproduce information by means of a laser beam 11 irradiated from one side thereof.

The information recording medium 15 includes N (a non-negative integer in which $N\geq 2$) sets of information layers 21, 18 and first information layers 16, and a transparent layer 13, that are sequentially formed on a substrate 14 via optical separation layers 20, 19 and 17 and the like. Counting from the incident side of the laser beam 11, the first through $(N-1)^{th}$ sets of first information layers 16 and information layers 18 are optically transparent information layers (hereinafter, the Nth set of information layers from the incident side of the laser beam 11 will be referred to as the "N-th information layer").

The transparent layer 13 is formed from a resin such as a photo-curing resin (particularly an ultraviolet curing resin) or a delayed action resin, or a similar dielectric and the like. Preferably, the transparent layer 13 absorbs a small amount of light with respect to the laser beam 11 that is used, and has a small optical double refraction in a short wavelength region. In addition, the transparent layer 13 may be a transparent disk-like polycarbonate, amorphous polyolefin, PMMA or other resin or glass. In this case, the transparent layer 13 can be glued to a first incident side dielectric film 102 by a photo-curing resin (particularly an ultraviolet curing resin), a delayed action resin or other resin.

The wavelength $\lambda$ of the laser beam 11 is preferably 450 nm or less for high-density recording, since the spot diameter of a focused laser beam 11 depends on the wavelength $\lambda$ (the shorter the wavelength $\lambda$ is, the smaller spot diameter can be obtained). It is more preferable that the wavelength $\lambda$ is within the range of 350–450 nm since light absorption by the transparent layer 13 and the like increases if it is less than 350 nm.

The substrate 14 is a transparent disk-like substrate. The substrate 14 can be, for example, a polycarbonate, amorphous polyolefin, PMMA or other resin, or a glass.

The surface of the substrate 14 at the information layer 21 side thereof may be provided with a guide groove for guiding the laser beam, if necessary. The surface of the substrate 14 at the opposite side of the information layer 21 is preferably smooth. The substrate 14 is preferably composed of a polycarbonate since it has excellent transfer and mass production capabilities and is inexpensive. Furthermore, the thickness of the substrate 14 is preferably within the range of 0.5–1.2 mm so that the substrate 14 will have sufficient strength and that thickness of the information recording medium 15 will be approximately 1.2 mm. Furthermore, if the thickness of the transparent layer 13 is approximately 0.6 mm (good recording and reproducing performance can be obtained when NA=0.6), the thickness of the substrate 14 is preferably within the range of 0.55–0.65 mm. In addition, if the thickness of the transparent layer 13 is approximately 0.1 mm (good recording and reproducing performance can be obtained when NA=0.85), the thickness of the substrate 14 is preferably within the range of 1.05–1.15 mm.

The optical separation layers 20, 19, 17 and the like are made of a photo-curing resin (particularly an ultraviolet curing resin), a delayed action resin or other resin, or a dielectric or the like. Preferably, the optical separation layers absorb a small amount of light with respect to the laser beam 11 that is used, and have a small optical double refraction in a short wavelength region.

The optical separation layers 20, 19, 17 and the like are provided for discriminating the focal positions of the first information layers 16, the information layers 18, 21, and the like in the information recording medium 15. The thicknesses of the optical separation layers 20, 19, 17 and the like are required to be equal to or greater than a depth of focus $\Delta Z$ that is determined by a numerical aperture NA of an objective lens and a wavelength $\lambda$ of the laser beam 11. If it is assumed that a reference intensity of a focused point of light is 80% of that when there is no aberration, $\Delta Z$ can be approximated as $\Delta Z = \lambda / \{2(NA)^2\}$. When $\lambda=405$ nm and NA=0.85, then $\Delta Z = 0.280$ µm, and within ±0.3 µm means within the depth of focus. Accordingly, the thicknesses of the optical separation layers 20, 19, 17 and the like are required to be 0.6 µm or greater in this situation. The distance between the first information layer 16 and each of the information layers 18, 21 and others is preferably within a range that the laser beam 11 can be focused by using the objective lens. Accordingly, the total sum of the thicknesses of the optical separation layers 20, 19, 17 and the like is preferably within a tolerance permitted by the objective lens (e.g., 50 µm or less).

In the optical separation layers 20, 19, 17 and the like, a guide groove may be formed on the surface at the incident side of the laser beam 11 for guiding the laser beam, if necessary.

In this case, when irradiating the laser beam 11 from one side, the K-th information layer (K is a non-negative integer in which $1 < K \leq N$) can be read and written to by the laser beam 11 that passed through the first through the (K−1)th information layers.

Furthermore, any one of the first information layer through the N-th information layer may be a read only type information layer (ROM: Read Only Memory), or a write-once-read-many information layer (WO: Write Once).

Hereinafter, the structure of the first information layer 16 will be described in detail.

The first information layer 16 includes the first incident side dielectric film 102, a first incident side interface film 103, a first recording film 104, a first counterincident side interface film 105, a first reflection film 108 and a transmittance adjustment film 109, which are arranged in this order from the incident side of the laser beam 11.

The first incident side dielectric film 102 is made of a dielectric. This first incident side dielectric film 102 functions to prevent the oxidation, corrosion, deformation and the like of the first recording film 104, functions to adjust the optical distance for enhancing the light absorption efficiency of the first recording film 104 and functions to increase the variation in the reflection factor between the crystalline phase and the amorphous phase so that signal amplitude is increased. The first incident side dielectric film 102 may be made of an oxide such as $TiO_2$, $ZrO_2$, $HfO_2$, $ZnO$, $Nb_2O_5$, $Ta_2O_5$, $SiO_2$, $Al_2O_3$, $Bi_2O_3$, $Cr_2O_3$, $SnO_2$ or $Ga_2O_3$. In addition, it is possible to use a nitride such as C—N, Ti—N, Zr—N, Hf—N, Nb—N, Ta—N, Si—N, Ge—N, Cr—N, Al—N, Ge—Si—N or Ge—Cr—N. In addition, it is also possible to use a sulfide such as ZnS, a carbide such as SiC or a fluoride such as $YF_3$, $LaF_3$, $CeF_3$, $GdF_3$, $DyF_3$, $ErF_3$ or $YbF_3$, or C. In addition, it is possible to use a mixture of the above-mentioned materials. For example, $ZnS$—$SiO_2$ that is a mixture of ZnS and $SiO_2$ is especially good as a material for the first incident side dielectric film 102. $ZnS$—$SiO_2$ is an amorphous material and has a high refractive index, a fast deposition rate, good mechanical characteristics and good resistance to humidity.

The film thickness of the first incident side dielectric film 102 can be determined precisely by performing calculations in accordance with the matrix method, so as to satisfy the conditions that the difference in the quantity of reflected light between the crystalline phase and the amorphous phase of the recording layer of the first recording film 104 is large, the light absorption in the first recording film 104 is large, and the transmittance of the first information layer 16 is large.

The first incident side interface film 103 functions to prevent mass transfer that is generated between the first incident side dielectric film 102 and the first recording film 104 by repeated recording. Preferably, the material of the first incident side interface film 103 absorbs little light and has a high melting point so that it does not melt during recording, and has good adhesive properties with the first recording film 104. Having a high melting point so as not to melt during recording is a necessary characteristic for avoiding melting and contamination with the first recording film 104 when a high power laser beam 11 is irradiated thereon. If the material of the first incident side interface film 103 is contaminated, the composition of the first recording film 104 is changed so that the rewriting performance thereof is substantially deteriorated. In addition, a material having good adhesive properties with the first recording film 104 is a necessary characteristic for securing reliability.

The first incident side interface film 103 can be made of a material that is of the same type as the first incident side dielectric film 102. Particularly, it is preferable to use a material containing Cr, M3 and O (here, M3 is one or more elements selected from a group consisting of Zr and Hf). Further, it is preferable that Cr and O form $Cr_2O_3$, and M3 and O form $M3O_2$, so as to be a mixture of $Cr_2O_3$ and $M3O_2$. $Cr_2O_3$ is a material that has good adhesive properties with the first recording film 104. In addition, $ZrO_2$ and $HfO_2$ are transparent materials having high melting points (approximately 2700–2800° C.) and relatively low thermal conductivity among oxide materials, which means excellent repeated rewriting capabilities. By mixing these two types of oxide materials, it is possible to achieve an information recording medium 15 that has good repeated rewriting capabilities and high reliability even if it is formed partially adjacent to the first recording film 104. The amount of $Cr_2O_3$ in the $Cr_2O_3$—$M3O_2$ is preferably 10 mol % or greater in order to ensure excellent adhesive properties with the first recording film 104, and is preferably 60 mol % or less in order to maintain the light absorption in the first incident side interface film 103 at a small value (there is a tendency for light absorption to increase as $Cr_2O_3$ increases). More preferably, the content of $Cr_2O_3$ in $Cr_2O_3$—$M3O_2$ is within the range of 20–50 mol %.

In addition, C is an excellent material for use as the first incident side interface film 103 since it has good adhesive properties with the recording layer. C is also preferable because it is an inexpensive material.

The first incident side interface film 103 can be a material that further contains Si in addition to Cr, M3, and O. Moreover, it is preferable that Cr and O form $Cr_2O_3$, M3 and O form $M3O_2$, and Si and O form $SiO_2$, so as to be a mixture of $SiO_2$, $Cr_2O_3$ and $M3O_2$. When $SiO_2$ is contained therein, transparency is enhanced so that a first information layer 16 having excellent recording capabilities can be achieved. Preferably, the content of $SiO_2$ in $SiO_2$—$Cr_2O_3$—$M3O_2$ is 5 mol % or greater, and 50 mol % or less so as to ensure excellent adhesive properties with the first recording film 104. More preferably, the content of $SiO_2$ in $SiO_2$—$Cr_2O_3$—$M3O_2$ is within the range of 10–40 mol %. In addition, the total sum of the contents of $SiO_2$ and $Cr_2O_3$ is less than or equal to 95 mol % so as to secure good recording rewriting capabilities.

The film thickness of the first incident side interface film 103 is preferably within the range of 1–10 nm, and more preferably within the range of 2–7 nm, so that the difference in the quantity of light reflected before and after recording on the first information layer 16 does not decrease due to light absorption in the first incident side interface film 103.

The first counterincident side interface film 105 functions to adjust the optical distance so as to enhance the light absorption efficiency of the first recording film 104 and functions to increase the variation in the quantity of light reflected before and after recording so as to increase signal amplitude. The first counterincident side interface film 105 can be made of a material of the same type as the first incident side dielectric film 102. In addition, similar to the first incident side interface film 103, it is preferable to use a material that contains Cr, M3 and O. Further, it is preferable that Cr and O form $Cr_2O_3$, and M3 and O form $M3O_2$, so as to be a mixture of $Cr_2O_3$ and $M3O_2$. The first counterincident side interface film 105 tends to have worse adhesive properties than the first incident side interface film 103. Therefore, the amount of $Cr_2O_3$ in the $Cr_2O_3$—$M3O_2$ is preferably within the range of 20–80 mol % and is more than that of the first incident side interface film 103. More preferably, the content of $Cr_2O_3$ in $Cr_2O_3$—$M3O_2$ is within the range of 30–70 mol %.

The first counterincident side interface film 105 can be a material that further contains Si in addition to Cr, M3, O in the same way as the first incident side interface film 103. Moreover, it is preferable that Cr and O form $Cr_2O_3$, M3 and O form $M3O_2$, and Si and O form $SiO_2$, so as to be a mixture of $SiO_2$, $Cr_2O_3$ and $M3O_2$. Preferably, the content of $SiO_2$ in $SiO_2$—$Cr_2O_3$—$M3O_2$ is 40 mol % or less and is less than that of the first incident side interface film 103, so as to ensure good adhesive properties with the first recording film 104. More preferably, the content of $SiO_2$ in $SiO_2$—$Cr_2O_3$—$M3O_2$ is within the range of 5–35 mol %. In addition, the total sum of the contents of $SiO_2$ and $Cr_2O_3$ is less than or equal to 95 mol % so as to secure good recording rewriting capabilities.

The film thickness of the first counterincident side interface film 105 is preferably within the range of 2–75 nm, and more preferably within the range of 2–40 nm. If the film thickness of the first counterincident side interface film 105 is selected within this range, heat generated in the first recording film 104 can be diffused efficiently into the first reflection film 108 side.

The first recording film 104 is made of a material that generates a reversible phase change between the crystalline phase and the amorphous phase when the laser beam 11 is irradiated thereon. The first recording film 104 can be formed by using a material that contains Ge, Te and Bi, for example. Furthermore, the first recording film 104 preferably contains Bi at 1.0 atom % or more. More specifically, the first recording film 104 can be formed by using a material that is expressed by $Ge_aBi_bTe_{3+a}$, which preferably satisfies the relationship $0<a \leq 60$, and more preferably the relationship $4 \leq a \leq 40$, so that the amorphous phase is stable, the archival capabilities at a low transmission rate are good, there is little increase in the melting point and drop in crystallization speed, and the archival rewrite capabilities at a high transmission rate are good. In addition, it is preferable that the amorphous phase is stable, the relationship $1.5 \leq b \leq 7$ is satisfied so that there is little drop in crystallization speed, and more preferably, the relationship $2 \leq b \leq 4$ is satisfied.

In addition, the first recording film 104 may be formed by using a material that is expressed by the composition formula $(Ge—M2)_aBi_bTe_{3+a}$, where M2 is one or more elements selected from a group consisting of Sn and Pb. If this material is used, the element M2 that displaces Ge improves the crystallization ability thereof, so that a sufficient erasing ratio can be obtained even if the film thickness of the first recording film 104 is small. The element Sn is more preferable as the element M2 because it has low toxicity. If this material is used, it is preferable to satisfy the relationships $0<a \leq 60$ (more preferably $4 \leq a \leq 40$) and $1.5 \leq b \leq 7$ (more preferably $2 \leq b \leq 4$). It is preferable that M2 is less than or equal to 15% in the composition of the first recording film 104.

In addition, the first recording film 104 can also be formed by using a material containing Ge, Sb, Te and Bi. More specifically, the first recording film 104 can be also formed by using a material that is expressed by the formula $Ge_a(Bi\text{—}Sb)_b Te_{3+a}$. If this material is used, the Sb that displaces Bi makes the amorphous phase more stable, so the archival capabilities at a low transmission rate can be improved. If this material is used, it is preferable to satisfy the relationships $0 \leq a \leq 60$ (more preferably $4 \leq a \leq 40$) and $1.5 \leq b \leq 7$ (more preferably $2 \leq b \leq 4$).

In addition, the first recording film 104 may be formed by using a material that is expressed by the composition formula $(Ge\text{—}M2)_a(Bi\text{—}Sb)_b Te_{3+a}$. If this material is used, it is preferable to satisfy the relationships $0 < a \leq 60$ (more preferably $4 \leq a \leq 40$) and $1.5 \leq b \leq 7$ (more preferably $2 \leq b \leq 4$). It is preferable that M2 is less than or equal to 15% in the composition of the first recording film 104.

In addition, the first recording film 104 can be formed by using a material that contains Ge, Te and Sb. More specifically, the first recording film 104 can be formed by using a material that is expressed by the formula $Ge_a Sb_b Te_{3+a}$. If this material is used, Sb makes the amorphous phase more stable, so the archival capabilities at a low transmission rate can be improved. If this material is used, it is preferable to satisfy the relationships $0 < a \leq 60$ (more preferably $0 \leq a \leq 40$) and $1.5 \leq b \leq 7$ (more preferably $2 \leq b \leq 4$).

In addition, the first recording film 104 may be formed by using a material that is expressed by the composition formula $(Ge\text{—}M2)_a Sb_b Te_{3+a}$. If this material is used, the element M2 that displaces Ge improves the crystallization ability thereof, so that a sufficient erasing ratio can be obtained even if the film thickness of the first recording film 104 is small. If this material is used, it is preferable to satisfy the relationships $0 < a \leq 60$ (more preferably $0 < a \leq 40$) and $1.5 \leq b \leq 7$ (more preferably $2 \leq b \leq 4$). Further, it is preferable that M2 is less than or equal to 15% in the composition of the first recording film 104.

The first information layer 16 is required to have high transmittance so that a sufficient quantity of laser light necessary for recording and reproducing can reach from the incident side of the laser beam 11 to the information layer that is disposed beyond first information layer 16. Therefore, the film thickness of the first recording film 104 is preferably less than or equal to 9 nm, and more preferably within the range of 4–8 nm.

The first reflection film 108 has an optical function that increases the quantity of light that is absorbed in the first recording film 104. In addition, the first reflection film 108 also has a thermal function that rapidly diffuses heat that is generated in the first recording film 104 so that the first recording film 104 can be easily made amorphous. Moreover, the first reflection film 108 functions to protect the multilayer film from the operating environment.

The first reflection film 108 can be made of a material such as Ag, Au, Cu or Al having high thermal conductivity. In addition, an alloy such as Al—Cr, Al—Ti, Au—Pd, Au—Cr, Ag—Pd, Ag—Pd—Cu, Ag—Pd-Ti, Ag—Ru—Au, Ag—Cu—Ni, Ag—Zn—Al, Ag—Nd—Au, Ag—Nd—Cu or Cu—Si can be used. An Ag alloy is particularly preferred as the material for the first reflection film 108 since it has a large thermal conductivity. The film thickness of the first reflection film 108 is preferably within the range of 3–15 nm so that the transmittance of the first information layer 16 will be as high as possible, and more preferably within the range of 8–12 nm. If the film thickness of the first reflection film 108 is within this range, the thermal diffusion function will be sufficient, a sufficient reflection factor of the first information layer 16 can be ensured, and sufficient transmittance of the first information layer 16 can be achieved.

The transmittance adjustment film 109 is made of a dielectric and functions to adjust the transmittance of the first information layer 16. This transmittance adjustment film 109 enables both the transmittance $T_c$ (%) of the first information layer 16 when the first recording film 104 is in the crystalline phase and the transmittance $T_a$ (%) of the first information layer 16 when the first recording film 104 is in the amorphous phase to be high. More specifically, in the first information layer 16 having the transmittance adjustment film 109, the transmittance increases by approximately 2–10% compared to when the transmittance adjustment film 109 is not provided. In addition, the transmittance adjustment film 109 also functions to effectively diffuse heat that is generated in the first recording film 104.

In order to enhance the effect of increasing the transmittances $T_c$ and $T_a$ of the first information layer 16, a refractive index n and an extinction coefficient k of the transmittance adjustment film 109 preferably satisfy the inequalities $2.0 \leq n$ and $k \leq 0.1$, and more preferably the inequalities $2.4 \leq n \leq 3.0$ and $k \leq 0.05$.

A film thickness d of the transmittance adjustment film 109 is preferably in the range of $(1/32)\lambda/n \leq d \leq (3/16)\lambda/n$ or $(17/32)\lambda/n \leq d \leq (11/16)\lambda/n$, and more preferably in the range of $(1/16)\lambda/n \leq d \leq (5/32)\lambda/n$ or $(9/16)\lambda/n \leq d \leq (21/32)\lambda/n$. Furthermore, the above-mentioned range is preferably within the range of 3 nm $\leq d \leq$ 40 nm or 60 nm $\leq d \leq$ 130 nm, and more preferably within the range of 7 nm $\leq d \leq$ 30 nm or 65 nm $\leq d \leq$ 120 nm, by selecting the wavelength $\lambda$ of the laser beam 11 and the refractive index n of the transmittance adjustment film 109 as 350 nm $\leq \lambda \leq$ 450 nm and $2.0 \leq n \leq 3.0$, for example. By selecting d within this range, both of the transmittances $T_c$ and $T_a$ of the first information layer 16 can be increased.

The transmittance adjustment film 109 can be also made of an oxide such as $TiO_2$, $ZrO_2$, $HfO_2$, $ZnO$, $Nb_2O_5$, $Ta_2O_5$, $SiO_2$, $Al_2O_3$, $Bi_2O_3$, $Cr_2O_3$ or Sr—O. Alternatively, a nitride such as Ti—N, Zr—N, Hf—N, Nb—N, Ta—N, Si—N, Ge—N, Cr—N, Al—N, Ge—Si—N or Ge—Cr—N can be used. Alternatively, a sulfide such as ZnS or a fluoride such as $YF_3$, $LaF_3$, $CeF_3$, $GdF_3$, $DyF_3$, $ErF_3$ or $YbF_3$ can be used. Alternatively, a mixture of the above-mentioned materials can be used. Among these, especially a material containing $TiO_2$ and $TiO_2$ can be used preferably. These materials have large refractive indexes (n=2.6–2.8) and small extinction coefficient (k=0.0–0.05), so that the effect of increasing the transmittance of the first information layer 16 can be enhanced.

It is preferable that the transmittances $T_c$ and $T_a$ of the first information layer 16 satisfy the inequalities $40 < T_c$ and $40 < T_a$, and more preferably the inequalities $46 < T_c$ and $46 \leq T_a$, so that a sufficient quantity of laser light that is necessary for recording and reproducing can reach from the incident side of the laser beam 11 to the information layer that is disposed at the opposite side of the incident side of the laser beam 11 with respect to the first information layer 16.

It is preferable that the transmittances $T_c$ and $T_a$ of the first information layer 16 satisfy the relationship $-5 \leq (T_c - T_a) \leq 5$, and more preferably the relationship $-3 \leq (T_c - T_a) \leq 3$. If $T_c$ and $T_a$ satisfy this condition, there will be little influence on the variation in the transmittance ratio due to the state of the first recording film 104 of the first information layer 16 when the information layer that is disposed at the farther side than the first information layer 16 from the incident side of the laser beam 11 is written or read, and thus good recording and reproducing characteristics can be obtained.

It is preferable that the reflection factor $R_{c1}$ (%) when the first recording film 104 is in the crystalline phase and the reflection factor $R_{a1}$ (%) when the first recording film 104 is in the amorphous phase satisfy the relationship $R_{a1}<R_{c1}$ in the first information layer 16. Thus, the reflection factor is high in the initial state where no information is recorded, so that recording and reproducing operations can be performed stably. Moreover, in order to increase the difference of the reflection factors ($R_{c1}-R_{a1}$) so that good recording and reproducing characteristics are obtained, it is preferable that $R_{c1}$ and $R_{a1}$ satisfy the inequalities $0.1 \leq R_{a1} \leq 5$ and $4 \leq R_{c1} \leq 15$, and more preferably the inequalities $0.1 \leq R_{a1} \leq 3$ and $4 \leq R_{c1} \leq 10$.

The information recording medium 15 can be produced by the method described below.

First, (N-1) layers of information layers are sequentially formed on the substrate 14 (thickness thereof is 1.1 mm, for example) via optical separation layers. Each information layer consists of a single layer film or a multilayer film. Each of the layers can be formed by sequentially sputtering the sputtering targets that are to become the materials therefor in a film formation apparatus. In addition, the optical separation layers can be formed by applying a photo-curing resin (particularly an ultraviolet curing resin) or a delayed action resin onto the information layer, rotating the substrate 14 after that so as to spread the resin uniformly (spin coat), and hardening the resin. Furthermore, when the optical separation layer has a guide groove for the laser beam 11, a substrate (a die) on which a groove is formed is closely contacted with the resin before being hardened, and then the substrate 14 and the covered die are rotated for the spin coat. After curing the resin, the substrate (the die) is removed so that the guide groove can be formed.

In this way, (N-1) layers of the information layers are formed on the substrate 14 via the optical separation layers, and the optical separation layer 17 is formed for preparation.

Then, the first information layer 16 is formed on the optical separation layer 17. More specifically, (N-1) layers of information layers are first formed via optical separation layers. After that, the substrate 14 on which the optical separation layer 17 is formed is placed in the film forming apparatus, so that the transmittance adjustment film 109 is formed on the optical separation layer 17. The transmittance adjustment film 109 can be formed by sputtering a sputtering target consisting of a compound that constitutes the transmittance adjustment film 109 in an Ar gas atmosphere or in an atmosphere of a mixed gas of Ar gas and a reacting gas (one or more gases selected from a group consisting of oxygen gas and nitrogen gas). In addition, the transmittance adjustment film 109 can be formed by sputtering reactively a sputtering target consisting of a metal that constitutes the transmittance adjustment film 109 in an atmosphere of a mixed gas of Ar gas and a reacting gas.

Then, the first reflection film 108 is formed on the transmittance adjustment film 109. The first reflection film 108 can be formed by sputtering a sputtering target consisting of a metal or an alloy that constitutes the first reflection film 108 in an atmosphere of Ar gas or in an atmosphere of a mixed gas of Ar gas and a reacting gas.

Then, the first counterincident side interface film 105 is formed on the first reflection film 108. The first counterincident side interface film 105 can be formed by a method similar to that for the transmittance adjustment film 109.

Then, the first recording film 104 is formed on the first counterincident side interface film 105. The first recording film 104 can be formed by sputtering a sputtering target consisting of a Ge—Te—Bi alloy, a sputtering target consisting of a Ge—M2—Te—Bi alloy, a sputtering target consisting of a Ge—Sb—Te—Bi alloy, a sputtering target consisting of a Ge—M2—Sb—Te—Bi alloy, a sputtering target consisting of a Ge—Te—Sb alloy or a sputtering target consisting of a Ge—M2—Te—Sb alloy in accordance with the composition thereof using a single electric power source.

Ar gas, Kr gas, a mixed gas of Ar gas and a reacting gas or a mixed gas of Kr gas and a reacting gas can be used as an atmosphere gas for the sputtering. In addition, the first recording film 104 can be also formed by sputtering targets selected from Ge, Sb, Te, Bi, and M2 simultaneously using plural electric power sources. In addition, the first recording film 104 can be formed by sputtering a binary sputtering target or a ternary sputtering target that is a combination of elements selected from Ge, Sb, Te, Bi and M2 simultaneously using plural electric power sources. Also in these cases, the first recording film 104 is formed by sputtering in an atmosphere of Ar gas, in an atmosphere of Kr gas, in an atmosphere of a mixed gas of Ar gas and a reacting gas, or in an atmosphere of a mixed gas of Kr gas and a reacting gas. Furthermore, it is preferable that a sputtering target that contains Bi 0.5 atom % or more be used in the step of forming the first recording film 104.

Then, the first incident side interface film 103 is formed on the first recording film 104. The first incident side interface film 103 can be formed by a method similar to that for the transmittance adjustment film 109.

Then, the first incident side dielectric film 102 is formed on the first incident side interface film 103. The first incident side dielectric film 102 can be formed by a method similar to that for the transmittance adjustment film 109.

Finally, the transparent layer 13 is formed on the first incident side dielectric film 102. The transparent layer 13 can be formed by applying a photo-curing resin (particularly an ultraviolet curing resin) or a delayed action resin onto the first incident side dielectric film 102 as the spin coat and by hardening the resin. In addition, the transparent layer 13 can be a substrate of a transparent disk-like polycarbonate, amorphous polyolefin, PMMA or other resin or a glass. In this case, the transparent layer 13 can be formed by applying a photo-curing resin (particularly an ultraviolet curing resin), a delayed action resin or other resin onto the first incident side dielectric film 102, contacting a substrate on the first incident side dielectric film 102 closely while the spin coat is performed, and hardening the resin. In addition, it is possible to apply an adhesive resin onto the substrate uniformly in advance, and making it contact closely to the first incident side dielectric film 102.

Furthermore, after forming the first incident side dielectric film 102 or after forming the transparent layer 13, it is possible to perform an initialization step for crystallizing the entire surface of the first recording film 104, if necessary. The crystallization of the first recording film 104 can be performed by irradiating a laser beam thereon.

Embodiment 2

Figure 2:
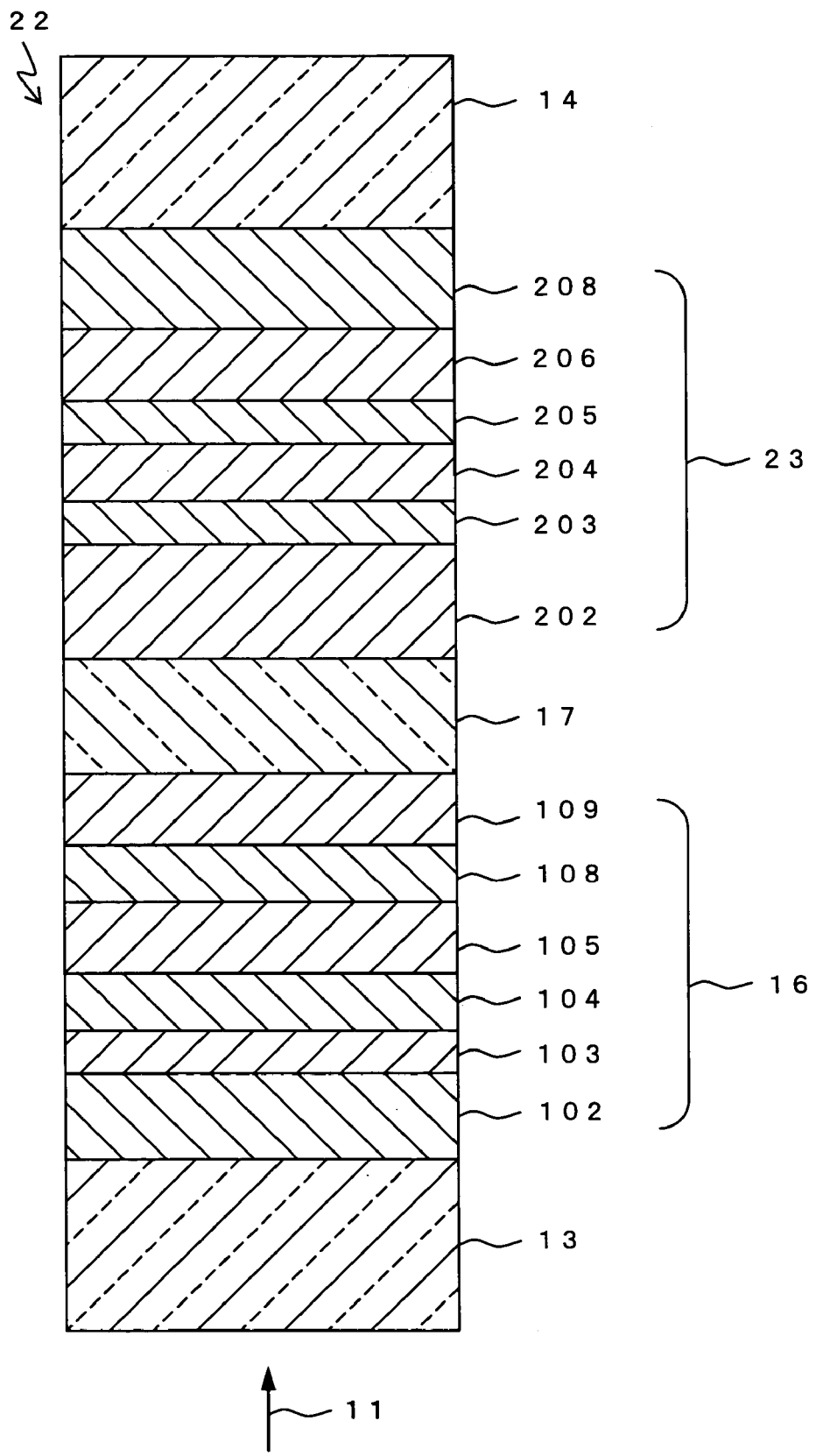
FIG. 2 is a cross-sectional view showing a configuration of an information recording medium according to Embodiment 2 of the present invention.

In a second embodiment of the present invention, an information recording medium is composed of two sets (i.e., N=2) of information layers in the multilayer optical information recording medium according to the first embodiment of the present invention. A partial cross section of an information recording medium 22 according to the second embodiment is shown in FIG. 2. The information recording medium 22 is a two-layer optical information recording medium that can record and reproduce information by irradiating the laser beam 11 from one side thereof.

The information recording medium 22 is made up of a second information layer 23, an optical separation layer 17, a first information layer 16 and a transparent layer 13 that are formed on the substrate 14 in this order. The substrate 14, the optical separation layer 17, the first information layer 16 and the transparent layer 13 can be made of the same materials as described in the first embodiment. In addition, the shapes and functions thereof are also the same as the shapes and the functions explained in the first embodiment.

Hereinafter, the structure of the second information layer 23 will be described in detail.

The second information layer 23 includes a second incident side dielectric film 202, a second incident side interface film 203, a second recording film 204, a second counterincident side interface film 205, a second counterincident side dielectric film 206 and a second reflection film 208, which are disposed in this order from the incident side of the laser beam 11. The second information layer 23 is read from and written to by the laser beam 11 that passed through the transparent layer 13, the first information layer 16 and the optical separation layer 17.

The second incident side dielectric film 202 can be made of the same material as the first incident side dielectric film 102 in the first embodiment. In addition, the function thereof is also the same as the function of the first incident side dielectric film 102 in the first embodiment.

The film thickness of the second incident side dielectric film 202 can be determined precisely in accordance with the matrix method so as to satisfy the condition that the change in the quantity of reflected light will increase between when the second recording film 204 is in the crystalline phase and the when it is in the amorphous phase.

The second incident side interface film 203 can be made of a material that is similar to the first incident side interface film 103 in the first embodiment. In addition, the function and a shape thereof are also similar to the first incident side interface film 103 in the first embodiment.

The second counterincident side interface film 205 can be made of a material that is similar to the first counterincident side interface film 105 in the first embodiment. In addition, the function and a shape thereof are also similar to the first counterincident side interface film 105 in the first embodiment.

The second counterincident side dielectric film 206 can be made of a material that is the same type as the second incident side dielectric film 202. ZnS—SiO$_2$ is a mixture of ZnS and SiO$_2$, and is also a good material for the second counterincident side dielectric film 206.

The film thickness of the second counterincident side dielectric film 206 is preferably within the range of 2–75 nm, and more preferably within the range of 2–40 nm. When selecting the film thickness of the second counterincident side dielectric film 206 within this range, heat generated in the second recording film 204 can be diffused effectively into the second reflection film 208 side.

The second recording film 204 is made of a material that generates a reversible phase change between the crystalline phase and the amorphous phase by irradiation of the laser beam 11. The second recording film 204 can be formed by using a material that contains Sb and M1, for example, where M1 is one or more elements selected from a group consisting of V, Mn, Ga, Ge, Se, Ag, In, Sn, Te, Pb, Bi and Au. More specifically, the second recording film 204 can be formed by using a material that is expressed by the formula Sb$_x$M1$_{100-x}$ (atom %). If x satisfies the inequality $50 \leq x \leq 95$, the difference in the reflection factor of the information recording medium 22 between when the second recording film 204 is in the crystalline phase and when it is in the amorphous phase can be increased, so that good recording and reproducing characteristics can be obtained. Further, if $75 \leq x \leq 95$, the crystallization speed is especially high so that good rewriting capabilities can be obtained at a high transmission rate. In addition, if $50 \leq x \leq 75$, the amorphous phase becomes especially stable so that good recording capabilities can be obtained at a low transmission rate.

In addition, the second recording film 204 can also be formed by using a material that is expressed by the formula Sb$_y$M1$_{100-y}$ (atom %). If y satisfies the inequality $0 < y \leq 20$, the second recording film 204 will have a large crystallization ability and thus good recording and reproducing characteristics can be obtained because the stoichiometric composition range of GeTe—Sb$_2$Te$_3$ is included.

In addition, the second recording film 204 can be made of a material that is similar to the first recording film 104 in the first embodiment.

The film thickness of the second recording film 204 is preferably within the range of 6–15 nm so that the second information layer 23 has a high recording sensitivity. Still within this range, thermal influence on neighboring areas due to the diffusion of heat in the in-plane direction will increase if the second recording film 204 is thick. In addition, if the second recording film 204 is thin, the reflection factor of the second information layer 23 will decrease. Therefore, it is more preferable that the film thickness of the second recording film 204 be within the range of 8–13 nm.

The second reflection film 208 can be made of a material similar to the first reflection film 108 in the first embodiment. A film thickness of the second reflection film 208 is preferably 30 nm or more so that sufficient thermal diffusion function is obtained. Still within this range, if the second reflection film 208 is thicker than 200 nm, the thermal diffusion function thereof becomes too large, and the recording sensitivity of the second information layer 23 will be lowered. Therefore, it is preferable that the film thickness of the second reflection film 208 be within the range of 30–200 nm.

It is possible to dispose an interface film 207 between the second reflection film 208 and the second counterincident side dielectric film 206. In this case, the interface film 207 can be made of a material having lower thermal conductivity than the material of the second reflection film 208. If an Ag alloy is used for the second reflection film 208, an Al or an Al alloy can be used for the interface film 207. In addition, the interface film 207 can be made of an element such as Cr, Ni, Si or C or an oxide such as Ga$_2$O$_3$, SnO$_2$, TiO$_2$, ZrO$_2$, HfO$_2$, ZnO, Nb$_2$O$_5$, Ta$_2$O$_5$, SiO$_2$, Al$_2$O$_3$, Bi$_2$O$_3$ or Cr$_2$O$_3$. In addition, a nitride such as C—N, Ti—N, Zr—N, Nb—N, Ta—N, Si—N, Ge—N, Cr—N, Al—N, Ge—Si—N or Ge—Cr—N can be also used. In addition, a sulfide such as ZnS or a carbide such as SiC or a fluoride such as LaF$_3$ can be used. In addition, a mixture of the above-mentioned materials can also be used. In addition, the film thickness is preferably within the range of 3–100 nm (more preferably, within the range of 10–50 nm).

The information recording medium 22 can be produced by the method described below.

First, the second information layer 23 is formed. More specifically, the substrate 14 (having a thickness of 1.1 mm, for example) is prepared first and placed in a film forming apparatus.

Then, the second reflection film 208 is formed on the substrate 14. When this occurs, if a guide groove for guiding the laser beam 11 is formed on the substrate 14, the second reflection film 208 is formed at the side on which the guide groove is formed. The second reflection film 208 can be formed by a method similar to the first reflection film 108 in the first embodiment.

Then, the interface film 207 is formed on the second reflection film 208, if necessary. The interface film 207 can be formed by sputtering a sputtering target consisting of an element or a compound that constitutes the interface film 207 in an atmosphere of Ar gas or in an atmosphere of a mixed gas of Ar gas and a reacting gas.

Then, the second counterincident side dielectric film 206 is formed on the second reflection film 208 or on the interface film 207, if necessary. The second counterincident side dielectric film 206 can be formed by a method similar to the transmittance adjustment film 109 in the first embodiment.

Then, the second counterincident side interface film 205 is formed on the second reflection film 208, or on the interface film 207, or on the second counterincident side dielectric film 206. The second counterincident side interface film 205 can be formed by a method similar to the transmittance adjustment film 109 in the first embodiment.

Then, the second recording film 204 is formed on the second counterincident side interface film 205. The second recording film 204 can be formed by a method similar to the first recording film 104 in the first embodiment using a sputtering target in accordance with the composition thereof.

Then, the second incident side interface film 203 is formed on the second recording film 204. The second incident side interface film 203 can be formed by a method similar to the transmittance adjustment film 109 in the first embodiment.

Then, the second incident side dielectric film 202 is formed on the second incident side interface film 203. The second incident side dielectric film 202 can be formed by a method similar to the transmittance adjustment film 109 in the first embodiment.

In this way, the second information layer 23 is formed.

Then, the optical separation layer 17 is formed on the second incident side dielectric film 202 of the second information layer 23. The optical separation layer 17 can be formed by applying a photo-curing resin (particularly an ultraviolet curing resin) or a delayed action resin onto the second incident side dielectric film 202 for the spin coat and by hardening the resin. Furthermore, if the optical separation layer 17 has a guide groove for the laser beam 11, a substrate (a die) on which a groove is formed is contacted with the resin before hardened, and after hardening the resin the substrate (a die) is removed so that the guide groove can be formed.

Furthermore, it is possible to perform an initialization step for crystallizing the entire surface of the second recording film 204, if necessary, after forming the second incident side dielectric film 202 or after forming the optical separation layer 17. The crystallization of the second recording film 204 can be performed by irradiating a laser beam thereon.

Then, the first information layer 16 is formed on the optical separation layer 17. More specifically, the transmittance adjustment film 109, the first reflection film 108, the first counterincident side interface film 105, the first recording film 104, the first incident side interface film 103 and the first incident side dielectric film 102 are formed first on the optical separation layer 17 in this order. Each of these layers can be formed by the method described in the first embodiment.

Finally, the transparent layer 13 is formed on the first incident side dielectric film 102. The transparent layer 13 can be formed by the method described in the first embodiment.

Furthermore, after forming the first incident side dielectric film 102 or after forming the transparent layer 13, it is possible to perform an initialization step for crystallizing the entire surface of the first recording film 104, if necessary. The crystallization of the first recording film 104 can be performed by irradiating a laser beam thereon.

In addition, after forming the first incident side dielectric film 102 or after forming the transparent layer 13, it is possible to perform an initialization step for crystallizing the entire surface of the second recording film 204 and the first recording film 104, if necessary. In this case, if the crystallization of the first recording film 104 is performed first, there is a tendency for the laser power necessary for crystallizing the second recording film 204 to increase. Therefore, it is preferable to crystallize the second recording film 204 first.

Embodiment 3

Figure 3:
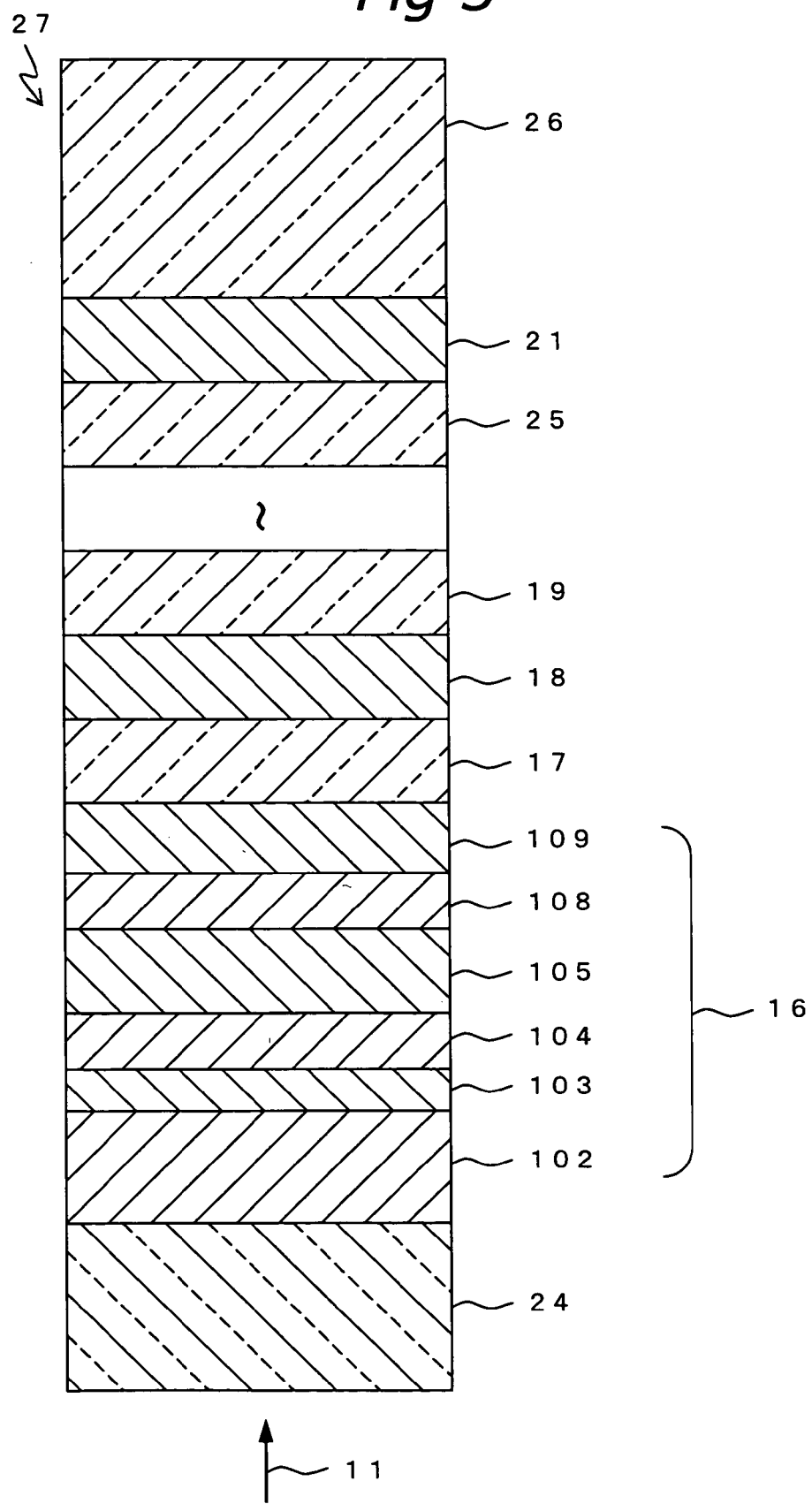
FIG. 3 is a cross-sectional view showing a configuration of an information recording medium according to Embodiment 3 of the present invention.

A third embodiment of an information recording medium according to the present invention will be described below. A partial cross section of an information recording medium 27 according to the third embodiment is shown in FIG. 3. The information recording medium 27 is a multilayer optical information recording medium that is similar to the information recording medium 15 described in the first embodiment, which can record and reproduce information by irradiating the laser beam 11 from one side thereof.

The information recording medium 27 includes N sets of first information layers 16 and the information layer 18 that are formed sequentially on the substrate 24 via the optical separation layers 17, 19 and the like, and the information layer 21 formed on the substrate 26 and adhered via an adhesive layer 25.

The substrate 24 and the substrate 26 are transparent and disk-like substrates similar to the substrate 14. The substrate 24 and the substrate 26 can be made of a resin such as a polycarbonate, an amorphous polyolefin or PMMA, or a glass.

The surface of the substrate 24 at the first incident side dielectric film 102 side and the surface of the substrate 26 at the information layer 21 side may be provided with a guide groove for guiding the laser beam, if necessary. The surface of the substrate 24 at the opposite side of the first incident side dielectric film 102 and the surface of the substrate 26 at the opposite side of the information layer 21 are preferably flat. As a material for the substrate 24 and the substrate 26, a polycarbonate is especially useful because it has excellent transfer and mass production properties and is inexpensive. Furthermore, the thicknesses of the substrate 24 and the substrate 26 are preferably within the range of 0.3–0.9 mm so that sufficient strength is secured, and the thickness of the information recording medium 27 will be approximately 1.2 mm.

The adhesive layer 25 is preferably made of a resin such as a photo-curing resin (particularly an ultraviolet curing resin) or a delayed action resin. It is preferable that the light absorbance of the adhesive layer 25 is small with respect to the laser beam 11 that is used, and has a small optical double refraction in a short wavelength range. Furthermore, the thickness of the adhesive layer 25 is preferably within the range of 0.6–50 μm for the same reason as the optical separation layers 19, 17 and the like.

Descriptions of the portions denoted by the same reference numerals as the first embodiment are omitted.

The information recording medium 27 can be produced by the method described below.

First, the first information layer 16 is formed on the substrate 24 (that has a thickness of 0.6 mm, for example). If a guide groove for guiding the laser beam 11 is formed on the substrate 24, the first information layer 16 is formed at the side on which the guide groove is formed. More specifically, the substrate 24 is placed in the film forming apparatus, and the first incident side dielectric film 102, the first incident side interface film 103, the first recording film 104, the first counterincident side interface film 105, the first reflection film 108 and the transmittance adjustment film 109 are formed in this order. Each of the layers is formed in the same way as the first embodiment. After that, (N−2) layers of information layers are formed sequentially via the optical separation layer.

In addition, the information layer 21 is formed on the substrate 26 (that has a thickness of 0.6 mm, for example). The information layer is made of a single layer film or a multilayer film. Each of the layers can be formed sequentially by sputtering a sputtering target to be a material in the film forming apparatus in the same way as the first embodiment.

Finally, the substrate 24 on which the information layers are formed and the substrate 26 are bonded to each other by using an adhesive layer 25. More specifically, a resin such as a photo-curing resin (particularly an ultraviolet curing resin) or a delayed action resin is applied onto the information layer 21, and the substrate 24 is contacted closely with the information layer 21 for spin coat. After that, the resin is hardened. In addition, it is also possible to uniformly apply an adhesive resin onto the information layer 21 in advance and to make it contact closely with the substrate 24.

Furthermore, after making the substrate 24 and the substrate 26 contact closely with each other, it is possible to perform an initialization step for crystallizing the entire surface of the first recording film 104, if necessary. The crystallization of the first recording film 104 can be performed by irradiating a laser beam thereon.

Embodiment 4

Figure 4:
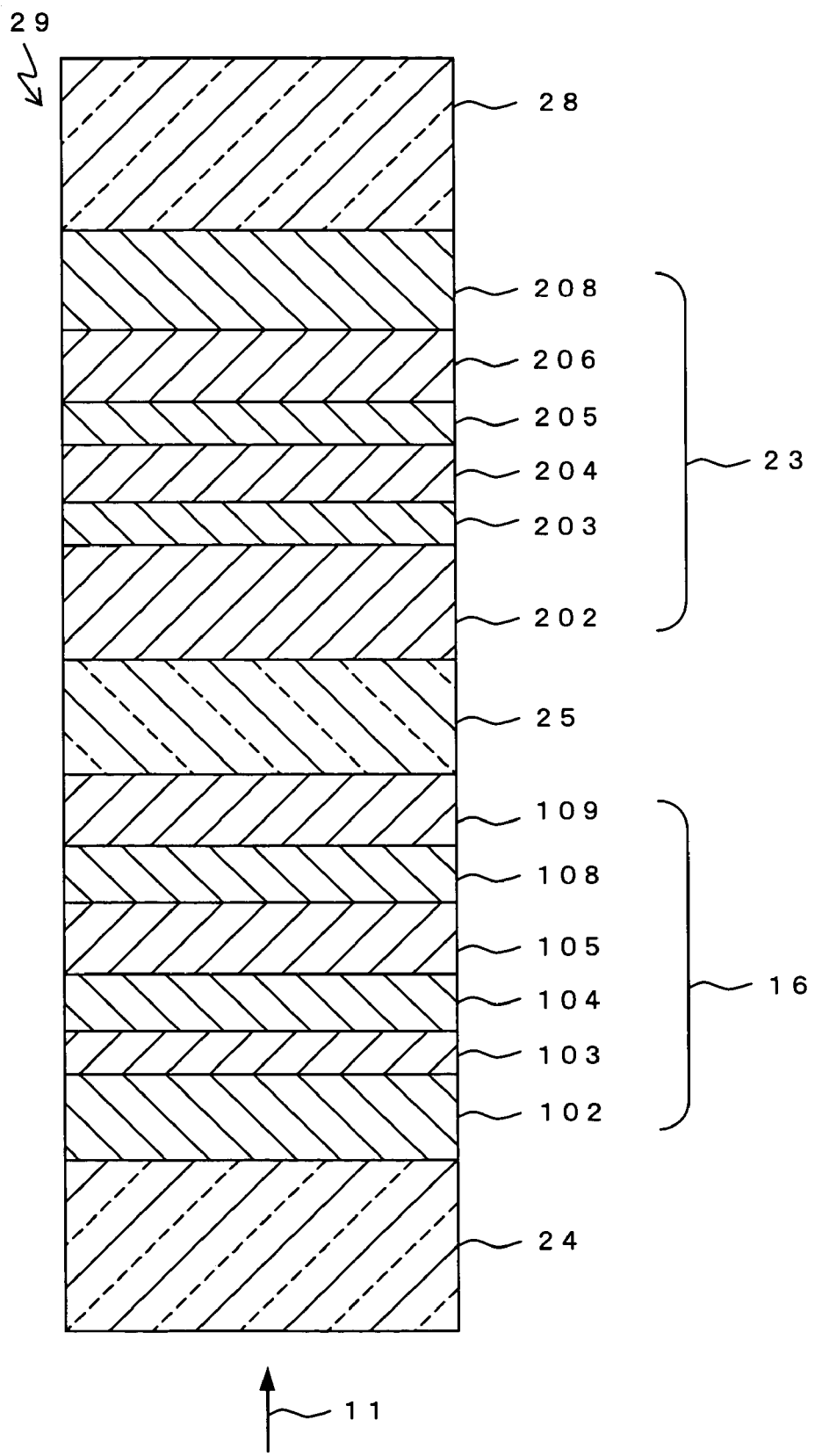
FIG. 4 is a cross-sectional view showing a configuration of an information recording medium according to Embodiment 4 of the present invention.

In a fourth embodiment of the present invention, an information recording medium is composed of two sets (i.e., N=2) of information layers in the multilayer optical information recording medium of the third embodiment. A partial cross section of an information recording medium 29 according to the fourth embodiment is shown in FIG. 4. The information recording medium 29 is a two-layer optical information recording medium which records and reproduced information by irradiating the laser beam 11 from one side thereof in the same way as the information recording medium 22 in the second embodiment.

The information recording medium 29 is made up of the first information layer 16 formed on the substrate 24 and the second information layer 23 formed on the substrate 28, which are glued to each other via the adhesive layer 25.

The substrate 28 is a transparent disk-like substrate similar to the substrate 14. The substrate 28 can be made of a resin such as a polycarbonate, an amorphous polyolefin or PMMA, or a glass.

It is possible for a guide groove for guiding a laser beam to be formed on the surface of the substrate 28 at the second reflection film 208 side, if necessary. The surface of the substrate 28 at the opposite side of the second reflection film 208 is preferably smooth. As a material of the substrate 28, a polycarbonate is especially useful because it has excellent transfer and mass production properties and is inexpensive. Furthermore, the thickness of the substrate 28 is preferably within the range of 0.3–0.9 mm so that sufficient strength is secured, and the thickness of the information recording medium 29 will be approximately 1.2 mm.

A description of the portions denoted by the same reference numerals as the second embodiment and the third embodiment will be omitted.

The information recording medium 29 can be produced by the method described below.

First, the first information layer 16 is formed on the substrate 24 (that has a thickness of 0.6 mm, for example). If a guide groove for guiding the laser beam 11 is formed on the substrate 24, the first information layer 16 is formed at the side on which the guide groove is formed. More specifically, the substrate 24 is placed in the film forming apparatus, and the first incident side dielectric film 102, the first incident side interface film 103, the first recording film 104, the first counterincident side interface film 105, the first reflection film 108 and the transmittance adjustment film 109 are formed in this order. Each of the layers is formed in the same way as the first embodiment.

Furthermore, after forming the transmittance adjustment film 109, it is possible to perform an initialization step for crystallizing the entire surface of the first recording film 104, if necessary. The crystallization of the first recording film 104 can be performed by irradiating a laser beam thereon.

In addition, the second information layer 23 is formed on the substrate 28 (that has a thickness of 0.6 mm, for example). If a guide groove for guiding the laser beam 11 is formed on the substrate 28, the second information layer 23 is formed at the side on which the guide groove is formed. More specifically, the substrate 28 is placed in the film forming apparatus, and the second reflection film 208, the interface film 207, the second counterincident side dielectric film 206, the second counterincident side interface film 205, the second recording film 204, the second incident side interface film 203 and the second incident side dielectric film 202 are formed in this order. Each of the layers is formed in the same way as the second embodiment.

Furthermore, after forming the second incident side dielectric film 202, it is possible to perform an initialization step for crystallizing the entire surface of the second recording film 204, if necessary. The crystallization of the second recording film 204 can be performed by irradiating a laser beam thereon.

Finally, the substrate 24 on which the first information layer 16 is formed and the substrate 28 on which the second information layer 23 is formed are bonded to each other by using an adhesive layer 25. More specifically, a resin such as a photo-curing resin (particularly an ultraviolet curing resin) or a delayed action resin is applied to the first information layer 16 or to the second information layer 23, and the substrate 24 is contacted closely with the substrate 28 for spin coating. After that, the resin is hardened. In addition, it is also possible to uniformly apply an adhesive resin onto the first information layer 16 or onto the second information layer 23 in advance and to make the substrate 24 and the substrate 28 contact with each other.

After that, it is possible to perform an initialization step for crystallizing the entire surface of the second recording film 204 and the first recording film 104, if necessary. In this case, it is preferable that the second recording film 204 be crystallized first for the same reason as the second embodiment.

Embodiment 5

In a fifth embodiment of the present invention, a method for recording and reproducing information using the information recording medium described in the first through fourth embodiments of the present invention will be described below.

Figure 5:
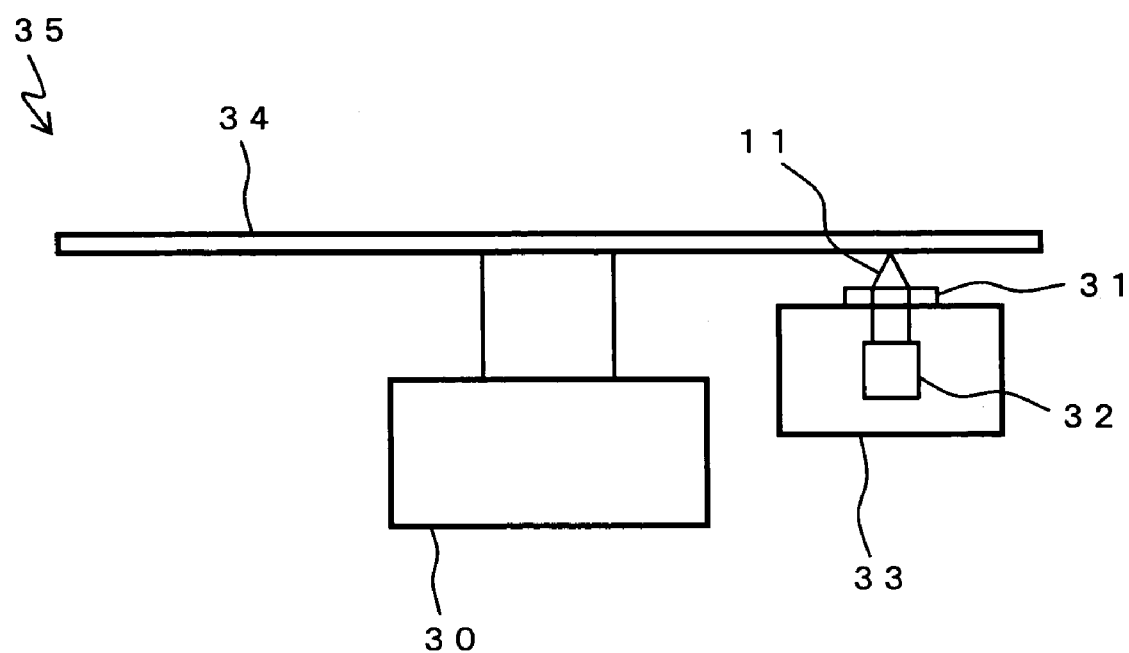
FIG. 5 is a schematic diagram for describing a portion of the configuration of a recording and reproducing apparatus that is used for recording and reproducing information using the information recording medium according to the present invention.

A partial structure of a recording and reproducing apparatus 35 that is used for the method for recording and reproducing information according to the present invention is shown schematically in FIG. 5. As shown in FIG. 5, the recording and reproducing apparatus 35 includes a spindle motor 30 for rotating an information recording medium 34, a semiconductor laser 32, and an optical head 33 having an objective lens 31 for focusing the laser beam 11 that is emitted by the semiconductor laser 32. The information recording medium 34 is an information recording medium described in the first through fourth embodiments and includes a plurality of information layers (e.g., the first information layer 16 and the second information layer 23). The objective lens 31 focuses the laser beam 11 onto the information layer.

Recording, erasing and overwriting of information on the information recording medium can be performed by modulating the power of the laser beam 11 between a high power, i.e., a peak power ($P_p$ (mW)) and a low power, i.e., a bias power ($P_b$ (mW)). When irradiating at the peak power of laser beam 11, the amorphous phase is formed at a portion of the recording layer locally, and the amorphous phase becomes a recording mark. The bias power of laser beam 11 is irradiated between recording marks, so that the crystalline phase (an erased portion) is formed. Furthermore, the peak power of laser beam 11 is usually irradiated as a pulse train, which is called a multipulse. Furthermore, the multipulse can be modulated only by the power levels including the peak power and the bias power or can be modulated by a power level within the range of 0 mW through the peak power.

In addition, a reproducing power ($P_r$ (mW)) is defined as a power that is lower than power level of the peak power and the bias power. The optical state of a recording mark is not affected by the irradiation of the laser beam 11 thereon at that power level, and sufficient quantity of reflected light for reproducing the recording mark can be obtained from the information recording medium. A signal from the information recording medium obtained by irradiating the same at the reproducing power of laser beam 11 is read by a detector, so that an information signal is reproduced.

The numerical aperture NA of the objective lens 31 is preferably within the range of 0.5–1.1 (more preferably, within the range of 0.6–0.9), so that a spot diameter of the laser beam is adjusted within the range of 0.4–0.7 μm. A wavelength of the laser beam 11 is preferably 450 nm or less (more preferably, within the range of 350–450 nm). A linear speed of the information recording medium when recording information is preferably within the range of 1–20 meters/second (more preferably, within the range of 2–15 meters/second), so that little crystallization due to the reproducing light is generated and a sufficient erasing ratio can be obtained.

When recording information on the first information layer 16 in the information recording medium 22 and the information recording medium 29 having two information layers, the focal point of the laser beam 11 is adjusted on the first recording film 104, so that the laser beam 11 that passed through the transparent layer 13 is used for recording information on the first recording film 104. For reproducing, the laser beam 11 that is used is that which passed through the transparent layer 13 after being reflected by the first recording film 104. When recording information on the second information layer 23, the focal point of the laser beam 11 is adjusted on the second recording film 204, so as to use the laser beam 11 that passed through the transparent layer 13, the first information layer 16 and the optical separation layer 17 for recording information. For reproducing, the laser beam 11 that is used is that which passed through the optical separation layer 17, the first information layer 16 and the transparent layer 13 after being reflected by the second recording film 204.

Furthermore, if a guide groove for guiding the laser beam 11 is formed on the substrate 14, the optical separation layers 20, 19 and 17, information may be recorded on the groove surface that is closer to the incident side of the laser beam 11 (i.e., the groove) or on the groove surface that is farther therefrom (i.e., the land). In addition, it is possible to record information on both the groove and the land.

The recording property was evaluated by modulating the power of the laser beam 11 between zero and $P_p$ (mW), recording random signals having mark lengths between 0.149 μm (2T) and 0.596 μm (8T) by the (1∫7) modulation method, and measuring jitter between the front ends as well as between rear ends using a time interval analyzer.

In addition, the erasing properties were measured by modulating the power of the laser beam 11 between zero and $P_p$ (mW), recording signals having mark lengths 0.149 μm (2T) and 0.671 μm (9T) on the same groove continuously and alternately, and using a spectrum analyzer for measuring the attenuation factor (hereinafter referred to as an erasing ratio) of the amplitude of the 9T signal when the 9T signal is rewritten by the 2T signal. Furthermore, the erasing ratio will be a negative value, and it is preferable that the absolute value thereof is larger. More specifically, it is preferably −25 dB or less.

Moreover, the number of rewriting times was evaluated by modulating the power of the laser beam 11 between zero and $P_p$ (mW), recording random signals having mark lengths between 0.149 μm (2T) and 0.596 μm (8T) on the same groove continuously, and measuring jitter between the front ends as well as between rear ends in each rewriting using a time interval analyzer. The maximum value of the number of rewritings was defined as the number of rewritings when the jitter value increased by 3% from the average jitter value of the jitter value between the front ends and the jitter value between rear ends in the first measurement. Furthermore, the power values $P_p$ and $P_b$ were determined so that the average jitter value is the minimum value.

The archival capabilities and the archival rewrite capabilities were measured as follows. First, the power of the laser beam 11 was modulated between zero and $P_p$ (mW), random signals having mark lengths within the range from 0.149 μm (2T) to 0.596 μm (8T) were continuously recorded on the same groove, and jitter between the front ends and between rear ends of a signal rewritten 10 times was measured by using a time interval analyzer. After that, the sample on which the signal was recorded was left to stand in a constant temperature and humidity chamber at a temperature of 90° C. and 20% relative humidity for 100 hours, the jitter between the front ends and between the rear ends of the signal recorded before exposure was measured, and the result thereof was compared with the pre-exposure jitter values in order to evaluate the archival capabilities. In addition, the archival rewrite capabilities were evaluated by measuring jitter between the front ends and between the rear ends of a signal rewritten once after exposure for 100 hours, and comparing the result with the jitter value before exposure.

Embodiment 6

Figure 6:
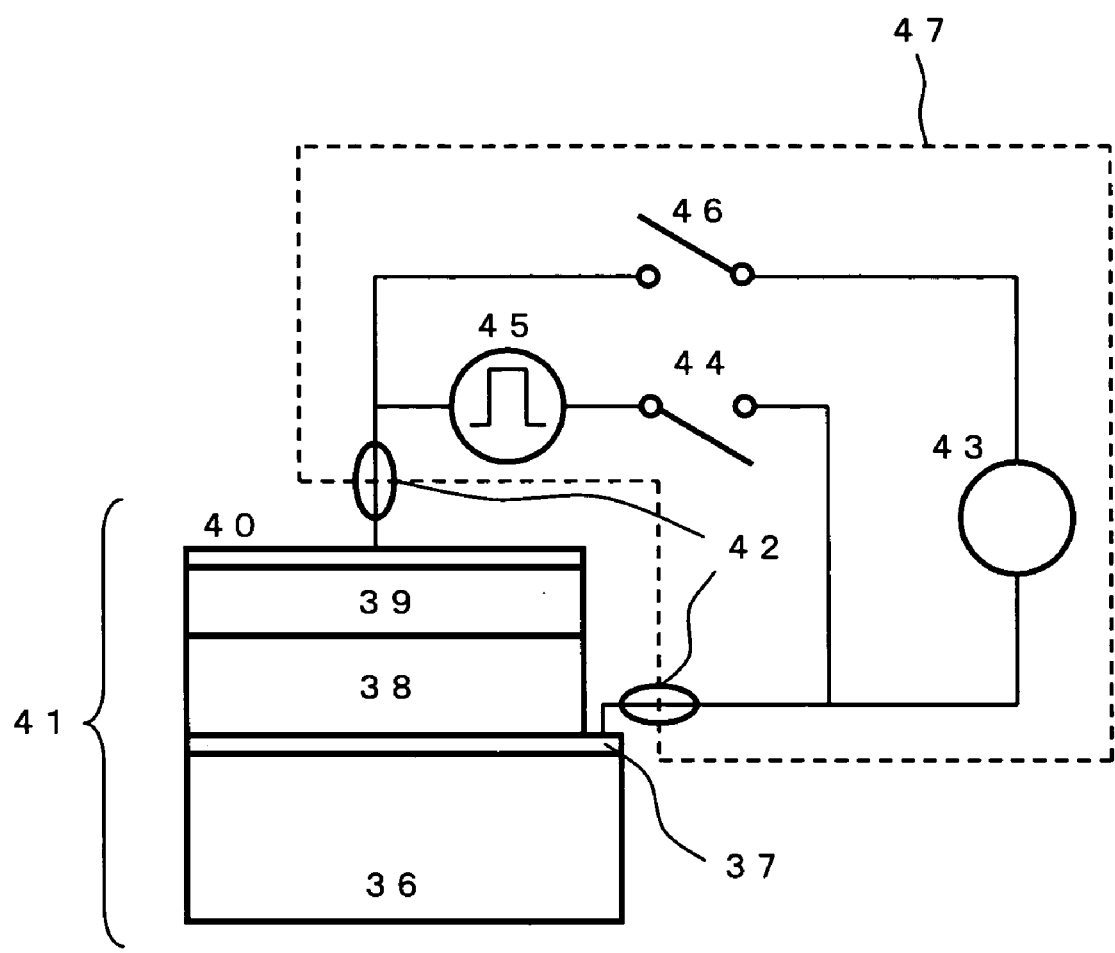
FIG. 6 is a schematic diagram showing a portion of the configuration of the information recording medium and an electrical information recording and reproducing apparatus according to the present invention.

A sixth embodiment of the information recording medium according to the present invention will be described below. An example of the structure of an electrical information recording medium 41 according to the sixth embodiment is shown in FIG. 6. The electrical information recording medium 41 is an information recording medium on which information can be recorded and reproduced by applying electric current.

As a material of the substrate 36, a resin substrate such as a polycarbonate, a glass substrate, a ceramic substrate such as $Al_2O_3$, a semiconductor substrate such as Si or a metal substrate such as Cu can be used. Here, the case where Si substrate is used will be described. The electrical information recording medium 41 has a structure in which a lower electrode 37, a first recording layer 38, a second recording layer 39 and an upper electrode 40 are formed in this order on the substrate 36. The lower electrode 37 and the upper electrode 40 are formed for applying electric current to the first recording layer 38 and the second recording layer 39.

The first recording layer 38 and the second recording layer 39 are made of a material that generates a reversible phase change between the crystalline phase and the amorphous phase by Joule heat that is generated by applying electric current. The phenomenon of changing resistivity between the crystalline phase and the amorphous phase is utilized for recording information. The first recording layer 38 can be made of the same material as the first recording film 104 of the first embodiment, and the second recording layer 39 can be made of the same material as the second recording film 204 of the second embodiment.

The first recording layer 38 and the second recording layer 39 can be formed by a method similar to the first recording film 104 of the first embodiment and to the second recording film 204 of the second embodiment, respectively.

In addition, the lower electrode 37 and the upper electrode 40 can be made of a single metal element such as Al, Au, Ag, Cu or Pt, or an alloy material containing one or more elements mentioned above as principal components and additional one or more elements if necessary for improving the resistance to humidity or for adjusting the thermal conductivity thereof. The lower electrode 37 and the upper electrode 40 can be formed by sputtering a metal parent material or an alloy parent material in an atmosphere of Ar gas.

The electrical information recording medium 41 is connected electrically to the electrical information recording and reproducing apparatus 47 via an applying portion 42. By this electrical information recording and reproducing apparatus 47, a pulse power source 45 is connected between the lower electrode 37 and the upper electrode 40 via a switch 44 so as to apply a current pulse to the first recording layer 38 and the second recording layer 39. In addition, in order to detect a change of resistance value due to the phase change of the first recording layer 38 and the second recording layer 39, a resistance measuring instrument 43 is connected between the lower electrode 37 and the upper electrode 40 via a switch 46. In order to change the amorphous phase (a high resistance state) of the first recording layer 38 or the second recording layer 39 to the crystalline phase (a low resistance state), the switch 44 is closed (while the switch 46 is opened) so as to apply the current pulse between the electrodes 37, 40. Thus, the temperature at the portion to which the current pulse is applied will become higher than the crystallization temperature of the material and lower than the melting point thereof and is maintained for the crystallization period. For getting the crystalline phase back to the amorphous phase again, a current pulse relatively higher than during crystallization is applied in a shorter period, so that the recording layer reaches a higher temperature than the melting point thereof and then is cooled rapidly. Furthermore, the pulse power source 45 of the electrical information recording and reproducing apparatus 47 is a power source that can deliver recording and erasing pulse waveforms as shown in FIG. 9.

Here, a resistance value when the first recording layer 38 is in the amorphous phase is denoted by $r_{a1}$, a resistance value when the first recording layer 38 is in the crystalline phase is denoted by $r_{c1}$, a resistance value when the second recording layer 39 is in the amorphous phase is denoted by $r_{a2}$, and a resistance value when the second recording layer 39 is in the crystalline phase is denoted by $r_{c2}$. Here, if $r_{c1} \leq r_{c2} \leq r_{a1} \leq r_{a2}$ or $r_{c1} \leq r_{c2} \leq r_{a2} \leq r_{a1}$ or $r_{c2} \leq r_{c1} \leq r_{a1} \leq r_{a2}$ or $r_{c2} \leq r_{c1} \leq r_{a2} \leq r_{a1}$, the total sum of the resistance values of the first recording layer 38 and the second recording layer 39 can be set to four different values that include $r_{a1}+r_{a2}$, $r_{a1}+r_{c2}$, $r_{a2}+r_{c1}$ and $r_{c1}+r_{c2}$. Accordingly, four different states, i.e., binary information, can be detected at one time by measuring the resistance value between the electrodes by the resistance measuring instrument 43.

Figure 7:
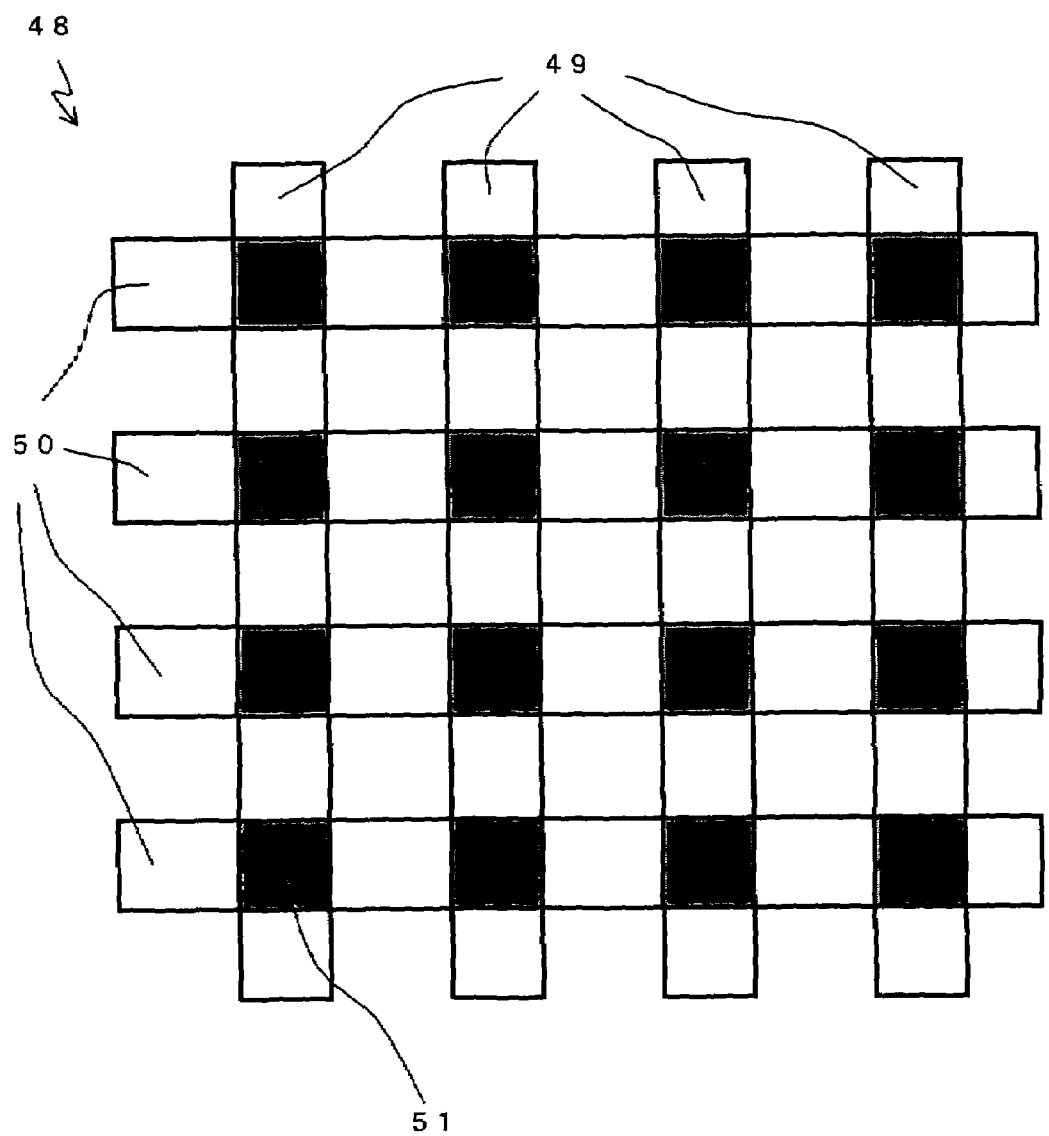
FIG. 7 is a schematic diagram showing a portion of the configuration of a large capacity electrical information recording medium according to the present invention.

When arranging a plurality of the electrical information recording media 41 in a matrix, a large capacity electrical information recording medium 48 can be structured as shown in FIG. 7. Each of the memory cells 51 has a micro area in which the same structure as the electrical information recording medium 41 is formed. Information can be recorded on and reproduced from each memory cell 51 by selecting one word line 49 and one bit line 50.

Figure 8:
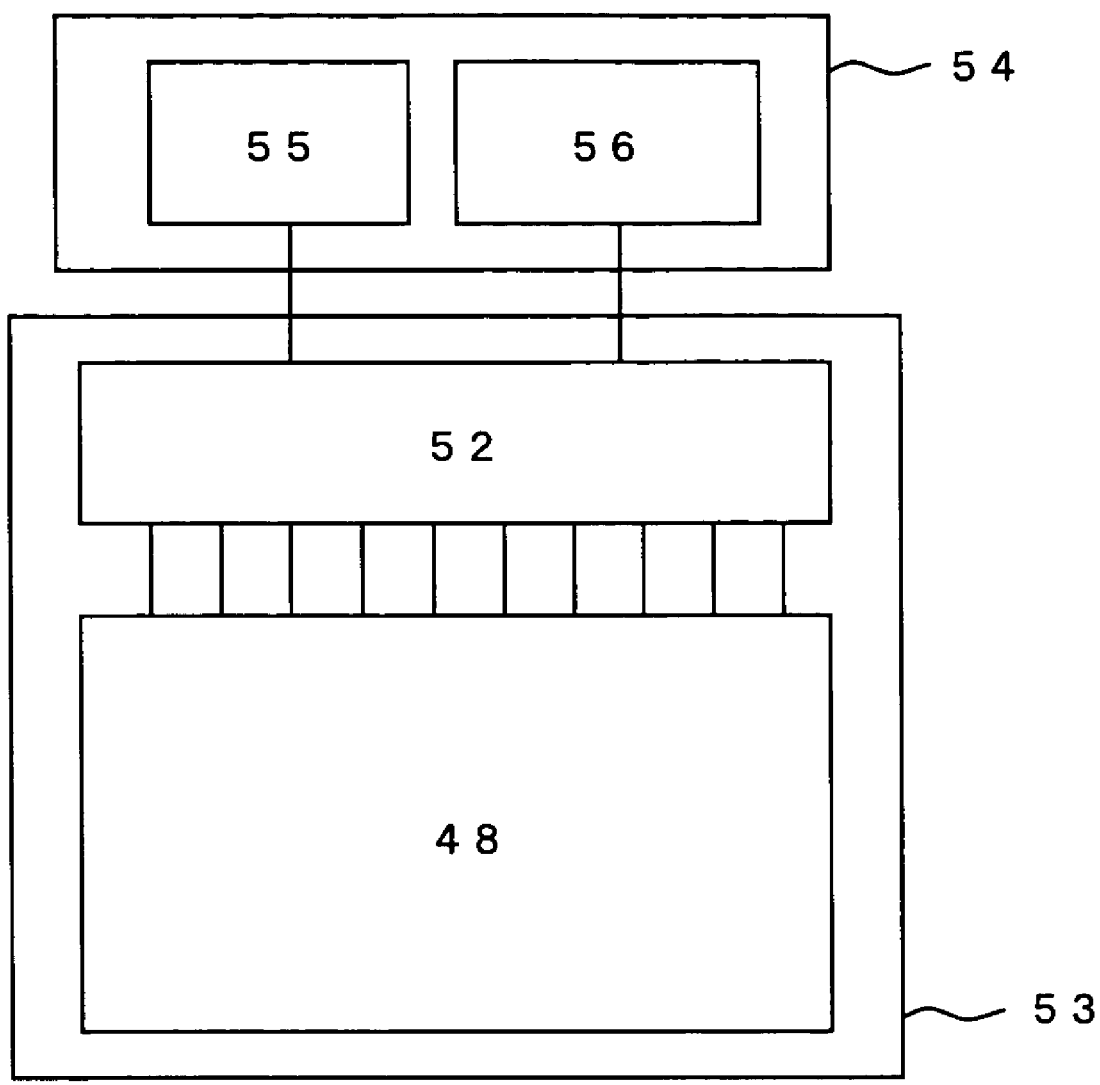
FIG. 8 is a schematic diagram showing a portion of the configuration of the electrical information recording medium and a recording and reproducing system thereof according to the present invention.
Figure 10:
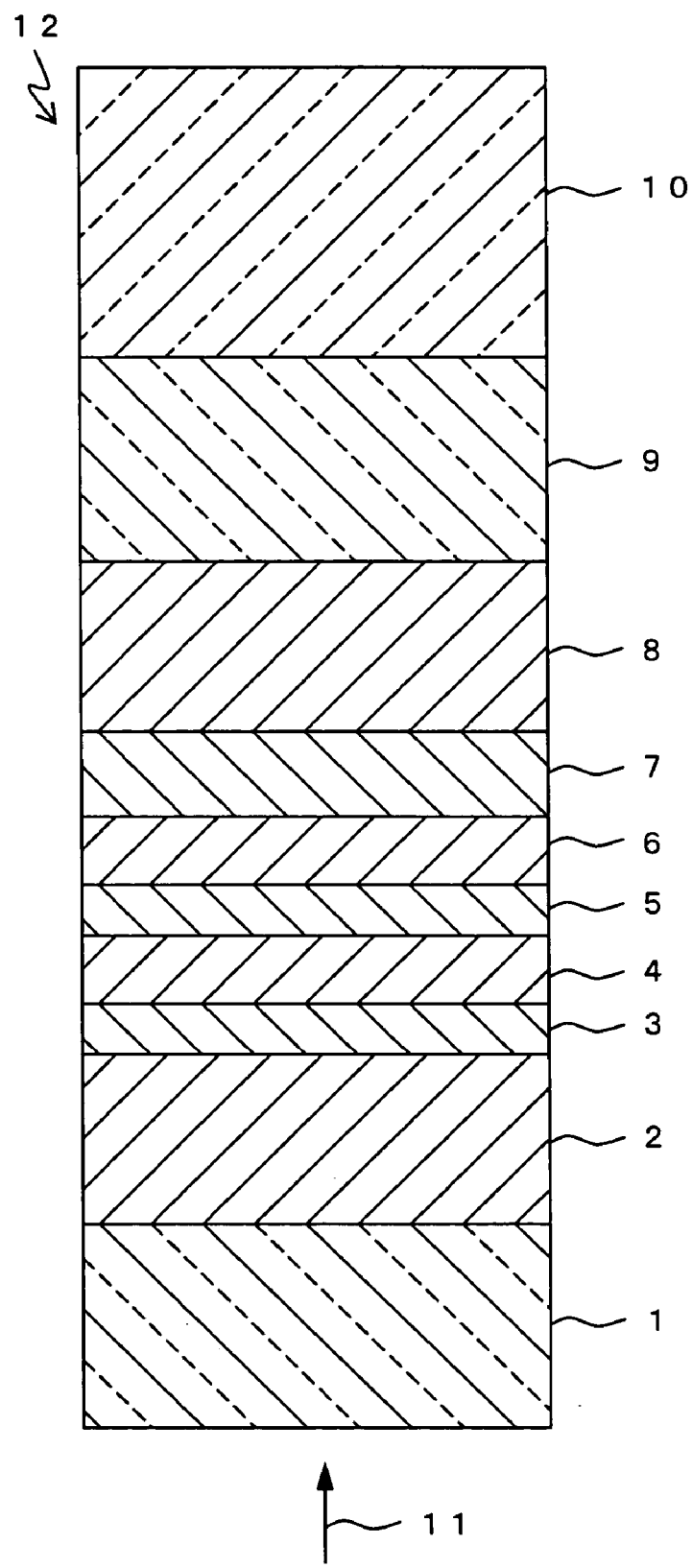
FIG. 10 is a cross-sectional view showing an example of the layer structure of a 4.7 GB/DVD-RAM.

FIG. 8 shows an example of a structure of an information recording system that uses the electrical information recording medium 48. A storage device 53 includes the electrical information recording medium 48 and an address designation circuit 52. By the address designation circuit 52, each of the word lines 49 and the bit lines 50 of the electrical information recording medium 48 is designated, so that information can be recorded on and reproduced from each memory cell 51. In addition, the storage device 53 is connected electrically to an external circuit 54 that includes at least a pulse power source 55 and a resistance measuring instrument 56, so that information can be recorded on and reproduced from the electrical information recording medium 48.

Hereinafter, the present invention will be described more in detail using examples.

EXAMPLE 1

As a first example, the information recording medium 22 shown in FIG. 2 was produced, and relationships between materials of the first recording film 104 and the archival capabilities as well as the archival rewrite capabilities of the first information layer 16 were checked. More specifically, samples of the information recording medium 22 were made, which includes the first information layer 16 having different materials of the first recording film 104. Then, the archival capabilities and the archival rewrite capabilities of the first information layer 16 were measured.

The samples were made by the steps described below. First, as the substrate 14, a polycarbonate substrate (having a diameter of 120 mm and a thickness of 1.1 mm) was prepared, on which a guide groove (having a depth of 20 nm and a track pitch of 0.32 µm) for guiding the laser beam 11 was formed. Then, the following layers are formed sequentially on the polycarbonate substrate by the sputtering method. The layers include an Ag—Pd—Cu layer (having a thickness of 80 nm) as the second reflection film 208, an Al layer (having a thickness of 10 nm) as the interface film 207, a ZnS—SiO$_2$ layer (having a thickness of 22 nm and SiO$_2$ at 20 mol %) as the second counterincident side dielectric film 206, a $(SiO_2)_{20}(Cr_2O_3)_{30}(ZrO_2)_{50}$ (mol %) layer (having a thickness of 5 nm) as the second counterincident side interface film 205, a $Ge_{22}BiSbTe_{25}$ layer (having a thickness of 10 nm) as the second recording film 204, a $(SiO_2)_{35}(Cr_2O_3)_{30}(ZrO_2)_{35}$ (mol %) layer (having a thickness of 5 nm) as the second incident side interface film 203, and a ZnS—SiO$_2$ layer (having a thickness of 60 nm and SiO$_2$ at 20 mol %) as the second incident side dielectric film 202.

Next, an ultraviolet curing resin is applied onto the second incident side dielectric film 202, on which a substrate with a guide groove having a depth of 20 nm and a track pitch of 0.32 µm is placed and contacted closely therewith. Then, the substrate is rotated so that a uniform resin layer is formed. After curing the resin, the substrate is removed. According to this process, an optical separation layer 17 was made which has a thickness of 25 µm and a guide groove for guiding the laser beam 11 formed at the first information layer 16 side.

After that, the following layers are formed sequentially on the optical separation layer 17 by the sputtering method. The layers include a TiO$_2$ layer (having a thickness of 20 nm) as the transmittance adjustment film 109, an Ag—Pd—Cu layer (having a thickness of 10 nm) as the first reflection film 108, a $(SiO_2)_{20}(Cr_2O_3)_{30}(ZrO_2)_{50}$ (mol %) layer (having a thickness of 10 nm) as the first counterincident side interface film 105, the first recording film 104 (having a thickness of 6 nm), a $(SiO_2)_{35}(Cr_2O_3)_{30}(ZrO_2)_{35}$ (mol %) layer (having a thickness of 5 nm) as the first incident side interface film 103, a ZnS—SiO$_2$ layer (having a thickness of 40 nm and SiO$_2$ at 20 mol %) as the first incident side dielectric film 102. Finally, an ultraviolet curing resin is applied onto the first incident side dielectric film 102, and a polycarbonate sheet (having a diameter of 120 mm and a thickness of 65 µm) is contacted with the first incident side dielectric film 102, which is then rotated so as to form a uniform resin layer. After that, ultraviolet rays are irradiated thereon for curing the resin, so that the transparent layer 13 having a thickness of 75 µm was made. After that, an initialization step was performed in which the second recording film 204 and the first recording film 104 were crystallized by a laser beam. In this way, plural samples having different materials for the first recording film 104 were produced.

Regarding these obtained samples, the archival capabilities and the archival rewrite capabilities of the first information layer 16 of the information recording medium 22 were measured by using the recording and reproducing apparatus 35 shown in FIG. 5. On this occasion, the wavelength of the laser beam 11 was set to 405 nm, the numerical aperture NA of the objective lens 31 was set to 0.85, the linear speed of the sample during the measurement was set to 4.9 meters/second, 9.8 meters/second, and 19.7 meters/second, and the shortest mark length was set to 0.149 µm. In addition, information was recorded on the groove surface.

The evaluation results of the archival capabilities and the archival rewrite capabilities of the first information layer 16 with respect to the materials of the first recording film 104 of the first information layer 16 of the information recording medium 22 are shown in Table 1. In Table 1, 1X refers to a linear speed of 4.9 meters/second, 2X refers to a linear speed of 9.8 meters/second, and 4X refers to a linear speed of 19.7 meters/second. Furthermore, the archival capabilities and the archival rewrite capabilities are represented by 'A' if the difference between the jitter value before exposure and the jitter value after exposure is less than 1%, by 'B' if the difference is equal to or more than 1% and less than 2%, 'C' if the difference is equal to or more than 2% and less than 3%, and 'D' if the difference is equal to or more than 3%.

TABLE 1

| Medium number | First recording layer film | Archival capabilities | | Archival rewrite capabilities | |
|---|---|---|---|---|---|
| | | 1X | 2X | 2X | 4X |
| 1-a | Bi$_2$Te$_3$ | D | C | B | B |
| 1-b | GeTe | B | B | D | D |
| 1-c | Ge$_{22}$Bi$_2$Te$_{25}$ | B | B | B | B |
| 1-d | Ge$_{22}$Sb$_2$Te$_{25}$ | B | B | C | D |
| 1-e | Ge$_{22}$BiSbTe$_{25}$ | A | B | B | C |
| 1-f | Ge$_{19}$Sn$_3$Bi$_2$Te$_{25}$ | B | B | B | B |

As a result, good characteristics were obtained in which the difference between the jitter value before exposure and the jitter value after exposure is less than 3% with respect to all of the archival capabilities in 1X, the archival capabilities and the archival rewrite capabilities in 2X, and the archival rewrite capabilities in 4X for the sample 1-c in which the first recording film 104 contains Ge, Te and Bi, and the sample 1-e in which the first recording film 104 contains Ge, Sb, Te and Bi. Furthermore, the sputtering target that is used in the step for forming the first recording film 104 contained Bi at 0.5 atom % or more, while the first recording film 104 contained Bi at 1.0 atom % or more. Particularly, the sample 1-e had particularly good archival capabilities in 1X. In addition, the sample 1-a in which the first recording film 104 does not contain Ge had insufficient archival capabilities in 1X. Moreover, the samples 1-b and 1-d in which the first recording film 104 does not contain Bi had insufficient archival rewrite capabilities in 4X.

From the results described above, it was found to be preferable that the material of the first recording film 104 contain Ge, Te and Bi or contain Ge, Sb, Te and Bi.

Furthermore, good characteristics were also obtained with respect to all of the archival capabilities in 1X, the archival capabilities and the archival rewrite capabilities in 2X, and the archival rewrite capabilities in 4X for the sample 1-f in which the first recording film 104 contains Ge, Sn, Te and Bi.

EXAMPLE 2

As a second example, the information recording medium 22 shown in FIG. 2 was produced, and relationships between materials of the second recording film 204 and the archival capabilities as well as the archival rewrite capabilities of the second information layer 23 were checked. More specifically, samples of the information recording medium 22 were made, which includes the second information layer 23 having different materials of the second recording film 204. Then, the archival capabilities and the archival rewrite capabilities of the second information layer 23 were measured.

The samples were made by the steps below. First, as the substrate 14, a polycarbonate substrate (having a diameter of 120 mm and a thickness of 1.1 mm) was prepared, on which a guide groove (having a depth of 20 nm and a track pitch of 0.32 µm) for guiding the laser beam 11 was formed. Then, following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—SiO$_2$ layer (having a thickness of 22 nm and SiO$_2$ at 20 mol %), the second counterincident side interface film 205 that is a (SiO$_2$)$_{20}$(Cr$_2$O$_3$)$_{30}$(ZrO$_2$)$_{50}$ (mol %) layer (having a thickness of 5 nm), the second recording film 204 (having a thickness of 10 nm), the second incident side interface film 203 that is a (SiO$_2$)$_{35}$ (Cr$_2$O$_3$)$_{30}$ (ZrO$_2$)$_{35}$ (mol %) layer (having a thickness of 5 nm), and the second incident side dielectric film 202 that is a ZnS—SiO$_2$ layer (having a thickness of 60 nm and SiO$_2$ at 20 mol %).

Next, an ultraviolet curing resin is applied onto the second incident side dielectric film 202, on which a substrate with a guide groove (having a depth of 20 nm and a track pitch of 0.32 µm) being formed is placed to be contacted closely. Then, the substrate is rotated so that a uniform resin layer is formed. After curing the resin, the substrate is removed. According to this process, a optical separation layer 17 was made which has a thickness of 25 µm and a guide groove for guiding the laser beam 11 formed at the first information layer 16 side.

After that, following layers are formed sequentially on the optical separation layer 17 by the sputtering method. The layers include the transmittance adjustment film 109 that is a TiO$_2$ layer (having a thickness of 20 nm), the first reflection film 108 that is a Ag—Pd—Cu layer (having a thickness of 10 nm), the first counterincident side interface film 105 that is a (SiO$_2$)$_{20}$(Cr$_2$O$_3$)$_{30}$(ZrO$_2$)$_{50}$ (mol %) layer (having a thickness of 10 nm), the first recording film 104 that is a Ge$_{22}$Bi$_2$Te$_{25}$(having a thickness of 6 nm), the first incident side interface film 103 that is a (SiO$_2$)$_{35}$(Cr$_2$O$_3$)$_{30}$(ZrO$_2$)$_{35}$ (mol %) layer (having a thickness of 5 nm), and the first incident side dielectric film 102 that is a ZnS—SiO$_2$ layer (having a thickness of 40 nm and SiO$_2$ at 20 mol %). Finally, an ultraviolet curing resin is applied onto the first incident side dielectric film 102, and a polycarbonate sheet (having the diameter of 120 mm and a thickness of 65 µm) is contacted with the first incident side dielectric film 102, which is rotated so as to form a uniform resin layer. After that, ultraviolet rays are irradiated for curing the resin, so that the transparent layer 13 having a thickness of 75 µm was made. After that, the initialization step was performed in which the second recording film 204 and the first recording film 104 were crystallized by a laser beam. In this way, plural samples having different materials of the second recording film 204 were produced.

The archival capabilities and the archival rewrite capabilities of the second information layer 23 of the information recording medium 22 were measured by using the recording and reproducing apparatus 35 shown in FIG. 5. On this occasion, a wavelength of the laser beam 11 was set to 405 nm, a numerical aperture NA of the objective lens 31 was set to 0.85, a linear speed of the sample during the measurement was set to 4.9 meters/second, 9.8 meters/second, and 19.7 meters/second, and the shortest mark length was set to 0.149 µm. In addition, information was recorded on the groove surface.

The evaluation results of the archival capabilities and the archival rewrite capabilities of the second information layer 23 with respect to the materials of the second recording film 204 of the second information layer 23 of the information recording medium 22 are shown in Table 2. In Table 2, 1X refers to a linear speed of 4.9 meters/second, 2X refers to a linear speed of 9.8 meters/second, and 4X refers to a linear speed of 19.7 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 2

| Medium number | Second recording film material | Archival capabilities | | Archival rewrite capabilities | |
|---|---|---|---|---|---|
| | | 1X | 2X | 2X | 4X |
| 2-a | Sb$_{95}$V$_5$ | B | A | A | A |
| 2-b | Sb$_{95}$Mn$_5$ | B | A | A | A |
| 2-c | Sb$_{95}$Ga$_5$ | B | A | A | A |
| 2-d | Sb$_{95}$Ge$_5$ | A | A | A | A |
| 2-e | Sb$_{95}$Se$_5$ | B | A | A | A |
| 2-f | Sb$_{95}$Ag$_5$ | B | A | A | A |
| 2-g | Sb$_{95}$In$_5$ | B | A | A | A |
| 2-h | Sb$_{95}$Au$_5$ | B | A | A | A |
| 2-i | Sb$_{75}$Te$_{20}$Ge$_5$ | A | A | A | B |
| 2-j | Sb$_{75}$Te$_{21}$Ag$_2$In$_2$ | A | A | A | B |
| 2-k | Ge$_{45}$Bi$_2$Sb$_2$Te$_{51}$ | A | A | A | B |
| 2-l | Ge$_{40}$Sn$_5$Sb$_4$Te$_{51}$ | A | A | A | B |
| 2-m | Ge$_{40}$Pb$_5$Sb$_4$Te$_{51}$ | A | A | A | B |
| 2-n | Sb$_{95}$Si$_5$ | C | B | A | A |

As a result, good characteristics were obtained with respect to all of the archival capabilities in 1X, the archival capabilities and the archival rewrite capabilities in 2X, and the archival rewrite capabilities in 4X for the samples 2-a through 2-m in which the second recording film 204 contains Sb and at least one element M1 selected from a group consisting of V, Mn, Ga, Ge, Se, Ag, In, Sn, Te, Pb, Bi and Au. In addition, the sample 2-n in which the second recording film 204 does not contain M1 had insufficient archival capabilities in 1X.

From the results described above, it was found to be preferable that the material of the second recording film 204 contain Sb and M1.

EXAMPLE 3

As a third example, the information recording medium 22 shown in FIG. 2 was produced, and relationships between the materials of the first recording film 104, the erasing ratio, the number of times recording and rewriting has been performed thereon, the archival capabilities as well as the archival rewrite capabilities of the first information layer 16 were checked. More specifically, samples of the information recording medium 22 were made which includes first information layers 16 having different materials for the first recording film 104. Then, the erasing ratio, the number of times recording and rewriting has been performed thereon, the archival capabilities and the archival rewrite capabilities of the first information layer 16 were measured.

The samples were made by the steps described below. First, as the substrate 14, a polycarbonate substrate (having a diameter of 120 mm and a thickness of 1.1 mm) was prepared, on which a guide groove (having a depth of 20 nm and a track pitch of 0.32 μm) for guiding the laser beam 11 was formed. Then, the following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—SiO$_2$ layer (having a thickness of 22 nm and SiO$_2$ at 20 mol %), the second counterincident side interface film 205 that is a (SiO$_2$)$_{20}$(Cr$_2$O$_3$)$_{30}$(ZrO$_2$)$_{50}$ (mol %) layer (having a thickness of 5 nm), the second recording film 204 that is a Ge$_{22}$BiSbTe$_{25}$ layer (having a thickness of 10 nm), the second incident side interface film 203 that is a (SiO$_2$)$_{35}$(Cr$_2$O$_3$)$_{30}$(ZrO$_2$)$_{35}$ (mol %) layer (having a thickness of 5 nm), and the second incident side dielectric film 202 that is a ZnS—SiO$_2$ layer (having a thickness of 60 nm and SiO$_2$ at 20 mol %).

Next, an ultraviolet curing resin is applied onto the second incident side dielectric film 202, on which a substrate with a guide groove having a depth of 20 nm and a track pitch of 0.32 μm is placed to be contacted closely. Then, the substrate is rotated so that a uniform resin layer is formed. After curing the resin, the substrate is removed. According to this process, the optical separation layer 17 was made, which has a thickness of 25 μm and a guide groove for guiding the laser beam 11 formed at the first information layer 16 side.

After that, following layers are formed sequentially on the optical separation layer 17 by the sputtering method. The layers include the transmittance adjustment film 109 that is a TiO$_2$ layer (having a thickness of 20 nm), the first reflection film 108 that is a Ag—Pd—Cu layer (having a thickness of 10 nm), the first counterincident side interface film 105 that is a (SiO$_2$)$_{20}$(Cr$_2$O$_3$)$_{30}$(ZrO$_2$)$_{50}$ (mol %) layer (having a thickness of 10 nm), the first recording film 104 (having a thickness of 6 nm), the first incident side interface film 103 that is a (SiO$_2$)$_{35}$(Cr$_2$O$_3$)$_{30}$(ZrO$_2$)$_{35}$ (mol %) layer (having a thickness of 5 nm), and the first incident side dielectric film 102 that is a ZnS—SiO$_2$ layer (having a thickness of 40 nm and SiO$_2$ at 20 mol %). Finally, an ultraviolet curing resin is applied onto the first incident side dielectric film 102, and a polycarbonate sheet (having a diameter of 120 mm and a thickness of 65 μm) is contacted with the first incident side dielectric film 102, which is rotated so as to form a uniform resin layer. After that, ultraviolet rays are irradiated for curing the resin, so that the transparent layer 13 having a thickness of 75 μm was made. After that, the initialization step was performed in which the second recording film 204 and the first recording film 104 were crystallized by a laser beam. In this way, plural samples having different materials for the first recording film 104 were produced.

Regarding these obtained samples, the erasing ratio, the number of times recording and rewriting was performed, the archival capabilities and the archival rewrite capabilities of the first information layer 16 of the information recording medium 22 were measured by using the recording and reproducing apparatus 35 shown in FIG. 5. On this occasion, the wavelength of the laser beam 11 was set to 405 nm, the numerical aperture NA of the objective lens 31 was set to 0.85, the linear speed of the sample during the measurement was set to 4.9 meters/second and 9.8 meters/second, and the shortest mark length was set to 0.149 μm. In addition, information was recorded on the groove surface.

Table 3 shows the evaluation results of the erasing ratio, the number of times recording and rewriting was performed, the archival capabilities and the archival rewrite capabilities of the first information layer 16 with respect to the materials of the first recording film 104 of the first information layer 16 of the information recording medium 22 when the linear speed is 4.9 meters/second, and Table 4 shows the evaluation results when the linear speed is 9.8 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 3

| Medium number | First recording filmr material | Erasing ratio (dB) | Repeated rewriting capability (number of times) | Archival capability | Archival rewrite capability |
|---|---|---|---|---|---|
| 3-a | Bi$_2$Te$_3$ | −40 | 10000 | C | A |
| 3-b | GeBi$_2$Te$_4$ | −35 | 10000 | A | A |
| 3-c | Ge$_2$Bi$_2$Te$_5$ | −35 | 10000 | A | A |
| 3-d | Ge$_4$Bi$_2$Te$_7$ | −35 | 10000 | A | A |
| 3-e | Ge$_8$Bi$_2$Te$_{11}$ | −35 | 10000 | A | A |
| 3-f | Ge$_{22}$Bi$_2$Te$_{25}$ | −35 | 10000 | A | A |
| 3-g | Ge$_{31}$Bi$_2$Te$_{34}$ | −30 | 10000 | A | A |
| 3-h | Ge$_{40}$Bi$_2$Te$_{43}$ | −30 | 8000 | A | A |
| 3-i | Ge$_{50}$Bi$_2$Te$_{53}$ | −30 | 7000 | A | A |
| 3-j | Ge$_{60}$Bi$_2$Te$_{63}$ | −30 | 5000 | A | A |
| 3-k | Ge$_{80}$Bi$_2$Te$_{83}$ | −25 | 3000 | A | A |
| 3-l | GeTe | −20 | 1000 | A | A |
| 3-m | GeBiTe$_4$ | −40 | 10000 | B | A |
| 3-n | GeBi$_{1.5}$Te$_4$ | −35 | 10000 | A | A |
| 3-o | Ge$_{60}$Bi$_3$Te$_{63}$ | −30 | 5000 | A | A |
| 3-p | Ge$_{60}$Bi$_5$Te$_{63}$ | −35 | 5000 | A | A |
| 3-q | Ge$_{60}$Bi$_7$Te$_{63}$ | −35 | 5000 | A | A |
| 3-r | Ge$_{60}$Bi$_8$Te$_{63}$ | −40 | 5000 | B | A |

TABLE 4

| Medium number | First recording film material | Erasing ratio (dB) | Repeated rewriting capability (number of times) | Archival capability | Archival rewrite capability |
|---|---|---|---|---|---|
| 3-a | $Bi_2Te_3$ | −35 | 10000 | A | A |
| 3-b | $GeBi_2Te_4$ | −30 | 10000 | A | A |
| 3-c | $Ge_2Bi_2Te_5$ | −30 | 10000 | A | A |
| 3-d | $Ge_4Bi_2Te_7$ | −30 | 10000 | A | A |
| 3-e | $Ge_8Bi_2Te_{11}$ | −30 | 10000 | A | A |
| 3-f | $Ge_{22}Bi_2Te_{25}$ | −30 | 10000 | A | A |
| 3-g | $Ge_{31}Bi_2Te_{34}$ | −25 | 10000 | A | A |
| 3-h | $Ge_{40}Bi_2Te_{43}$ | −25 | 10000 | A | A |
| 3-i | $Ge_{50}Bi_2Te_{53}$ | −25 | 8000 | A | A |
| 3-j | $Ge_{60}Bi_2Te_{63}$ | −25 | 7000 | A | A |
| 3-k | $Ge_{80}Bi_2Te_{83}$ | −20 | 5000 | A | B |
| 3-l | GeTe | −15 | 3000 | A | C |
| 3-m | $GeBiTe_4$ | −35 | 10000 | A | A |
| 3-n | $GeBi_{1.5}Te_4$ | −30 | 10000 | A | A |
| 3-o | $Ge_{60}Bi_3Te_{63}$ | −25 | 7000 | A | A |
| 3-p | $Ge_{60}Bi_5Te_{63}$ | −30 | 7000 | A | A |
| 3-q | $Ge_{60}Bi_7Te_{63}$ | −30 | 7000 | A | A |
| 3-r | $Ge_{60}Bi_8Te_{63}$ | −35 | 7000 | A | A |

As a result, good characteristics were obtained for the erasing ratio, the repeated rewriting capabilities, the archival capabilities and the archival rewrite capabilities for samples 3-b through 3-j and 3-n through 3-q, in which the first recording film 104 is expressed by the composition formula $Ge_aBi_bTe_{3+a}$, where a and b satisfy the inequalities $0<a\leq 60$ and $1.5\leq b\leq 7$, and during both a low transmission rate in which the linear speed is 4.9 meters/second and a high transmission rate in which the linear speed is 9.8 meters/second. In addition, the samples 3-a, 3-m and 3-r were found to have slightly insufficient archival capabilities at the low transmission rate since the crystallization speed in the first recording film 104 was too fast. Moreover, the samples 3-k and 3-l were found to have slightly insufficient erasing ratios and archival rewrite capabilities at the high transmission rate since the crystallization speed in the first recording film 104 was too slow.

From the results described above, it was found to be preferable that a and b satisfy the inequalities $0<a\leq 60$ and $1.5\leq b\leq 7$ when a material of the first recording film 104 is expressed by the composition formula $Ge_aBi_bTe_{3+a}$.

EXAMPLE 4

As a fourth example, the information recording medium 22 shown in FIG. 2 was produced by the same method as the third example, and the relationships between materials of the first recording film 104, the erasing ratio, the archival capabilities as well as the archival rewrite capabilities of the first information layer 16 were checked.

Table 5 shows the evaluation results of the erasing ratio, the archival capabilities and the archival rewrite capabilities of the first information layer 16 with respect to the materials of the first recording film 104 of the first information layer 16 of the information recording medium 22 when the linear speed is 4.9 meters/second, and Table 6 shows the evaluation results when the linear speed is 9.8 meters/second. Furthermore, the archival capabilities and the archival rewrite capabilities are represented by 'A' if the difference between the jitter value before exposure and the jitter value after exposure is less than 2%, is represented by 'B' if the difference is equal to or more than 2% and less than 3%, and is represented by 'C' if the difference is equal to or more than 3%.

TABLE 5

| Medium number | First recording film material | Erasing ratio (dB) | Archival capability | Archival rewrite capability |
|---|---|---|---|---|
| 4-a | $Bi_2Te_3$ | −40 | C | A |
| 4-b | $Ge_{0.5}Sn_{0.5}Bi_2Te_4$ | −35 | A | A |
| 4-c | $Ge_{1.5}Sn_{0.5}Bi_2Te_5$ | −35 | A | A |
| 4-d | $Ge_3SnBi_2Te_7$ | −35 | A | A |
| 4-e | $Ge_7SnBi_2Te_{11}$ | −35 | A | A |
| 4-f | $Ge_{19.5}Sn_{2.5}Bi_2Te_{25}$ | −35 | A | A |
| 4-g | $Ge_{27.5}Sn_{3.5}Bi_2Te_{34}$ | −30 | A | A |
| 4-h | $Ge_{35}Sn_5Bi_2Te_{43}$ | −30 | A | A |
| 4-i | $Ge_{43}Sn_7Bi_2Te_{53}$ | −30 | A | A |
| 4-j | $Ge_{52.5}Sn_{7.5}Bi_2Te_{63}$ | −30 | A | A |
| 4-k | $Ge_{70}Sn_{10}Bi_2Te_{83}$ | −25 | A | A |
| 4-l | $Ge_{0.9}Sn_{0.1}Te$ | −20 | A | A |
| 4-m | $Ge_{0.5}Sn_{0.5}BiTe_4$ | −40 | B | A |
| 4-n | $Ge_{0.5}Sn_{0.5}Bi_{1.5}Te_4$ | −35 | A | A |
| 4-o | $Ge_{52.5}Sn_{7.5}Bi_3Te_{63}$ | −30 | A | A |
| 4-p | $Ge_{52.5}Sn_{7.5}Bi_5Te_{63}$ | −35 | A | A |
| 4-q | $Ge_{52.5}Sn_{7.5}Bi_7Te_{63}$ | −35 | A | A |
| 4-r | $Ge_{52.5}Sn_{7.5}Bi_8Te_{63}$ | −40 | B | A |

TABLE 6

| Medium number | First recording film material | Erasing ratio (dB) | Archival capability | Archival rewrite capability |
|---|---|---|---|---|
| 4-a | $Bi_2Te_3$ | −35 | A | A |
| 4-b | $Ge_{0.5}Sn_{0.5}Bi_2Te_4$ | −35 | A | A |
| 4-c | $Ge_{1.5}Sn_{0.5}Bi_2Te_5$ | −35 | A | A |
| 4-d | $Ge_3SnBi_2Te_7$ | −35 | A | A |
| 4-e | $Ge_7SnBi_2Te_{11}$ | −35 | A | A |
| 4-f | $Ge_{19.5}Sn_{2.5}Bi_2Te_{25}$ | −35 | A | A |
| 4-g | $Ge_{27.5}Sn_{3.5}Bi_2Te_{34}$ | −30 | A | A |
| 4-h | $Ge_{35}Sn_5Bi_2Te_{43}$ | −30 | A | A |
| 4-i | $Ge_{43}Sn_7Bi_2Te_{53}$ | −30 | A | A |
| 4-j | $Ge_{52.5}Sn_{7.5}Bi_2Te_{63}$ | −30 | A | A |
| 4-k | $Ge_{70}Sn_{10}Bi_2Te_{83}$ | −25 | A | B |
| 4-l | $Ge_{0.9}Sn_{0.1}Te$ | −20 | A | B |
| 4-m | $Ge_{0.5}Sn_{0.5}BiTe_4$ | −35 | A | A |
| 4-n | $Ge_{0.5}Sn_{0.5}Bi_{1.5}Te_4$ | −35 | A | A |
| 4-o | $Ge_{52.5}Sn_{7.5}Bi_3Te_{63}$ | −30 | A | A |
| 4-p | $Ge_{52.5}Sn_{7.5}Bi_5Te_{63}$ | −35 | A | A |
| 4-q | $Ge_{52.5}Sn_{7.5}Bi_7Te_{63}$ | −35 | A | A |
| 4-r | $Ge_{52.5}Sn_{7.5}Bi_8Te_{63}$ | −35 | A | A |

As a result, it was found that good characteristics were obtained with respect to the erasing ratio, the repeated rewriting capabilities, the archival capabilities and the archival rewrite capabilities for the samples 4-b through 4-j and 4-n through 4-q, in which the first recording film 104 is expressed by the composition formula $(Ge-Sn)_a Bi_b Te_{3+a}$ and where a and b satisfy the inequalities $0<a\leq60$ and $1.5\leq b\leq7$, both during a low transmission rate in which the linear speed is 4.9 meters/second and a high transmission rate in which the linear speed is 9.8 meters/second. In addition, the samples 4-a, 4-m and 4-r were found to have slightly insufficient archival capabilities at the low transmission rate since the crystallization speed in the first recording film 104 was too fast. Moreover, the samples 4-k and 4-l were found to have slightly insufficient erasing ratios and archival rewrite capabilities at the high transmission rate since the crystallization speed in the first recording film 104 was too slow.

From the result described above, it was found to be preferable that a and b satisfy the inequalities $0<a\leq60$ and $1.5\leq b\leq7$ when a material of the first recording film 104 is expressed by the composition formula $(Ge-Sn)_a Bi_b Te_{3+a}$, too.

In addition, it was found from the above-described results that sufficient erasing ratio and archival rewrite capabilities at a high transmission rate can be obtained even if the film thickness of the first recording film 104 is thinned to 6 nm in order to insure transmittance, since the Sn that displaced Ge improves the crystallization ability.

Furthermore, similar results were obtained when a material that contains Pb instead of Sn was used for the first recording film 104.

EXAMPLE 5

Concerning the first information layer 16 of the information recording medium 22 shown in FIG. 2, a material was used for the first recording film 104 which is expressed by the composition formula $Ge_a(Bi-Sb)_b Te_{3+a}$ or the composition formula $(Ge-M2)_a(Bi-Sb)_b Te_{3+a}$, where M2 is one or more elements selected from a group consisting of Sn and Pb. Then, an experiment similar to the third example was performed. The results were the same, i.e., it was preferable that a and b satisfy the inequalities $0<a\leq60$ and $1.5\leq b\leq7$.

EXAMPLE 6

Concerning the first information layer 16 of the information recording medium 22 shown in FIG. 2, a material was used for the first recording film 104 which is expressed by the composition formula $Ge_a Sb_b Te_{3+a}$ or the composition formula $(Ge-M2)_a Sb_b Te_{3+a}$, where M2 is one or more elements selected from a group consisting of Sn and Pb. Then, an experiment similar to the third example was performed. The results were the same, i.e., it was preferable that a and b satisfy the inequalities $0<a\leq60$ and $1.5\leq b\leq7$.

EXAMPLE 7

As a seventh example, the information recording medium 22 shown in FIG. 2 was produced, and the relationships between the materials of the second recording film 204 of the second information layer 23 and the erasing ratio, the number of times recording and rewriting was performed, the archival capabilities as well as the archival rewrite capabilities of the second information layer 23 were measured.

The samples were made by the steps below. First, as the substrate 14, a polycarbonate substrate (having a diameter of 120 mm and a thickness of 1.1 mm) was prepared, on which a guide groove (having a depth of 20 nm and a track pitch of 0.32 μm) for guiding the laser beam 11 was formed. Then, following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—SiO$_2$ layer (having a thickness of 22 nm and SiO$_2$ at 20 mol %), the second counterincident side interface film 205 that is a $(SiO_2)_{20}(Cr_2O_3)_{30}(ZrO_2)_{50}$ (mol %) layer (having a thickness of 5 nm), the second recording film 204 (having a thickness of 10 nm), the second incident side interface film 203 that is a $(SiO_2)_{35}(Cr_2O_3)_{30}(ZrO_2)_{35}$ (mol %) layer (having a thickness of 5 nm) and a ZnS—SiO$_2$ layer (having a thickness of 60 nm and SiO$_2$ at 20 mol %) as the second incident side dielectric film 202.

Next, an ultraviolet curing resin is applied onto the second incident side dielectric film 202, on which a substrate with a guide groove having a depth of 20 nm and a track pitch of 0.32 μm is placed on to be contacted closely. Then, the substrate is rotated so that a uniform resin layer is formed. After curing the resin, the substrate is removed. According to this process, the optical separation layer 17 was made which has a thickness of 25 μm and a guide groove for guiding the laser beam 11 formed at the first information layer 16 side.

After that, the following layers are formed sequentially on the optical separation layer 17 by the sputtering method. The layers include the transmittance adjustment film 109 that is a TiO$_2$ layer (having a thickness of 20 nm), first reflection film 108 that is a Ag—Pd—Cu layer (having a thickness of 10 nm), the first counterincident side interface film 105 that is a $(SiO_2)_{20}(Cr_2O_3)_{30}(ZrO_2)_{50}$ (mol %) layer (having a thickness of 10 nm), the first recording film 104 that is a $Ge_{22}Bi_2Te_{25}$ layer (having a thickness of 6 nm), the first incident side interface film 103 that is a $(SiO_2)_{35}(Cr_2O_3)_{30}(ZrO_2)_{35}$ (mol %) layer (having a thickness of 5 nm), the first incident side dielectric film 102 that is a ZnS—SiO$_2$ layer (having a thickness of 40 nm and SiO$_2$ at 20 mol %). Finally, an ultraviolet curing resin is applied onto the first incident side dielectric film 102, and a polycarbonate sheet (having a diameter of 120 mm and a thickness of 65 μm) is contacted with the first incident side dielectric film 102, which is rotated so as to form a uniform resin layer. After that, ultraviolet rays are irradiated for curing the resin, so that the transparent layer 13 having a thickness of 75 μm was made. After that, the initialization step was performed in which the second recording film 204 and the first recording film 104 are crystallized by a laser beam. In this way, plural samples having different materials for the second recording film 204 are produced.

Regarding these obtained samples, the erasing ratio, the number of times recording and rewriting were performed, the archival capabilities and the archival rewrite capabilities of the second information layer 23 of the information recording medium 22 were measured by using the recording and reproducing apparatus 35 shown in FIG. 5. On this occasion, the wavelength of the laser beam 11 was set to 405 nm, the numerical aperture NA of the objective lens 31 was set to 0.85, the linear speed of the sample during the measurement was set to 4.9 meters/second and 9.8 meters/second, and the shortest mark length was set to 0.149 μm. In addition, information was recorded on the groove surface.

Table 7 shows the evaluation results of the erasing ratio, the number of times recording and rewriting were performed, the archival capabilities and the archival rewrite capabilities of the second information layer 23 when the linear speed is 4.9 meters/second, and Table 8 shows the evaluation results when the linear speed is 9.8 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

material of the second recording film 204 is expressed by the composition formula $Sb_xM1_{100-x}$.

EXAMPLE 8

As a eighth example, the information recording medium 22 shown in FIG. 2 was produced by the same method as the seventh example, and the relationships between the materials of the second recording film 204 of the second information layer 23 and the erasing ratio, the number of times

TABLE 7

| Medium number | Second recording film material | Erasing ratio (dB) | Repeated rewriting capability (number of times) | Archival capability | Archival rewrite capability |
|---|---|---|---|---|---|
| 5-a | $Sb_{50}Te_{45}Ge_5$ | −30 | 4000 | A | A |
| 5-b | $Sb_{60}Te_{35}Ge_5$ | −35 | 5000 | A | A |
| 5-c | $Sb_{70}Te_{25}Ge_5$ | −35 | 5000 | A | A |
| 5-d | $Sb_{80}Te_{15}Ge_5$ | −35 | 5000 | A | A |
| 5-e | $Sb_{90}Te_5Ge_5$ | −35 | 5000 | A | A |
| 5-f | $Sb_{95}Ge_5$ | −35 | 5000 | A | A |

TABLE 8

| Medium number | Second recording film material | Erasing ratio (dB) | Repeated rewriting capability (number of times) | Archival capability | Archival rewrite capability |
|---|---|---|---|---|---|
| 5-a | $Sb_{50}Te_{45}Ge_5$ | −25 | 6000 | A | A |
| 5-b | $Sb_{60}Te_{35}Ge_5$ | −30 | 7000 | A | A |
| 5-c | $Sb_{70}Te_{25}Ge_5$ | −30 | 7000 | A | A |
| 5-d | $Sb_{80}Te_{15}Ge_5$ | −30 | 7000 | A | A |
| 5-e | $Sb_{90}Te_5Ge_5$ | −30 | 7000 | A | A |
| 5-f | $Sb_{95}Ge_5$ | −30 | 7000 | A | A |

As a result, it was found that good characteristics were obtained with respect to the erasing ratio, the repeated rewriting capabilities, the archival capabilities and the archival rewrite capabilities for the samples 5-a through 5-f in which the second recording film 204 is expressed by the composition formula $Sb_xM1_{100-x}$, where M1 is one or more elements selected from a group consisting of Te and Ge, and x satisfies the inequality $50 \leq x \leq 95$, during both a low transmission rate in which the linear speed is 4.9 meters/second and a high transmission rate in which the linear speed is 9.8 meters/second.

In addition, the same result was obtained when a material that is V, Mn, Ga, Se, Ag, In, Sn, Pb, Bi or Au was used for the second recording film 204 instead of M1 that was Te or Ge.

From the results described above, it was found to be preferable that x satisfy the inequality $50 \leq x \leq 95$ when the recording and rewriting were performed, the archival capabilities, as well as the archival rewrite capabilities of the second information layer 23 were checked.

Table 9 shows the evaluation results of the erasing ratio, the number of times recording and rewriting were performed, the archival capabilities and the archival rewrite capabilities of the second information layer 23 when the linear speed is 4.9 meters/second, and Table 10 shows the evaluation results when the linear speed is 9.8 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 9

| Medium number | Second recording film material | Erasing ratio (dB) | Repeated rewriting capability (number of times) | Archival capability | Archival rewrite capability |
|---|---|---|---|---|---|
| 6-a | $Sb_{0.5}Te_{50}Ge_{49.5}$ | −25 | 3000 | A | A |
| 6-b | $Sb_5Te_{51}Ge_{44}$ | −30 | 10000 | A | A |
| 6-c | $Sb_{10}Te_{52}Ge_{38}$ | −35 | 10000 | A | A |
| 6-d | $Sb_{15}Te_{53}Ge_{32}$ | −35 | 10000 | A | A |
| 6-e | $Sb_{20}Te_{55}Ge_{25}$ | −35 | 10000 | A | A |
| 6-f | $Sb_{25}Te_{56}Ge_{19}$ | −40 | 10000 | B | A |

TABLE 10

| Medium number | Second recording film material | Erasing ratio (dB) | Repeated rewriting capability (number of times) | Archival capability | Archival rewrite capability |
|---|---|---|---|---|---|
| 6-a | $Sb_{0.5}Te_{50}Ge_{49.5}$ | −20 | 5000 | A | A |
| 6-b | $Sb_5Te_{51}Ge_{44}$ | −25 | 10000 | A | A |
| 6-c | $Sb_{10}Te_{52}Ge_{38}$ | −30 | 10000 | A | A |
| 6-d | $Sb_{15}Te_{53}Ge_{32}$ | −30 | 10000 | A | A |
| 6-e | $Sb_{20}Te_{55}Ge_{25}$ | −30 | 10000 | A | A |
| 6-f | $Sb_{25}Te_{56}Ge_{19}$ | −35 | 10000 | A | A |

As a result, it was found that good characteristics were obtained with respect to the erasing ratio, the repeated rewriting capabilities, the archival capabilities and the archival rewrite capabilities for the samples 6-a, 6-b, 6-c, 6-d and 6-e in which the second recording film 204 is expressed by the composition formula $Sb_yM1_{100-y}$, where M1 is one or more elements selected from a group consisting of Te and Ge, and y satisfies the inequality $0<y\leq20$, both during a low transmission rate in which the linear speed is 4.9 meters/second and a high transmission rate in which the linear speed is 9.8 meters/second. In addition, the sample 6-f was found to have slightly insufficient archival capabilities at a low transmission rate since the crystallization speed in the second recording film 204 was too fast.

In addition, a similar result was obtained when a material that is V, Mn, Ga, Se, Ag, In, Sn, Pb, Bi or Au is used for the second recording film 204 instead of M1 that is Te or Ge.

From the results described above, it was found to be preferable that y satisfy the inequality $0<y\leq20$ when the material of the second recording film 204 is expressed by the composition formula $Sb_yM1_{100-y}$.

EXAMPLE 9

As a ninth example, the information recording medium 22 shown in FIG. 2 was produced by the same method as the sixth example, and the relationships between the materials of the second recording film 204 of the second information layer 23 and the erasing ratio, the number of times rewriting was performed, archival capabilities, as well as the archival rewrite capabilities of the second information layer 23 were checked.

Table 11 shows the evaluation results of the erasing ratio, the number of times recording and rewriting has been performed, the archival capabilities and the archival rewrite capabilities of the second information layer 23 when the linear speed is 4.9 meters/second, and Table 12 shows the evaluation results when the linear speed is 9.8 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 11

| Medium number | Second recording film material | Erasing ratio (dB) | Repeated rewriting capability (number of times) | Archival capability | Archival rewrite capability |
|---|---|---|---|---|---|
| 7-a | $BiSbTe_3$ | −40 | 10000 | B | A |
| 7-b | $GeBiSbTe_4$ | −35 | 10000 | A | A |
| 7-c | $Ge_2BiSbTe_5$ | −35 | 10000 | A | A |
| 7-d | $Ge_4BiSbTe_7$ | −35 | 10000 | A | A |
| 7-e | $Ge_8BiSbTe_{11}$ | −35 | 10000 | A | A |
| 7-f | $Ge_{22}BiSbTe_{25}$ | −35 | 10000 | A | A |
| 7-g | $Ge_{31}BiSbTe_{34}$ | −35 | 10000 | A | A |
| 7-h | $Ge_{40}BiSbTe_{43}$ | −35 | 10000 | A | A |
| 7-i | $Ge_{50}BiSbTe_{53}$ | −35 | 8000 | A | A |
| 7-j | $Ge_{60}BiSbTe_{63}$ | −35 | 7000 | A | A |
| 7-k | $Ge_{80}BiSbTe_{83}$ | −30 | 5000 | A | A |
| 7-l | GeTe | −25 | 3000 | A | A |
| 7-m | $GeBi_{0.5}Sb_{0.5}Te_4$ | −40 | 10000 | B | A |
| 7-n | $GeBi_{0.8}Sb_{0.8}Te_4$ | −35 | 10000 | A | A |
| 7-o | $Ge_{60}Bi_2Sb_2Te_{63}$ | −35 | 7000 | A | A |
| 7-p | $Ge_{60}Bi_3Sb_3Te_{63}$ | −35 | 7000 | A | A |
| 7-q | $Ge_{60}Bi_{3.5}Sb_{3.5}Te_{63}$ | −35 | 7000 | A | A |
| 7-r | $Ge_{60}Bi_4Sb_4Te_{63}$ | −40 | 7000 | B | A |

TABLE 12

| Medium number | Second recording film material | Erasing ratio (dB) | Repeated rewriting capability (number of times) | Archival capability | Archival capability |
|---|---|---|---|---|---|
| 7-a | $BiSbTe_3$ | −40 | 10000 | A | A |
| 7-b | $GeBiSbTe_4$ | −35 | 10000 | A | A |
| 7-c | $Ge_2BiSbTe_5$ | −35 | 10000 | A | A |
| 7-d | $Ge_4BiSbTe_7$ | −35 | 10000 | A | A |
| 7-e | $Ge_8BiSbTe_{11}$ | −35 | 10000 | A | A |
| 7-f | $Ge_{22}BiSbTe_{25}$ | −35 | 10000 | A | A |
| 7-g | $Ge_{31}BiSbTe_{34}$ | −35 | 10000 | A | A |
| 7-h | $Ge_{40}BiSbTe_{43}$ | −35 | 10000 | A | A |
| 7-i | $Ge_{50}BiSbTe_{53}$ | −35 | 10000 | A | A |
| 7-j | $Ge_{60}BiSbTe_{63}$ | −35 | 8000 | A | A |
| 7-k | $Ge_{80}BiSbTe_{83}$ | −30 | 7000 | A | B |
| 7-l | $GeTe$ | −25 | 5000 | A | C |
| 7-m | $GeBi_{0.5}Sb_{0.5}Te_4$ | −40 | 10000 | A | A |
| 7-n | $GeBi_{0.8}Sb_{0.8}Te_4$ | −35 | 10000 | A | A |
| 7-o | $Ge_{60}Bi_2Sb_2Te_{63}$ | −35 | 8000 | A | A |
| 7-p | $Ge_{60}Bi_3Sb_3Te_{63}$ | −35 | 8000 | A | A |
| 7-q | $Ge_{60}Bi_{3.5}Sb_{3.5}Te_{63}$ | −35 | 8000 | A | A |
| 7-r | $Ge_{60}Bi_4Sb_4Te_{63}$ | −40 | 8000 | A | A |

As a result, it was found that good characteristics were obtained with respect to the erasing ratio, the repeated rewriting capabilities, the archival capabilities and the archival rewrite capabilities for the samples 7-b through 7-j and 7-n through 7-q in which the second recording film 204 is expressed by the composition formula $Ge_a(Bi\text{---}Sb)_bTe_{3+a}$, where a and b satisfy the inequalities $0<a\leqq60$ and $1.5\leqq b\leqq7$, both during a low transmission rate in which the linear speed is 4.9 meters/second and a high transmission rate in which the linear speed is 9.8 meters/second. In addition, the samples 7-a, 7-m and 7-r were found to have slightly insufficient archival capabilities at a low transmission rate since the crystallization speed in the second recording film 204 was too fast. Moreover, the samples 7-k and 7-l were found to have slightly insufficient erasing ratio and archival rewrite capabilities at a high transmission rate since the crystallization speed in the second recording film 204 was too slow.

From the results described above, it was found to be preferable that a and b satisfy the inequalities $0<a\leqq60$ and $1.5\leqq b\leqq7$ when a material of the second recording film 204 is expressed by the composition formula $Ge_a(Bi\text{---}Sb)_bTe_{3+a}$.

EXAMPLE 10

Concerning the second information layer 23 of the information recording medium 22 shown in FIG. 2, a material was used for the second recording film 204 which is expressed by the composition formula $(Ge\text{---}M2)_a(Bi\text{---}Sb)_bTe_{3+a}$, where M2 is one or more elements selected from a group consisting of Sn and Pb. Then, an experiment similar to the eighth example was performed. The result was the same, i.e., it was preferable that a and b satisfy the inequalities $0<a\leqq60$ and $1.5\leqq b\leqq7$.

EXAMPLE 11

As an eleventh example, the information recording medium 22 shown in FIG. 2 was produced, and the relationships between the materials of the second recording film 204 of the second information layer 23 and the erasing ratio, the number of times recording and rewriting were performed, the archival capabilities, as well as the archival rewrite capabilities of the second information layer 23 were measured. In addition, the relationships between the materials of the first recording film 104 of the first information layer 16 and the erasing ratio, the number of times recording and rewriting were performed, the archival capabilities, as well as the archival rewrite capabilities of the first information layer 16 were also measured. More specifically, samples of the information recording medium 22 were made which includes the second information layer 23 having different materials of the second recording film 204, and also includes the first information layer 16 having different materials of the first recording film 104. Then, the erasing ratio, the number of times recording and rewriting were performed, the archival capabilities and the archival rewrite capabilities of the second information layer 23 and the first information layer 16 were measured.

The samples were made by the steps below. First, as the substrate 14, a polycarbonate substrate (having a diameter of 120 mm and a thickness of 1.1 mm) was prepared, on which a guide groove (having a depth of 20 nm and a track pitch of 0.32 µm) for guiding the laser beam 11 was formed. Then, the following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—SiO₂ layer (having a thickness of 22 nm and SiO₂ at 20 mol %), the second counterincident side interface film 205 that is a $(SiO_2)_{20}(Cr_2O_3)_{30}(ZrO_2)_{50}$ (mol %) layer (having a thickness of 5 nm), the second recording film 204 (having a thickness of 10 nm), the second incident side interface film 203 that is a $(SiO_2)_{35}(Cr_2O_3)_{30}(ZrO_2)_{35}$ (mol %) layer (having a thickness of 5 nm) and the second incident side dielectric film 202 that is a ZnS—SiO₂ layer (having a thickness of 60 nm and SiO₂ at 20 mol %).

Next, an ultraviolet curing resin is applied onto the second incident side dielectric film 202, on which a substrate with a guide groove having a depth of 20 nm and a track pitch of 0.32 µm is placed to be contacted closely. Then, the substrate is rotated so that a uniform resin layer is formed. After curing the resin, the substrate is removed. According to this process, the optical separation layer 17 was made which has a thickness of 25 μm and a guide groove for guiding the laser beam 11 formed at the first information layer 16 side.

After that, the following layers are formed sequentially on the optical separation layer 17 by the sputtering method. The layers include the transmittance adjustment film 109 that is a $TiO_2$ layer (having a thickness of 20 nm), first reflection film 108 that is a Ag—Pd—Cu layer (having a thickness of 10 nm), the first counterincident side interface film 105 that is a $(SiO_2)_{20}(Cr_2O_3)_{30}(ZrO_2)_{50}$ (mol %) layer (having a thickness of 10 nm), the first recording film 104 (having a thickness of 6 nm), and the first incident side interface film 103 that is a $(SiO_2)_{35}(Cr_2O_3)_{30}(ZrO_2)_{35}$ (mol %) layer (having a thickness of 5 nm), the first incident side dielectric film 102 that is a ZnS—$SiO_2$ layer (having a thickness of 40 nm and $SiO_2$ at 20 mol %). Finally, an ultraviolet curing resin is applied onto the first incident side dielectric film 102, and a polycarbonate sheet (having a diameter of 120 mm and a thickness of 65 μm) is contacted with the first incident side dielectric film 102, which is rotated so as to form a uniform resin layer. After that, ultraviolet rays are irradiated for curing the resin, so that the transparent layer 13 having a thickness of 75 μm was made. After that, the initialization step was performed in which the second recording film 204 and the first recording film 104 are crystallized by a laser beam. In this way, plural samples having different materials of the second recording film 204 and the first recording film 104 were produced.

Regarding these obtained samples, the erasing ratio, the number of times recording and rewriting were performed, the archival capabilities and the archival rewrite capabilities of the second information layer 23 and the first information layer 16 of the information recording medium 22 were measured by using the recording and reproducing apparatus 35 shown in FIG. 5. On this occasion, the wavelength of the laser beam 11 was set to 405 nm, the numerical aperture NA of the objective lens 31 was set to 0.85, the linear speed of the sample during the measurement was set to 4.9 meters/second and 9.8 meters/second, and the shortest mark length was set to 0.149 μm. In addition, information was recorded on the groove surface.

Table 13 shows the evaluation results of the erasing ratio, the number of times recording and rewriting have been performed, the archival capabilities and the archival rewrite capabilities of the second information layer 23 when the linear speed is 4.9 meters/second, and Table 14 shows the evaluation results when the linear speed is 9.8 meters/second. In addition, Table 15 shows the evaluation results of the erasing ratio, the number of times recording and rewriting were performed, the archival capabilities and the archival rewrite capabilities of the first information layer 16 when the linear speed is 4.9 meters/second, and Table 16 shows the evaluation results when the linear speed is 9.8 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 13

| Medium number | Second recording film material | Erasing ratio (dB) | Repeated rewriting capability (number of times) | Archival capability | Archival rewrite capability |
|---|---|---|---|---|---|
| 8-a | $Bi_2Te_3$ | −40 | 10000 | C | A |
| 8-b | $GeBi_2Te_4$ | −35 | 10000 | A | A |
| 8-c | $Ge_2Bi_2Te_5$ | −35 | 10000 | A | A |
| 8-d | $Ge_4Bi_2Te_7$ | −35 | 10000 | A | A |
| 8-e | $Ge_8Bi_2Te_{11}$ | −35 | 10000 | A | A |
| 8-f | $Ge_{22}Bi_2Te_{25}$ | −35 | 10000 | A | A |
| 8-g | $Ge_{31}Bi_2Te_{34}$ | −35 | 10000 | A | A |
| 8-h | $Ge_{40}Bi_2Te_{43}$ | −35 | 10000 | A | A |
| 8-i | $Ge_{50}Bi_2Te_{53}$ | −35 | 8000 | A | A |
| 8-j | $Ge_{60}Bi_2Te_{63}$ | −35 | 7000 | A | A |
| 8-k | $Ge_{80}Bi_2Te_{83}$ | −30 | 5000 | A | A |
| 8-l | GeTe | −25 | 3000 | A | A |
| 8-m | $GeBiTe_4$ | −40 | 10000 | B | A |
| 8-n | $GeBi_{1.5}Te_4$ | −35 | 10000 | A | A |
| 8-o | $Ge_{60}Bi_3Te_{63}$ | −35 | 7000 | A | A |
| 8-p | $Ge_{60}Bi_5Te_{63}$ | −35 | 7000 | A | A |
| 8-q | $Ge_{60}Bi_7Te_{63}$ | −35 | 7000 | A | A |
| 8-r | $Ge_{60}Bi_8Te_{63}$ | −40 | 7000 | B | A |

TABLE 14

| Medium number | Second recording film material | Erasing ratio (dB) | Repeated rewriting capability (number of times) | Archival capability | Archival rewrite capability |
|---|---|---|---|---|---|
| 8-a | $Bi_2Te_3$ | −35 | 10000 | A | A |
| 8-b | $GeBi_2Te_4$ | −35 | 10000 | A | A |
| 8-c | $Ge_2Bi_2Te_5$ | −35 | 10000 | A | A |
| 8-d | $Ge_4Bi_2Te_7$ | −35 | 10000 | A | A |
| 8-e | $Ge_8Bi_2Te_{11}$ | −35 | 10000 | A | A |
| 8-f | $Ge_{22}Bi_2Te_{25}$ | −35 | 10000 | A | A |
| 8-g | $Ge_{31}Bi_2Te_{34}$ | −30 | 10000 | A | A |
| 8-h | $Ge_{40}Bi_2Te_{43}$ | −30 | 10000 | A | A |
| 8-i | $Ge_{50}Bi_2Te_{53}$ | −30 | 10000 | A | A |
| 8-j | $Ge_{60}Bi_2Te_{63}$ | −30 | 8000 | A | A |
| 8-k | $Ge_{80}Bi_2Te_{83}$ | −25 | 7000 | A | B |
| 8-l | GeTe | −20 | 5000 | A | C |
| 8-m | $GeBiTe_4$ | −35 | 10000 | A | A |
| 8-n | $GeBi_{1.5}Te_4$ | −35 | 10000 | A | A |
| 8-o | $Ge_{60}Bi_3Te_{63}$ | −30 | 8000 | A | A |
| 8-p | $Ge_{60}Bi_5Te_{63}$ | −35 | 8000 | A | A |
| 8-q | $Ge_{60}Bi_7Te_{63}$ | −35 | 8000 | A | A |
| 8-r | $Ge_{60}Bi_8Te_{63}$ | −35 | 8000 | A | A |

TABLE 15

| Medium number | First recording film material | Erasing ratio (dB) | Repeated rewriting capability (number of times) | Archival capability | Archival rewrite capability |
|---|---|---|---|---|---|
| 8-a | $Bi_2Te_3$ | −40 | 10000 | C | A |
| 8-b | $GeBi_2Te_4$ | −35 | 10000 | A | A |
| 8-c | $Ge_2Bi_2Te_5$ | −35 | 10000 | A | A |
| 8-d | $Ge_4Bi_2Te_7$ | −35 | 10000 | A | A |
| 8-e | $Ge_8Bi_2Te_{11}$ | −35 | 10000 | A | A |
| 8-f | $Ge_{22}Bi_2Te_{25}$ | −35 | 10000 | A | A |
| 8-g | $Ge_{31}Bi_2Te_{34}$ | −30 | 10000 | A | A |
| 8-h | $Ge_{40}Bi_2Te_{43}$ | −30 | 8000 | A | A |
| 8-i | $Ge_{50}Bi_2Te_{53}$ | −30 | 7000 | A | A |
| 8-j | $Ge_{60}Bi_2Te_{63}$ | −30 | 5000 | A | A |
| 8-k | $Ge_{80}Bi_2Te_{83}$ | −25 | 3000 | A | A |
| 8-l | GeTe | −20 | 1000 | A | A |
| 8-m | $GeBiTe_4$ | −40 | 10000 | B | A |
| 8-n | $GeBi_{1.5}Te_4$ | −35 | 10000 | A | A |

TABLE 15-continued

| Medium number | First recording film material | Erasing ratio (dB) | Repeated rewriting capability (number of times) | Archival capability | Archival rewrite capability |
|---|---|---|---|---|---|
| 8-o | $Ge_{60}Bi_3Te_{63}$ | −30 | 5000 | A | A |
| 8-p | $Ge_{60}Bi_5Te_{63}$ | −35 | 5000 | A | A |
| 8-q | $Ge_{60}Bi_7Te_{63}$ | −35 | 5000 | A | A |
| 8-r | $Ge_{60}Bi_8Te_{63}$ | −40 | 5000 | B | A |

TABLE 16

| Medium number | First recording film material | Erasing ratio (dB) | Repeated rewriting capability (number of times) | Archival capability | Archival rewrite capability |
|---|---|---|---|---|---|
| 8-a | $Bi_2Te_3$ | −35 | 10000 | A | A |
| 8-b | $GeBi_2Te_4$ | −30 | 10000 | A | A |
| 8-c | $Ge_2Bi_2Te_5$ | −30 | 10000 | A | A |
| 8-d | $Ge_4Bi_2Te_7$ | −30 | 10000 | A | A |
| 8-e | $Ge_8Bi_2Te_{11}$ | −30 | 10000 | A | A |
| 8-f | $Ge_{22}Bi_2Te_{25}$ | −30 | 10000 | A | A |
| 8-g | $Ge_{31}Bi_2Te_{34}$ | −25 | 10000 | A | A |
| 8-h | $Ge_{40}Bi_2Te_{43}$ | −25 | 10000 | A | A |
| 8-i | $Ge_{50}Bi_2Te_{53}$ | −25 | 8000 | A | A |
| 8-j | $Ge_{60}Bi_2Te_{63}$ | −25 | 7000 | A | A |
| 8-k | $Ge_{80}Bi_2Te_{83}$ | −20 | 5000 | A | B |
| 8-l | GeTe | −15 | 3000 | A | C |
| 8-m | $GeBiTe_4$ | −35 | 10000 | A | A |
| 8-n | $GeBi_{1.5}Te_4$ | −30 | 10000 | A | A |
| 8-o | $Ge_{60}Bi_3Te_{63}$ | −25 | 7000 | A | A |
| 8-p | $Ge_{60}Bi_5Te_{63}$ | −30 | 7000 | A | A |
| 8-q | $Ge_{60}Bi_7Te_{63}$ | −30 | 7000 | A | A |
| 8-r | $Ge_{60}Bi_8Te_{63}$ | −35 | 7000 | A | A |

As a result, it was found that good characteristics were obtained with respect to the erasing ratio, the repeated rewriting capabilities, the archival capabilities and the archival rewrite capabilities for the samples 8-b through 8-j and 8-n through 8-q in which both the second recording film 204 and the first recording film 104 are expressed by the composition formula $Ge_aBi_bTe_{3+a}$, where a and b satisfy the inequalities $0<a\leq60$ and $1.5\leq b\leq7$ in the second information layer 23 and the first information layer 16, both at a low transmission rate in which the linear speed is 4.9 meters/second and a high transmission rate in which the linear speed is 9.8 meters/second. In addition, the samples 8-a, 8-m and 8-r were found to have slightly insufficient archival capabilities at a low transmission rate since the crystallization speed in the second recording film 204 and the first recording film 104 is too fast. Moreover, the samples 8-k and 8-l were found to have slightly insufficient erasing ratio and the archival rewrite capabilities at a high transmission rate since the crystallization speed in the second recording film 204 and the first recording film 104 was too slow.

From the results described above, it was found to be preferable that a and b satisfy the inequalities $0<a\leq60$ and $1.5\leq b\leq7$ when the material of the second recording film 204 and the first recording film 104 is expressed by the composition formula $Ge_aBi_bTe_{3+a}$.

Furthermore, although the second recording film 204 and the first recording film 104 were made of materials having the same composition in the above-described sample, the same result was obtained as the above-described sample when the second recording film 204 and the first recording film 104 were made of different materials, as long as the materials of the second recording film 204 and the first recording film 104 are expressed by the composition formula $Ge_aBi_bTe_{3+a}$, where a and b satisfy the inequalities $0<a\leq60$ and $1.5\leq b\leq7$.

EXAMPLE 12

Concerning the second information layer 23 and the first information layer 16 of the information recording medium 22 shown in FIG. 2, a material was used for the second recording film 204 or the first recording film 104 which is expressed by the composition formula $(Ge—M2)_aBi_bTe_{3+a}$. Then, an experiment similar to the eleventh example was performed. The result was the same, i.e., it was preferable that a and b satisfy the inequalities $0<a\leq60$ and $1.5\leq b\leq7$.

EXAMPLE 13

As a thirteenth example, the information recording medium 22 shown in FIG. 2 was produced, and the relationships between the film thickness of the first recording film 104 and the erasing ratio, the number of times recording and rewriting were performed, the archival capabilities, as well as the archival rewrite capabilities were checked. More specifically, samples of the information recording medium 22 were made, which includes the first information layer 16 having different film thicknesses of the first recording film 104. Then, the erasing ratio, the number of times recording and rewriting were performed, the archival capabilities and the archival rewrite capabilities of the first information layer 16 were measured.

The samples were made by the steps below. First, as the substrate 14, a polycarbonate substrate (having a diameter of 120 mm and a thickness of 1.1 mm) was prepared, on which a guide groove (having a depth of 20 nm and a track pitch of 0.32 µm) for guiding the laser beam 11 was formed. Then, following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—$SiO_2$ layer (having a thickness of 22 nm and $SiO_2$ at 20 mol %), the second counterincident side interface film 205 that is a $(SiO_2)_{20}(Cr_2O_3)_{30}(ZrO_2)_{50}$ (mol %) layer (having a thickness of 5 nm), the second recording film 204 that is a $Ge_{22}BiSbTe_{25}$ layer (having a thickness of 10 nm), the second incident side interface film 203 that is a $(SiO_2)_{35}(Cr_2O_3)_{30}(ZrO_2)_{35}$ (mol %) layer (having a thickness of 5 nm), and the second incident side dielectric film 202 that is a ZnS—$SiO_2$ layer (having a thickness of 60 nm and $SiO_2$ at 20 mol %).

Next, an ultraviolet curing resin is applied onto the second incident side dielectric film 202, on which a substrate with a guide groove having a depth of 20 nm and a track pitch of 0.32 µm is placed to be contacted closely. Then, the substrate is rotated so that a uniform resin layer is formed. After curing the resin, the substrate is removed. According to this process, the optical separation layer 17 was made which has a thickness of 25 µm and a guide groove for guiding the laser beam 11 formed at the first information layer 16 side.

After that, following layers are formed sequentially on the optical separation layer 17 by the sputtering method. The layers include the transmittance adjustment film 109 that is a $TiO_2$ layer (having a thickness of 20 nm), the first reflection film 108 that is a Ag—Pd—Cu layer (having a thickness of 10 nm), the first counterincident side interface film 105 that is a $(SiO_2)_{20}(Cr_2O_3)_{30}(ZrO_2)_{50}$ (mol %) layer (having a thickness of 10 nm), the first recording film 104 that is a $Ge_{22}Bi_2Te_{25}$ layer, the first incident side interface film 103 that is a $(SiO_2)_{35}(Cr_2O_3)_{30}(ZrO_2)_{35}$ (mol %) layer (having a thickness of 5 nm), and the first incident side dielectric film 102 that is a ZnS—$SiO_2$ layer (having a thickness of 40 nm and $SiO_2$ at 20 mol %). Finally, an ultraviolet curing resin is applied onto the first incident side dielectric film 102, and a polycarbonate sheet (having a diameter of 120 mm and a thickness of 65 μm) is contacted with the first incident side dielectric film 102, which is rotated so as to form a uniform resin layer. After that, ultraviolet rays are irradiated for curing the resin, so that the transparent layer 13 having a thickness of 75 μm was made. After that, the initialization step was performed in which the second recording film 204 and the first recording film 104 are crystallized by a laser beam. In this way, plural samples having different film thicknesses of the first recording film 104 were produced.

Regarding these obtained samples, the erasing ratio, the number of times recording and rewriting were performed, the archival capabilities, and the archival rewrite capabilities of the first information layer 16 of the information recording medium 15 were measured by using the recording and reproducing apparatus 35 shown in FIG. 5.

On this occasion, the wavelength of the laser beam 11 was set to 405 nm, the numerical aperture NA of the objective lens 31 was set to 0.85, the linear speed of the sample during the measurement was set to 4.9 meters/second and 9.8 meters/second, and the shortest mark length was set to 0.149 μm. In addition, information was recorded on the groove surface.

Table 17 shows the evaluation results of the erasing ratio, the number of times recording and rewriting were performed, the archival capabilities and the archival rewrite capabilities of the first information layer 16 when the linear speed is 4.9 meters/second, and Table 18 show the evaluation results when the linear speed is 9.8 meters/second. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 17

| Medium number | First recording film thickness (nm) | Erasing ratio (dB) | Repeated rewriting capability (number of times) | Archive capability | Archive rewrite capability |
|---|---|---|---|---|---|
| 9-a | 12 | −40 | 3000 | C | A |
| 9-b | 10 | −40 | 5000 | C | A |
| 9-c | 9 | −35 | 8000 | A | A |
| 9-d | 8 | −30 | 10000 | A | A |
| 9-e | 6 | −30 | 10000 | A | A |
| 9-f | 4 | −30 | 10000 | A | A |

TABLE 18

| Medium number | First recording film thickness (nm) | Erasing ratio (dB) | Repeated rewriting capability (number of times) | Archive capability | Archive rewrite capability |
|---|---|---|---|---|---|
| 9-a | 12 | −35 | 10000 | A | A |
| 9-b | 10 | −35 | 10000 | A | A |
| 9-c | 9 | −30 | 10000 | A | A |
| 9-d | 8 | −30 | 10000 | A | A |
| 9-e | 6 | −30 | 10000 | A | A |
| 9-f | 4 | −25 | 10000 | A | A |

As a result, it was found that good characteristics were obtained with respect to the erasing ratio, the repeated rewriting capabilities, the archival capabilities and the archival rewrite capabilities for the samples 9-c, 9-d, 9-e, and 9-f in which the film thickness of the first recording film 104 is 9 nm or less, both with a low transmission rate in which the linear speed is 4.9 meters/second and with a high transmission rate in which the linear speed is 9.8 meters/second. In addition, the samples 9-a and 9-b, in which the film thickness of the first recording film 104 is larger than 9 nm, were found to have insufficient archival capabilities at a low transmission rate since the crystallization speed in the first recording film 104 is too fast.

From the results described above, it was found to be preferable that a film thickness of the first recording film 104 be 9 nm or less.

EXAMPLE 14

As a fourteenth example, the information recording medium 22 shown in FIG. 2 was produced, and the relationships between the film thickness of the second recording film 204 of the second information layer 23 and the erasing ratio, the number of times recording and rewriting were performed, the archival capabilities, as well as the archival rewrite capabilities of the second information layer 23 were checked. More specifically, samples of the information recording medium 22 were made, which includes the second information layer 23 having different film thicknesses of the second recording film 204. Then, the erasing ratio, the number of times recording and rewriting were performed, the archival capabilities and the archival rewrite capabilities of the second information layer 23 were measured.

The samples were made by the steps as below. First, as the substrate 14, a polycarbonate substrate (having a diameter of 120 mm and a thickness of 1.1 mm) was prepared, on which a guide groove (having a depth of 20 nm and a track pitch of 0.32 μm) for guiding the laser beam 11 was formed. Then, following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—$SiO_2$ layer (having a thickness of 22 nm and $SiO_2$ at 20 mol %), the second counterincident side interface film 205 that is a $(SiO_2)_{20}(Cr_2O_3)_{30}(ZrO_2)_{50}$ (mol %) layer (having a thickness of 5 nm), the second recording film 204 that is a $Ge_{22}BiSbTe_{25}$ layer, the second incident side interface film 203 that is a $(SiO_2)_{35}(Cr_2O_3)_{30}(ZrO_2)_{35}$ (mol %) layer (having a thickness of 5 nm), and the second incident side dielectric film 202 that is a ZnS—SiO$_2$ layer (having a thickness of 60 nm and SiO$_2$ at 20 mol %).

Next, an ultraviolet curing resin is applied onto the second incident side dielectric film 202, on which a substrate with a guide groove having a depth of 20 nm and a track pitch of 0.32 µm is placed to be contacted closely. Then, the substrate is rotated so that a uniform resin layer is formed. After curing the resin, the substrate is removed. According to this process, the optical separation layer 17 was made which has a thickness of 25 µm and a guide groove for guiding the laser beam 11 formed at the first information layer 16 side.

After that, the following layers are formed sequentially on the optical separation layer 17 by the sputtering method. The layers include the transmittance adjustment film 109 that is a TiO$_2$ layer (having a thickness of 20 nm), the first reflection film 108 that is a Ag—Pd—Cu layer (having a thickness of 10 nm), the first counterincident side interface film 105 that is a (SiO$_2$)$_{20}$(Cr$_2$O$_3$)$_{30}$(ZrO$_2$)$_{50}$ (mol %) layer (having a thickness of 10 nm), the first recording film 104 that is a Ge$_{22}$Bi$_2$Te$_{25}$ layer (having a thickness of 6 nm), the first incident side interface film 103 that is a (SiO$_2$)$_{35}$ (Cr$_2$O$_3$)$_{30}$ (ZrO$_2$)$_{35}$ (mol %) layer (having a thickness of 5 nm) and the first incident side dielectric film 102 that is a ZnS—SiO$_2$ layer (having a thickness of 40 nm and SiO$_2$ at 20 mol %). Finally, an ultraviolet curing resin is applied onto the first incident side dielectric film 102, and a polycarbonate sheet (having a diameter of 120 mm and a thickness of 65 µm) is contacted with the first incident side dielectric film 102, which is rotated so as to form a uniform resin layer. After that, ultraviolet rays are irradiated for curing the resin, so that the transparent layer 13 having a thickness of 75 µm was made. After that, the initialization step was performed in which the second recording film 204 and the first recording film 104 are crystallized by a laser beam. In this way, plural samples having different film thicknesses of the second recording film 204 were produced.

Regarding these obtained samples, the erasing ratio, the number of times recording and rewriting are performed, the archival capabilities and the archival rewrite capabilities of the second information layer 23 of the information recording medium 22 were measured by using the recording and reproducing apparatus 35 shown in FIG. 5. On this occasion, the wavelength of the laser beam 11 was set to 405 nm, the numerical aperture NA of the objective lens 31 was set to 0.85, the linear speed of the sample during the measurement was set to 4.9 meters/second and 9.8 meters/second, and the shortest mark length was set to 0.149 µm. In addition, information was recorded on the groove surface.

Table 19 shows the evaluation results of the erasing ratio, the number of times recording and rewriting are performed, the archival capabilities and the archival rewrite capabilities of the second information layer 23 when the linear speed is 4.9 meters/second, and Table 20 shows the evaluation results when the linear speed is 9.8 meters/second. Furthermore, the archival capabilities and the archival rewrite capabilities are represented by 'A' if the difference between the jitter value before standing and the jitter value after standing is less than 2%, it is represented by 'B' if the difference is equal to or more than 2% and less than 3%, and it is represented by 'C' if the difference is equal to or more than 3%.

TABLE 19

| Medium number | Second recording film thichness (nm) | Erasing ratio (dB) | Repeated rewriting capability (number of times) | Archival capability | Archival rewrite capability |
|---|---|---|---|---|---|
| 10-a | 16 | −40 | 3000 | C | A |
| 10-b | 15 | −35 | 5000 | A | A |
| 10-c | 12 | −35 | 8000 | A | A |
| 10-d | 9 | −30 | 10000 | A | A |
| 10-e | 7 | −30 | 10000 | A | A |
| 10-f | 6 | −30 | 10000 | A | A |
| 10-g | 5 | −25 | 10000 | A | A |

TABLE 20

| Medium number | Second recording film thickness (nm) | Erasing ratio (dB) | Repeated rewriting capability (number of times) | Archival capability | Archival rewrite capability |
|---|---|---|---|---|---|
| 10-a | 16 | −35 | 5000 | A | A |
| 10-b | 15 | −30 | 7000 | A | A |
| 10-c | 12 | −30 | 10000 | A | A |
| 10-d | 9 | −30 | 10000 | A | A |
| 10-e | 7 | −25 | 10000 | A | A |
| 10-f | 6 | −25 | 10000 | A | A |
| 10-g | 5 | −20 | 10000 | A | C |

As a result, it was found that good characteristics were obtained with respect to the erasing ratio, the repeated rewriting capabilities, the archival capabilities and the archival rewrite capabilities for the samples 10-b, 10-c, 10-d, 10-e and 10-f, in which the film thickness of the second recording film 204 is within the range of 6–15 nm, both with a low transmission rate in which the linear speed is 4.9 meters/second and a high transmission rate in which the linear speed is 9.8 meters/second. In addition, the sample 10-a, in which the film thickness of the second recording film 204 is larger than 15 nm, was found to have insufficient archival capabilities at a low transmission rate since the crystallization speed in the second recording film 204 is too fast. Moreover, the sample 10-g, in which the film thickness of the second recording film 204 is less than 6 nm, was found to have an insufficient erasing ratio and insufficient archival rewrite capabilities at a high transmission rate since the crystallization speed in the second recording film 204 is too slow.

From the result described above, it was found to be preferable that the film thickness of the second recording film 204 be within the range of 6–15 nm.

EXAMPLE 15

As a fifteenth example, the information recording medium 29 shown in FIG. 4 was produced, and an experiment similar to the thirteenth example and the fourteenth example was performed.

The samples were made by the steps as described below. First, as the substrate 28, a polycarbonate substrate (having a diameter of 120 mm and a thickness of 0.6 mm) was prepared, on which a guide groove (having a depth of 40 nm and a track pitch 0.344 µm) for guiding the laser beam 11 was formed. Then, following layers are formed sequentially on the polycarbonate substrate by the sputtering method. The layers include the second reflection film 208 that is a Ag—Pd—Cu layer (having a thickness of 80 nm), the interface film 207 that is an Al layer (having a thickness of 10 nm), the second counterincident side dielectric film 206 that is a ZnS—SiO$_2$ layer (having a thickness of 22 nm and SiO$_2$ at 20 mol %), the second counterincident side interface film 205 that is a (SiO$_2$)$_{20}$ (Cr$_2$O$_3$)$_{30}$ (ZrO$_2$)$_{50}$ (mol %) layer (having a thickness of 5 nm), the second recording film 204 that is a Ge$_{22}$BiSbTe$_{25}$ layer, the second incident side interface film 203 that is a (SiO$_2$)$_{35}$(Cr$_2$O$_3$)$_{30}$(ZrO$_2$)$_{35}$ (mol %) layer (having a thickness of 5 nm) and the second incident side dielectric film 202 that is a ZnS—SiO$_2$ layer (having a thickness of 60 nm and SiO$_2$ at 20 mol %).

In addition, as the substrate 24, a polycarbonate substrate (having a diameter of 120 mm and a thickness of 0.58 mm) was prepared, on which a guide groove (having a depth of 40 nm and a track pitch 0.344 μm) for guiding the laser beam 11 was formed. Then, following layers are formed sequentially on the polycarbonate substrate by the sputtering method. The layers include the first incident side dielectric film 102 that is a ZnS—SiO$_2$ layer (having a thickness of 40 nm and SiO$_2$ at 20 mol %), the first incident side interface film 103 that is a (SiO$_2$)$_{35}$(Cr$_2$O$_3$)$_{30}$(ZrO$_2$)$_{35}$ (mol %) layer (having a thickness of 5 nm), the first recording film 104 that is a Ge$_{22}$Bi$_2$Te$_{25}$ layer, the first counterincident side interface film 105 that is a (SiO$_2$)$_{20}$(Cr$_2$O$_3$)$_{30}$(ZrO$_2$)$_{50}$ (mol %) layer (having a thickness of 10 nm), the first reflection film 108 that is a Ag—Pd—Cu layer (having a thickness of 10 nm) and the transmittance adjustment film 109 that is a TiO$_2$ layer (having a thickness of 20 nm).

After that, an ultraviolet curing resin is applied onto the transmittance adjustment film 109, and the second incident side dielectric film 202 of the substrate 28 is contacted with the transmittance adjustment film 109, which is rotated so as to form a uniform resin layer (having a thickness of 20 μm). After that, ultraviolet rays were irradiated for curing the resin, so that the substrate 24 was bonded to the substrate 28 via the adhesive layer 25. Finally, the initialization step is performed for crystallizing the entire surface of the second recording film 204 and the first recording film 104.

Regarding these obtained samples, the erasing ratio, the number of times recording and rewriting were performed, the archival capabilities and the archival rewrite capabilities of the first information layer 16 and the second information layer 23 of the information recording medium 29 were measured in the same way as the thirteenth example and the fourteenth example.

On this occasion, the wavelength of the laser beam 11 was set to 405 nm, the numerical aperture NA of the objective lens 31 was set to 0.65, the linear speed of the sample during the measurement was set to 8.6 meters/second and 17.2 meters/second, and the shortest mark length was set to 0.294 μm. In addition, information was recorded on the groove surface.

As a result, the first information layer 16 and the second information layer 23 of the information recording medium 29 had a good erasing ratio, could be recording and rewritten a good number of times, had good archival capabilities and had archival rewrite capabilities, both when the film thickness of the first recording film 104 is 9 nm or less, and when the film thickness of the second recording film 204 is within the range of 6–15 nm, similar to the thirteenth example and the fourteenth example.

EXAMPLE 16

In the first through fifteenth examples, the same results were obtained even when the first incident side interface film 103, the first counterincident side interface film 105, the second incident side interface film 203 and the second counterincident side interface film 205 contain one or more compounds selected from a group consisting of Ga$_2$O$_3$, SnO$_2$, ZrO$_2$, HfO$_2$, Nb$_2$O$_5$, Ta$_2$O$_5$, SiO$_2$, Cr$_2$O$_3$, Al$_2$O$_3$, TiO$_2$, ZnO, Zr—N, Hf—N, Nb—N, Ta—N, Si—N, Cr—N, Ge—N, Al—N, Ge—Si—N, Ge—Cr—N, YF$_3$, LaF$_3$, CeF$_3$, GdF$_3$, DyF$_3$, ErF$_3$, YbF$_3$, C and ZnS.

EXAMPLE 17

As a seventeenth example, the information recording medium 15 was produced, which has four information layers, i.e., N=4 in FIG. 1. Then, the archival capabilities and the archival rewrite capabilities of each information layer were checked.

The samples were made by the steps as described below. First, as the substrate 14, a polycarbonate substrate (having a diameter of 120 mm and a thickness of 1.1 mm) was prepared, on which a guide groove (having a depth of 20 nm and a track pitch of 0.32 μm) for guiding the laser beam 11 was formed. Then, following layers are formed sequentially on the polycarbonate substrate by the sputtering method. The layers include the fourth reflection layer 408 that is a Ag—Pd—Cu layer (having a thickness of 80 nm), the interface layer 407 that is an Al layer (having a thickness of 10 nm), the fourth counterincident side dielectric layer 406 that is a ZnS—SiO$_2$ layer (having a thickness of 22 nm and SiO$_2$ at 20 mol %), the fourth counterincident side interface layer 405 that is a (SiO$_2$)$_{20}$(Cr$_2$O$_3$)$_{30}$(ZrO$_2$)$_{50}$ (mol %) layer (having a thickness of 5 nm), the fourth recording layer 404 that is a Ge$_{22}$BiSbTe$_{25}$ layer (having a thickness of 12 nm), the fourth incident side interface layer 403 that is a (SiO$_2$)$_{35}$(Cr$_2$O$_3$)$_{30}$(ZrO$_2$)$_{35}$ (mol %) layer (having a thickness of 5 nm) and the fourth incident side dielectric layer 402 that is a ZnS—SiO$_2$ layer (having a thickness of 60 nm and SiO$_2$ at 20 mol %).

Next, an ultraviolet curing resin is applied onto the fourth incident side dielectric layer 402, on which a substrate with a guide groove having a depth of 20 nm and a track pitch of 0.32 μm is placed to be contacted closely. Then, the substrate is rotated so that a uniform resin layer is formed. After curing the resin, the substrate is removed. According to this process, the optical separation layer 20 was made which has a thickness of 10 μm and a guide groove for guiding the laser beam 11 formed at the first information layer 16 side.

After that, the following layers are formed sequentially on the optical separation layer 20 by the sputtering method. The layers include the third transmittance adjustment layer 309 that is a TiO$_2$ layer (having a thickness of 20 nm), the third reflection layer 308 that is a Ag—Pd—Cu layer (having a thickness of 10 nm), the third counterincident side interface layer 305 that is a (SiO$_2$)$_{20}$(Cr$_2$O$_3$)$_{30}$(ZrO$_2$)$_{50}$ (mol %) layer (having a thickness of 10 nm), the third recording layer 304 that is a Ge$_{20}$Bi$_2$Te$_{23}$ layer (having a thickness of 6 nm), the third incident side interface layer 303 that is a (SiO$_2$)$_{35}$(Cr$_2$O$_3$)$_{30}$(ZrO$_2$)$_{35}$ (mol %) layer (having a thickness of 5 nm) and the third incident side dielectric layer 302 that is a ZnS—SiO$_2$ layer (having a thickness of 40 nm and SiO$_2$ at 20 mol %).

Next, an ultraviolet curing resin is applied onto the third incident side dielectric layer 302, on which a substrate with a guide groove having a depth of 20 nm and a track pitch of 0.32 μm is placed to be contacted closely. Then, the substrate is rotated so that a uniform resin layer is formed. After curing the resin, the substrate is removed. According to this process, the optical separation layer 19 was made which has a thickness of 10 μm and a guide groove for guiding the laser beam 11 formed at the first information layer 16 side.

After that, the following layers are formed sequentially on the optical separation layer 19 by the sputtering method. The layers include the second transmittance adjustment layer 209 that is a $TiO_2$ layer (having a thickness of 20 nm), the second reflection film 208 that is a Ag—Pd—Cu layer (having a thickness of 10 nm), the second counterincident side interface film 205 that is a $(SiO_2)_{20}(Cr_2O_3)_{30}(ZrO_2)_{50}$ (mol %) layer (having a thickness of 10 nm), the second recording film 204 that is a $Ge_{30}Bi_2Te_{33}$ layer (having a thickness of 5 nm), the second incident side interface film 203 that is a $(SiO_2)_{35}(Cr_2O_3)_{30}(ZrO_2)_{35}$ (mol %) layer (having a thickness of 5 nm) and the second incident side dielectric film 202 that is a ZnS—$SiO_2$ layer (having a thickness of 40 nm and $SiO_2$ at 20 mol %).

Next, an ultraviolet curing resin is applied onto the second incident side dielectric film 202, on which a substrate with a guide groove having a depth of 20 nm and a track pitch of 0.32 μm is placed to be contacted closely. Then, the substrate is rotated so that a uniform resin layer is formed. After curing the resin, the substrate is removed. According to this process, the optical separation layer 17 was made which has a thickness of 10 μm and a guide groove for guiding the laser beam 11 formed at the first information layer 16 side.

After that, the following layers are formed sequentially on the optical separation layer 17 by the sputtering method. The layers include the transmittance adjustment film 109 that is a $TiO_2$ layer (having a thickness of 20 nm), the first reflection film 108 that is a Ag—Pd—Cu layer (having a thickness of 10 nm), the first counterincident side interface film 105 that is a $(SiO_2)_{20}(Cr_2O_3)_{30}(ZrO_2)_{50}$ (mol %) layer (having a thickness of 10 nm), the first recording film 104 that is a $Ge_{40}Bi_2Te_{43}$ layer (having a thickness of 4 nm), the first incident side interface film 103 that is a $(SiO_2)_{35}(Cr_2O_3)_{30}(ZrO_2)_{35}$ (mol %) layer (having a thickness of 5 nm) and the first incident side dielectric film 102 that is a ZnS—$SiO_2$ layer (having a thickness of 40 nm and $SiO_2$ at 20 mol %).

Finally, an ultraviolet curing resin is applied onto the first incident side dielectric film 102, and a polycarbonate sheet (having a diameter of 120 mm and a thickness of 60 μm) is contacted with the first incident side dielectric film 102, which is rotated so as to form a uniform resin layer. After that, ultraviolet rays are irradiated for curing the resin, so that the transparent layer 13 having a thickness of 70 μm was made. After that, the initialization step was performed in which the fourth recording layer 404, the third recording layer 304, the second recording film 204 and the first recording film 104 were crystallized sequentially by a laser beam. In this way, the information recording medium 15 that has four information layers was made.

Regarding the information recording medium 15 that was obtained as described above, the archival capabilities and the archival rewrite capabilities of four information layers of the information recording medium 15 were checked by using the recording and reproducing apparatus 35 shown in FIG. 5. On this occasion, the wavelength of the laser beam 11 was set to 405 nm, the numerical aperture NA of the objective lens 31 was set to 0.85, the linear speed of the sample during the measurement was set to 4.9 meters/second (1X) and 9.8 meters/second (2X), and the shortest mark length was set to 0.149 μm. In addition, information was recorded on the groove surface.

The relationships among the composition and the film thickness of each recording layer, the archival capabilities at 1X, and the archival rewrite capabilities at 2X are shown in Table 21. Furthermore, the archival capabilities and the archival rewrite capabilities are represented by 'A' if the difference between the jitter value before exposure and the jitter value after exposure is less than 2%, represented by 'B' if the difference is equal to or more than 2% and less than 3%, and represented by 'C' if the difference is equal to or more than 3%.

TABLE 21

|  | Recording film material | Recording layer thickness (nm) | Archival capabilities at 1X | Archival rewrite properties at 2X |
| --- | --- | --- | --- | --- |
| First recording film | $Ge_{40}Bi_2Te_{43}$ | 4 | A | A |
| Second recording film | $Ge_{30}Bi_2Te_{33}$ | 5 | A | A |
| Third recording film | $Ge_{20}Bi_2Te_{23}$ | 6 | A | A |
| Fourth recording film | $Ge_{22}BiSbTe_{25}$ | 12 | A | A |

As a result, it was found that good archival capabilities at 1X and archival rewrite capabilities at 2X were obtained for all of the four information layers.

EXAMPLE 18

As an eighteenth example, the electrical information recording medium 41 shown in FIG. 6 was produced, and the phase change due to the application of electric current was checked.

As the substrate 36, a Si substrate having a surface that was nitride processed was prepared. Then, the following layers are formed sequentially on the substrate 36 by the sputtering method. The layers include the lower electrode 37 that is made of Pt and has an area of 10 μm×10 μm and a thickness of 0.1 μm, the first recording layer 38 that is made of $Ge_{22}Bi_2Te_{25}$ and has an area of 5 μm×5 μm and a thickness of 0.1 μm, the second recording layer 39 that is made of $Sb_{70}Te_{25}Ge_5$ and has an area of 5 μm×5 μm and a thickness of 0.1 μm, the upper electrode 40 that is made of Pt and has an area of 5 μm×5 μm and a thickness of 0.1 μm. After that, Au lead wires were bonded to the lower electrode 37 and the upper electrode 40, so that the electrical information recording and reproducing apparatus 47 was connected to the electrical information recording medium 41 via the applying portion 42. According to this electrical information recording and reproducing apparatus 47, the pulse power source 45 is connected between the lower electrode 37 and the upper electrode 40 via the switch 44. In addition, a change of resistance value due to the phase change of the first recording layer 38 and the second recording layer 39 is detected by the resistance measuring instrument 43 that is connected between the lower electrode 37 and the upper electrode 40 via the switch 46.

Here, the melting point $T_{m1}$ of the first recording layer 38 is 630° C., the crystallization temperature $T_{x1}$ is 170° C., and the crystallization time $t_{x1}$ is 100 ns. In addition, the melting point $T_{m2}$ of the second recording layer 39 is 550° C., the crystallization temperature $T_{x2}$ is 200° C., and the crystallization time $t_{x2}$ is 50 ns. In addition, the resistance value $r_{a1}$ is 500 Ω when the first recording layer 38 is in the amorphous phase, while the resistance value $r_{c1}$ in the crystalline phase is 10 Ω. The resistance value $r_{a2}$ is 800 Ω when the second recording layer 39 is in the amorphous phase, while the resistance value $r_{c2}$ is 20 Ω in the crystalline phase.

When both the first recording layer 38 and the second recording layer 39 were in the amorphous phase as a first state, a current pulse in which $I_{c1}$=5 mA and $t_{c1}$=150 ns in the recording waveform 501 shown in FIG. 9 was applied between the lower electrode 37 and the upper electrode 40. Then, only the first recording layer 38 changed from the amorphous phase to the crystalline phase (hereinafter referred to as a second state). In addition, a current pulse in which $I_{c2}$=10 mA and $t_{c2}$=100 ns in the recording waveform 502 shown in FIG. 9 is applied between the lower electrode 37 and the upper electrode 40 in the first state. Then, only the second recording layer 39 changed from the amorphous phase to the crystalline phase (hereinafter referred to as a third state). In addition, a current pulse in which $I_{c2}$=10 mA and $t_{c1}$=150 ns in the recording waveform 503 shown in FIG. 9 is applied between the lower electrode 37 and the upper electrode 40 in the first state. Then, both the first recording layer 38 and the second recording layer 39 changed from the amorphous phase to the crystalline phase (hereinafter referred to as a fourth state).

Next, when both the first recording layer 38 and the second recording layer 39 were in the fourth state that is the crystalline phase and low resistance state, a current pulse, in which $I_{a1}$=20 mA, $I_{c2}$=10 mA and $t_{c2}$=100 ns in the recording waveform 504 shown in FIG. 9, was applied between the lower electrode 37 and the upper electrode 40. As a result, only the first recording layer 38 changed from the crystalline phase to the amorphous phase (the third state). Moreover, in the fourth state, a current pulse, in which $I_{a2}$=15 mA and $t_{a2}$=50 ns in the recording waveform 505 shown in FIG. 9, was applied between the lower electrode 37 and the upper electrode 40. As a result, only the second recording layer 39 changed from the crystalline phase to the amorphous phase (the second state). Moreover, in the fourth state, a current pulse, in which $I_{a1}$=20 mA and $t_{a1}$=50 ns in the erasing waveform 506 shown in FIG. 9, was applied between the lower electrode 37 and the upper electrode 40. As a result, both the first recording layer 38 and the second recording layer 39 changed from the crystalline phase to the amorphous phase (the first state).

Moreover, in the second state or the third state, a current pulse, in which $I_{c2}$=10 mA and $t_{c1}$=150 ns in the recording waveform 503 shown in FIG. 9, was applied. As a result, both the first recording layer 38 and the second recording layer 39 changed from the amorphous phase to the crystalline phase (the fourth state). Moreover, in the second state or the third state, a current pulse, in which $I_{a1}$=20 mA, $I_{c2}$=10 MA, $t_{c1}$=150 ns and $t_{a1}$=50 ns in the erasing waveform 507 shown in FIG. 9, was applied. As a result, both the first recording layer 38 and the second recording layer 39 changed from the crystalline phase to the amorphous phase (the first state). Moreover, in the second state, a current pulse, in which $I_{a1}$=20 mA, $I_{c2}$=10 mA, $t_{c2}$=100 ns and $t_{a1}$=50 ns in the recording waveform 508 shown in FIG. 9, was applied. As a result, the first recording layer 38 changed from the crystalline phase to the amorphous phase, while the second recording layer 39 changed from the amorphous phase to the crystalline phase (the third state). Moreover, in the third state, a current pulse, in which $I_{a2}$=15 mA, $I_{c1}$=5 mA, $t_{c1}$=150 ns and $t_{a2}$=50 ns in the recording waveform 509 shown in FIG. 9, was applied. As a result, the first recording layer 38 changed from the amorphous phase to the crystalline phase, while the second recording layer 39 changed from the crystalline phase to the amorphous phase (the second state).

From the result described above, it was found that with respect to the electrical phase change type information recording medium 41 shown in FIG. 6, each of the first recording layer 38 and the second recording layer 39 can be changed electrically and reversibly between the crystalline phase and the amorphous phase, so that four states can be achieved. The four states include the first state in which both the first recording layer 38 and the second recording layer 39 are in the amorphous phase, the second state in which the first recording layer 38 is in the crystalline phase while the second recording layer 39 is in the amorphous phase, third state in which the first recording layer 38 is in the amorphous phase while the second recording layer 39 is in the crystalline phase and the fourth state in which both the first recording layer 38 and the second recording layer 39 are in the crystalline phase.

According to the information recording medium and the method for producing the medium of the present invention, an information recording medium can be obtained in which the first information layer and the second information layer achieve both archival rewrite capabilities at a high transmission rate and archival capabilities at a low transmission rate, and good repeated rewriting capabilities can be achieved. It is useful as an information recording medium for recording, erasing, rewriting and reproducing information optically or electrically, and a method for producing the medium.

The invention claimed is:

1. An information recording medium having at least two information layers, the information recording medium comprising:
   a first information layer including a first recording layer in which a reversible phase change between a crystalline phase and an amorphous phase is caused by optical means or electrical means; and
   a second information layer including a second recording layer in which a reversible phase change between a crystalline phase and an amorphous phase is caused by optical means or electrical means,
   wherein the first recording layer contains Ge, Te and Bi, and
   the second recording layer contains Sb and at least one element M1 selected from a group consisting of V, Mn, Ga, Ge, Se, Ag, In, Sn, Te, Pb, Bi and Au.

2. The information recording medium according to claim 1, wherein the first recording layer further contains Sb.

3. The information recording medium according to claim 1, wherein the first recording layer further contains Sn.

4. The information recording medium according to claim 1, wherein the first recording layer contains Bi at 1.0 atom % or more.

5. The information recording medium according to claim 1, wherein the first recording layer is represented by a composition formula $Ge_aBi_bTe_{3+a}$, where $0<a\leq60$ and $1.5\leq b\leq7$.

6. The information recording medium according to claim 1, wherein the first recording layer is represented by a composition formula $(Ge-M2)_aBi_bTe_{3+a}$, where M2 is at least one element selected from a group consisting of Sn and Pb, and $0<a\leq60$ and $1.5\leq b\leq7$.

7. The information recording medium according to claim 2, wherein the first recording layer is represented by a composition formula $Ge_a(Bi\text{---}Sb)_bTe_{3+a}$, where $0<a\leq60$ and $1.5\leq b\leq7$.

8. The information recording medium according to claim 2, wherein the first recording layer is represented by a composition formula $(Ge\text{---}M2)_a(Bi\text{---}Sb)_bTe_{3+a}$, where M2 is at least one element selected from a group consisting of Sn and Pb, and $0<a\leq60$ and $1.5\leq b\leq7$.

9. An information recording medium having at least two information layers, the information recording medium comprising:
   a first information layer including a first recording layer in which a reversible phase change between a crystalline phase and an amorphous phase is caused by optical means or electrical means; and
   a second information layer including a second recording layer in which a reversible phase change between a crystalline phase and an amorphous phase is caused by optical means or electrical means,
   wherein the first recording layer contains Ge, Te and Sb, and
   the second recording layer contains Sb and at least one element M1 selected from a group consisting of V, Mn, Ga, Ge, Se, Ag, In, Sn, Te, Pb, Bi and Au.

10. The information recording medium according to claim 9, wherein the first recording layer is represented by a composition formula $Ge_aSb_bTe_{3+a}$, where $0<a\leq60$ and $1.5\leq b\leq7$.

11. The information recording medium according to claim 9, wherein the first recording layer is represented by a composition formula $(Ge\text{---}M2)_aSb_bTe_{3+a}$, where M2 is at least one element selected from a group consisting of Sn and Pb, and $0<a\leq60$ and $1.5\leq b\leq7$.

12. The information recording medium according to claim 1, wherein the second recording layer is represented by a composition formula $Sb_xM1_{100-x}$, where $50\leq x\leq95$ atom %.

13. The information recording medium according to claim 1, wherein the second recording layer is represented by a composition formula $Sb_yM1_{100-y}$, where $0<y\leq20$ atom %.

14. The information recording medium according to claim 1, wherein the second recording layer is represented by a composition formula $Ge_a(Bi\text{---}Sb)_bTe_{3+a}$, where $0<a\leq60$ and $1.5\leq b\leq7$.

15. The information recording medium according to claim 1, wherein the second recording layer is represented by a composition formula $(Ge\text{---}M2)_a(Bi\text{---}Sb)_bTe_{3+a}$, where M2 is at least one element selected from a group consisting of Sn and Pb, and $0<a\leq60$ and $1.5\leq b\leq7$.

16. An information recording medium having at least two information layers, the information recording medium comprising:
   a first information layer including a first recording layer in which a reversible phase change between a crystalline phase and an amorphous phase is caused by optical means or electrical means; and
   a second information layer including a second recording layer in which a reversible phase change between a crystalline phase and an amorphous phase is caused by optical means or electrical means,
   wherein both the first recording layer and the second recording layer contain Ge, Te and Bi, and
   wherein at least one of the first recording layer and the second recording layer contains Bi at 1.0 atom % or more.

17. The information recording medium according to claim 16, wherein at least one of the first recording layer and the second recording layer is represented by a composition formula $Ge_aBi_bTe_{3+a}$, where $0<a\leq60$ and $1.5\leq b\leq7$.

18. The information recording medium according to claim 16, wherein at least one of the first recording layer and the second recording layer is represented by a composition formula $(Ge\text{---}M2)_aBi_bTe_{3+a}$, where M2 is at least one element selected from a group consisting of Sn and Pb, and $0<a\leq60$ and $1.5\leq b\leq7$.

19. The information recording medium according to claim 1, further comprising an interface layer that is provided adjacent to a surface of at least one of the first recording layer and the second recording layer, wherein the interface layer contains at least one composition selected from a group consisting of $Ga_2O_3$, $SnO_2$, $ZrO_2$, $HfO_2$, $Nb_2O_5$, $Ta_2O_5$, $SiO_2$, $Cr_2O_3$, $Al_2O_3$, $TiO_2$, ZnO, Zr—N, Hf—N, Nb—N, Ta—N, Si—N, Cr—N, Ge—N, Al—N, Ge—Si—N, Ge—Cr—N, $YF_3$, $LaF_3$, $CeF_3$, $GdF_3$, $DyF_3$, $ErF_3$, $YbF_3$, C and ZnS.

20. The information recording medium according to claim 1, wherein the first information layer includes at least a first incident side dielectric layer, a first incident side interface layer, the first recording layer, a first counterincident side interface layer, a first reflection layer and a transmittance adjustment layer in this order.

21. The information recording medium according to claim 1, wherein the second information layer includes at least a second incident side dielectric layer, a second incident side interface layer, the second recording layer, a second counterincident side interface layer, a second counterincident side dielectric layer and a second reflection layer in this order.

22. The information recording medium according to claim 1, wherein the first information layer is disposed at a side closer to the optical means or the electrical means than the second information layer.

23. The information recording medium according to claim 1, wherein a thickness of the first recording layer is 9 nm or less.

24. The information recording medium according to claim 1, wherein a thickness of the second recording layer is between 6 and 15 nm.

25. A method for producing an information recording medium having at least two information layers on a substrate, the method comprising:
   forming a first recording layer that is phase changeable; and
   forming a second recording layer that is phase changeable,
   wherein a sputtering target containing Ge, Te and Bi is used in the forming of the first recording layer, and
   a sputtering target containing Sb and at least one element M1 selected from a group consisting of V, Mn, Ga, Ge, Se, Ag, In, Sn, Pb, Te, Bi and Au is used in the forming of the second recording layer.

26. The method for producing an information recording medium according to claim 25, wherein the sputtering target that is used in the forming of the first recording layer further contains Sn.

27. The method for producing an information recording medium according to claim 25, wherein the sputtering target that is used in the forming of the first recording layer further contains Sn.

28. The method for producing an information recording medium according to claim 25, wherein the sputtering target used in the forming of the first recording layer contains Bi at 0.5 atom % or more.

29. The method for producing an information recording medium according to claim 25, wherein the first recording layer that is formed by the sputtering target that is used in the forming of the first recording layer is represented by a composition formula $Ge_aBi_bTe_{3+a}$, where $0<a\leq60$ and $1.5\leq b\leq7$.

30. The method for producing an information recording medium according to claim 25, wherein the first recording layer that is formed by the sputtering target that is used in the forming of the first recording layer is represented by a composition formula $(Ge-M2)_aBi_bTe_{3+a}$, where M2 is at least one element selected from a group consisting of Sn and Pb, and $0\leq a\leq60$ and $1.5\leq b\leq7$.

31. The method for producing an information recording medium according to claim 26, wherein the first recording layer that is formed by the sputtering target that is used in the forming of the first recording layer is represented by a composition formula $Ge_a(Bi-Sb)_bTe_{3+a}$, where $0<a\leq60$ and $1.5\leq b\leq7$.

32. The method for producing an information recording medium according to claim 26, wherein the first recording layer that is formed by the sputtering target that is used in the forming of the first recording layer is represented by a composition formula $(Ge-M2)_a(Bi-Sb)_bTe_{3+a}$, where M2 is at least one element selected from a group consisting of Sn and Pb, and $0<a\leq60$ and $1.5\leq b\leq7$).

33. A method for producing an information recording medium that has at least two information layers, the method comprising:
forming a first recording layer that is phase changeable; and
forming a second recording layer that is phase changeable,
wherein a sputtering target containing Ge, Te and Sb is used in the forming of the first recording layer, and
a sputtering target containing Sb and at least one element M1 selected from a group consisting of V, Mn, Ga, Ge, Se, Ag, In, Sn, Pb, Te, Bi and Au is used in the forming of the second recording layer.

34. The method for producing an information recording medium according to claim 33, wherein the first recording layer that is formed by the sputtering target that is used in the forming of the first recording layer is represented by a composition formula $Ge_aSb_bTe_{3+a}$, where $0<a\leq60$ and $1.5\leq b\leq7$.

35. The method for producing an information recording medium according to claim 33, wherein the first recording layer that is formed by the sputtering target that is used in the forming of the first recording layer is represented by a composition formula $(Ge-M2)_aSb_bTe_{3+a}$, where M2 is at least one element selected from a group consisting of Sn and Pb, and $0<a\leq60$ and $1.5\leq b\leq7$.

36. The method for producing an information recording medium according to claim 25, wherein the second recording layer that is formed by the sputtering target that is used in the forming of the second recording layer is represented by a composition formula $Sb_yM1_{100-x}$, where $50\leq x\leq95$ atom %.

37. The method for producing an information recording medium according to claim 25, wherein the second recording layer that is formed by the sputtering target that is used in the forming of the second recording layer is represented by a composition formula $Sb_yM1_{100-y}$, where $0<y\leq20$ atom %.

38. The method for producing an information recording medium according to claim 25, wherein the second recording layer that is formed by the sputtering target that is used in the forming of the second recording layer is represented by a composition formula $Ge_a(Bi-Sb)_bTe_{3+a}$, where $0<a\leq60$ and $1.5\leq b\leq7$.

39. The method for producing an information recording medium according to claim 25, wherein the second recording layer that is formed by the sputtering target that is used in the forming of the second recording layer is represented by a composition formula $(Ge-M2)_a(Bi-Sb)_bTe_{3+a}$, where M2 is at least one element selected from a group consisting of Sn and Pb, and $0<a\leq60$ and $1.5\leq b\leq7$.

40. A method for producing an information recording medium that has at least two information layers, the method comprising:
forming a first recording layer that is phase changeable; and
forming a second recording layer that is phase changeable,
wherein a sputtering target containing Ge, Te and Bi is used in both the forming of the first recording layer and the forming of the second recording layer, and
wherein the sputtering target used in the forming of the second recording layer contains Bi at 0.5 atom % or more.

41. The method for producing an information recording medium according to claim 40, wherein the second recording layer that is formed by the sputtering target that is used in the forming of the second recording layer is represented by a composition formula $Ge_aBi_bTe_{3+a}$, where $0<a\leq60$ and $1.5\leq b\leq7$.

42. The method for producing an information recording medium according to claim 40, wherein the second recording layer that is formed by the sputtering target that is used in the forming of the second recording layer is represented by a composition formula $(Ge-M2)_aBi_bTe_{3+a}$, where M2 is at least one element selected from a group consisting of Sn and Pb, and $0<a\leq60$ and $1.5\leq b\leq7$.

43. The information recording medium according to claim 9, wherein the second recording layer is represented by a composition formula $Sb_xM1_{100-x}$, where $50\leq x\leq95$ atom %.

44. The information recording medium according to claim 9, wherein the second recording layer is represented by a composition formula $Sb_yM1_{100-y}$, where $0<y\leq20$ atom %.

45. The information recording medium according to claim 9, wherein the second recording layer is represented by a composition formula $Ge_a(Bi-Sb)_bTe_{3+a}$, where $0<a\leq60$ and $1.5\leq b\leq7$.

46. The information recording medium according to claim 9, wherein the second recording layer is represented by a composition formula $(Ge-M2)_a(Bi-Sb)_bTe_{3+a}$, where M2 is at least one element selected from a group consisting of Sn and Pb, and $0<a\leq60$ and $1.5\leq b\leq7$.

47. The information recording medium according to claim 9, further comprising an interface layer that is provided adjacent to a surface of at least one of the first recording layer and the second recording layer, wherein the interface layer contains at least one composition selected from a group consisting of $Ga_2O_3$, $SnO_2$, $ZrO_2$, $HfO_2$, $Nb_2O_5$, $Ta_2O_5$, $SiO_2$, $Cr_2O_3$, $Al_2O_3$, $TiO_2$, $ZnO$, Zr—N, Hf—N, Nb—N, Ta—N, Si—N, Cr—N, Ge—N, Al—N, Ge—Si—N, Ge—Cr—N, $YF_3$, $LaF_3$, $CeF_3$, $GdF_3$, $DyF_3$, $ErF_3$, $YbF_3$, C and ZnS.

48. The information recording medium according to claim 16, further comprising an interface layer that is provided adjacent to a surface of at least one of the first recording layer and the second recording layer, wherein the interface layer contains at least one composition selected from a group consisting of $Ga_2O_3$, $SnO_2$, $ZrO_2$, $HfO_2$, $Nb_2O_5$, $Ta_2O_5$, $SiO_2$, $Cr_2O_3$, $Al_2O_3$, $TiO_2$, ZnO, Zr—N, Hf—N, Nb—N, Ta—N, Si—N, Cr—N, Ge—N, Al—N, Ge—Si—N, Ge—Cr—N, $YF_3$, $LaF_3$, $CeF_3$, $GdF_3$, $DyF_3$, $ErF_3$, $YbF_3$, C and ZnS.

49. The information recording medium according to claim 9, wherein the first information layer includes at least a first incident side dielectric layer, a first incident side interface layer, the first recording layer, a first counterincident side interface layer, a first reflection layer and a transmittance adjustment layer in this order.

50. The information recording medium according to claim 16, wherein the first information layer includes at least a first incident side dielectric layer, a first incident side interface layer, the first recording layer, a first counterincident side interface layer, a first reflection layer and a transmittance adjustment layer in this order.

51. The information recording medium according to claim 9, wherein the second information layer includes at least a second incident side dielectric layer, a second incident side interface layer, the second recording layer, a second counterincident side interface layer, a second counterincident side dielectric layer and a second reflection layer in this order.

52. The information recording medium according to claim 16, wherein the second information layer includes at least a second incident side dielectric layer, a second incident side interface layer, the second recording layer, a second counterincident side interface layer, a second counterincident side dielectric layer and a second reflection layer in this order.

53. The information recording medium according to claim 9, wherein the first information layer is disposed at a side closer to the optical means or the electrical means than the second information layer.

54. The information recording medium according to claim 16, wherein the first information layer is disposed at a side closer to the optical means or the electrical means than the second information layer.

55. The information recording medium according to claim 9, wherein a thickness of the first recording layer is 9 nm or less.

56. The information recording medium according to claim 16, wherein a thickness of the first recording layer is 9 nm or less.

57. The information recording medium according to claim 9, wherein a thickness of the second recording layer is between 6 and 15 nm.

58. The information recording medium according to claim 16, wherein a thickness of the second recording layer is between 6 and 15 nm.

59. The method for producing an information recording medium according to claim 33, wherein the second recording layer that is formed by the sputtering target that is used in the forming of the second recording layer is represented by a composition formula $Sb_xM1_{100-x}$, where $50 \leq x \leq 95$ atom %.

60. The method for producing an information recording medium according to claim 33, wherein the second recording layer that is formed by the sputtering target that is used in the forming of the second recording layer is represented by a composition formula $Sb_yM1_{100-y}$, where $0 < y \leq 20$ atom %.

61. The method for producing an information recording medium according to claim 33, wherein the second recording layer that is formed by the sputtering target that is used in the forming of the second recording layer is represented by a composition formula $Ge_a(Bi—Sb)_bTe_{3+a}$, where $0 < a \leq 60$ and $1.5 \leq b \leq 7$.

62. The method for producing an information recording medium according to claim 33, wherein the second recording layer that is formed by the sputtering target that is used in the forming of the second recording layer is represented by a composition formula $(Ge—M2)_a(Bi—Sb)_bTe_{3+a}$, where M2 is at least one element selected from a group consisting of Sn and Pb, and $0 < a \leq 60$ and $1.5 \leq b \leq 7$.

* * * * *

UNITED STATES PATENT AND TRADEMARK OFFICE
CERTIFICATE OF CORRECTION

PATENT NO.        : 7,063,876 B2
APPLICATION NO.   : 10/787301
DATED             : June 20, 2006
INVENTOR(S)       : Takashi Nishihara et al.

It is certified that error appears in the above-identified patent and that said Letters Patent is hereby corrected as shown below:

ON THE TITLE PAGE:
On page 2, right column, line 9, please replace "Medium for over" with --Medium of over--.
On page 2, right column, line 10, please replace "Capacity of Blue Laser" with --Capacity for Blue Laser--.

In column 15, line 28, please replace "(more preferably $0 \leq a \leq 40$)" with --(more preferably $0 < a \leq 40$)--.
In column 15, line 60, please replace "Ag—Pd-Ti," with --Ag—Pd—Ti,--.
In column 16, line 56, please replace "$46 \leq T_a$," with --$46 < T_a$,--.
In column 26, line 33, please replace "(1 ∫ 7)" with --(1-7)--.
In column 27, line 3, please replace "90° C. and" with --90° C and--.
In column 28, line 30, please replace "$r_{c2} \leq r_{c1} \leq r_{a1} \leq r_{a2}$" with --$r_{c2} \leq r_{c1} < r_{a1} \leq r_{a2}$--.
In column 28, line 31, please replace "$r_{c2} \leq r_{c1} \leq r_{a2} \leq r_{a1}$" with --$r_{c2} \leq r_{c1} < r_{a2} < r_{a1}$--.

In column 57, line 2, please replace "630° C.," with --630° C,--.
In column 57, line 2, please replace "170° C.," with --170° C,--.
In column 57, line 4, please replace "550° C.," with --550° C,--.
In column 57, line 5, please replace "200° C.," with --200° C,--.
In column 60, line 63, please replace "contains Sn." with --contains Sb.--.
In column 61, line 31, please replace "$1.5 \leq b \leq 7$)." with --$1.5 \leq b \leq 7$.--.
In column 61, line 63, please replace "$Sb_y M1_{100-x}$," with --$Sb_x M1_{100-x}$,--.

Signed and Sealed this

Thirtieth Day of January, 2007

JON W. DUDAS
*Director of the United States Patent and Trademark Office*